(12) United States Patent
Kaneda et al.

(10) Patent No.: US 12,125,858 B2
(45) Date of Patent: Oct. 22, 2024

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Yukio Kaneda, Kanagawa (JP); Hideaki Togashi, Kanagawa (JP); Fumihiko Koga, Kanagawa (JP); Masahiro Joei, Kanagawa (JP); Kenichi Murata, Kanagawa (JP); Shintarou Hirata, Kanagawa (JP); Nobuhiro Kawai, Kanagawa (JP)

(73) Assignee: SONY SEMICONDUCTOR SOLUTIONS CORPORATION, Kanaagawa (JP)

( * ) Notice: Subject to any disclaimer, the term of this patent is extended or adjusted under 35 U.S.C. 154(b) by 10 days.

(21) Appl. No.: 17/755,950

(22) PCT Filed: Nov. 2, 2020

(86) PCT No.: PCT/JP2020/041007
§ 371 (c)(1),
(2) Date: May 12, 2022

(87) PCT Pub. No.: WO2021/100446
PCT Pub. Date: May 27, 2021

(65) Prior Publication Data
US 2022/0392931 A1 Dec. 8, 2022

(30) Foreign Application Priority Data

Nov. 20, 2019 (JP) ................. 2019-209714

(51) Int. Cl.
*H01L 27/146* (2006.01)
*H04N 25/77* (2023.01)

(52) U.S. Cl.
CPC .. *H01L 27/14603* (2013.01); *H01L 27/14609* (2013.01); *H01L 27/14623* (2013.01); *H01L 27/14636* (2013.01); *H04N 25/77* (2023.01)

(58) Field of Classification Search
CPC ......... H01L 27/14603; H01L 27/14609; H01L 27/14623; H01L 27/14636; H01L 21/3205;
(Continued)

(56) References Cited

U.S. PATENT DOCUMENTS

2013/0087682 A1 4/2013 Nomura
2013/0264468 A1 10/2013 Kobayashi et al.
(Continued)

FOREIGN PATENT DOCUMENTS

JP 2011-253861 A 12/2011
JP 2012-191222 A 10/2012
(Continued)

OTHER PUBLICATIONS

International Search Report and Written Opinion of PCT Application No. PCT/JP2020/041007, issued on Feb. 9, 2021, 11 pages of ISRWO.
(Continued)

*Primary Examiner* — Twyler L Haskins
*Assistant Examiner* — Angel L Garces-Rivera
(74) *Attorney, Agent, or Firm* — CHIP LAW GROUP

(57) ABSTRACT

A solid-state imaging device capable of achieving higher image quality is provided.
Provided is a solid-state imaging device including a semiconductor substrate, a first photoelectric conversion unit that is provided above the semiconductor substrate and that converts light into charge, and a second photoelectric conversion unit that is provided above the first photoelectric conversion unit and that converts light into charge. Each of
(Continued)

the first photoelectric conversion unit and the second photoelectric conversion unit includes at least a first electrode, a second electrode, and a photoelectric conversion film disposed between the first electrode and the second electrode. The first electrode of the second photoelectric conversion unit and a charge accumulation unit formed in the semiconductor substrate are electrically connected to each other via a conductive portion penetrating at least the first photoelectric conversion unit. An insulation film portion is disposed at least on a part of an outer circumference of the conductive portion. The insulation film portion includes at least one layer of an insulation film. The at least one layer of the insulation film has fixed charge of a type identical to a type of charge accumulated in the charge accumulation unit.

20 Claims, 26 Drawing Sheets

(58) Field of Classification Search
CPC ... H01L 21/768; H01L 23/522; H01L 27/146; H01L 27/14605; H01L 27/1462; H04N 25/77; H10K 39/00

See application file for complete search history.

(56) References Cited

U.S. PATENT DOCUMENTS

| 2014/0209876 A1 | 7/2014 | Yamaguchi et al. |
| 2016/0093659 A1 | 3/2016 | Nakamura et al. |

FOREIGN PATENT DOCUMENTS

| JP | 2013-219082 A | 10/2013 |
| JP | 2014-225560 A | 12/2014 |
| JP | 2015-053296 A | 3/2015 |
| JP | 2018-098495 A | 6/2018 |
| JP | 2019-041018 A | 3/2019 |
| JP | 2019-133964 A | 8/2019 |
| WO | 2019/039029 A1 | 2/2019 |

OTHER PUBLICATIONS

Office Action for JP Application No. 2021-558262, issued on Aug. 6, 2024, 7 pages of English Translation and 06 pages of Office Action.

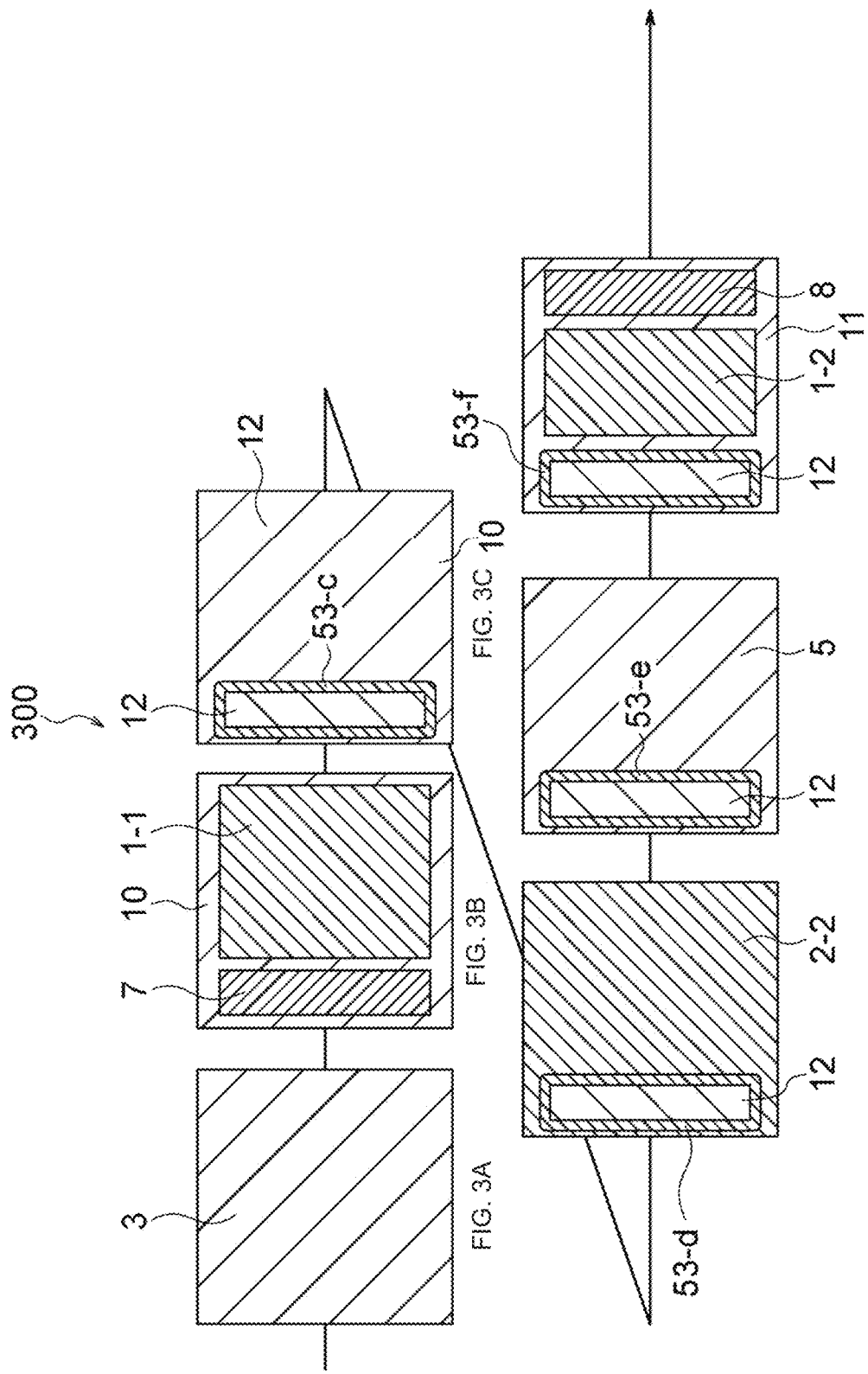

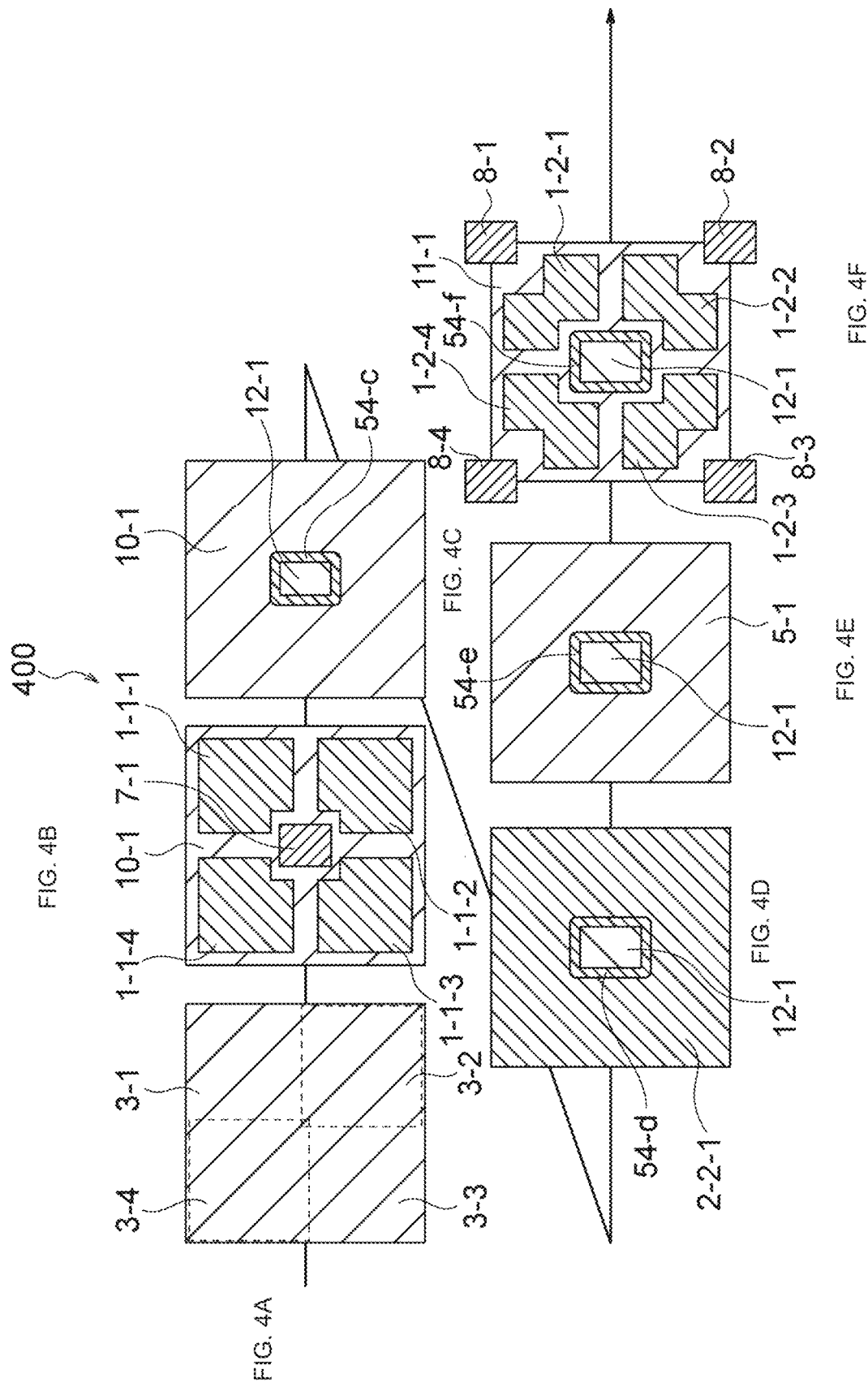

SOLID-STATE IMAGING DEVICE AND ELECTRONIC APPARATUS

CROSS REFERENCE TO RELATED APPLICATIONS

This application is a U.S. National Phase of International Patent Application No. PCT/JP2020/041007 filed on Nov. 2, 2020, which claims priority benefit of Japanese Patent Application No. JP 2019-209714 filed in the Japan Patent Office on Nov. 20, 2019. Each of the above-referenced applications is hereby incorporated herein by reference in its entirety.

TECHNICAL FIELD

The present technology relates to a solid-state imaging device and an electronic apparatus.

BACKGROUND ART

With a recent remarkable spread of a digital camera, there has been an increasing demand for a solid-state imaging device (image sensor) which is a main component for the digital camera. Accordingly, realization of image quality improvement has been an essential factor to be achieved in terms of performance of the solid-state imaging device. For example, there has been proposed a technology relating to a solid-state imaging device which uses a photoelectric conversion film including a plurality of organic semiconductors for photoelectrically converting each light having different wavelengths (see PTL 1).

CITATION LIST

Patent Literature

[PTL 1]
Japanese Patent Laid-open No. 2012-191222

SUMMARY

Technical Problem

However, the technology proposed in PTL 1 may be unable to improve image quality obtainable by the solid-state imaging device.

Accordingly, the present technology has been developed in consideration of the abovementioned circumstances. It is a main object of the present technology to provide a solid-state imaging device capable of achieving higher image quality achievable and an electronic apparatus on which the solid-state imaging device is mounted.

Solution to Problem

As a result of intensive studies for achieving the above-mentioned object, the present inventors have succeeded in realizing further image quality improvement of a solid-state imaging device, and completed the present technology.

Specifically, a first aspect of the present technology provides a solid-state imaging device including a semiconductor substrate, a first photoelectric conversion unit that is provided above the semiconductor substrate and that converts light into charge, and a second photoelectric conversion unit that is provided above the first photoelectric conversion unit and that converts light into charge, in which each of the first photoelectric conversion unit and the second photoelectric conversion unit includes at least a first electrode, a second electrode, and a photoelectric conversion film disposed between the first electrode and the second electrode, the first electrode of the second photoelectric conversion unit and a charge accumulation unit formed in the semiconductor substrate are electrically connected to each other via a conductive portion penetrating at least the first photoelectric conversion unit, an insulation film portion is disposed at least on a part of an outer circumference of the conductive portion, the insulation film portion includes at least one layer of an insulation film, and the at least one layer of the insulation film has fixed charge of a type identical to a type of the charge accumulated in the charge accumulation unit.

According to the solid-state imaging device of the first aspect of the present technology, the at least one layer of the insulation film may be disposed between the conductive portion and the first photoelectric conversion unit such that the at least one layer of the insulation film covers the outer circumference of the conductive portion.

According to the solid-state imaging device of the first aspect of the present technology, the conductive portion may penetrate the first photoelectric conversion unit and reach an inside of the semiconductor substrate, and the at least one layer of the insulation film may be disposed between the conductive portion and the first photoelectric conversion unit and the semiconductor substrate such that the at least one layer of the insulation film covers the outer circumference of the conductive portion.

According to the solid-state imaging device of the first aspect of the present technology, each of the first photoelectric conversion unit and the second photoelectric conversion unit may be disposed away from the first electrode, and include a charge accumulation electrode so disposed as to face the photoelectric conversion film via an insulation layer.

According to the solid-state imaging device of the first aspect of the present technology, the second photoelectric conversion unit may have a plurality of pixels, each of the pixels may have the one charge accumulation electrode, and the charge accumulation unit may be shared by the plurality of pixels.

According to the solid-state imaging device of the first aspect of the present technology, the first electrode of the first photoelectric conversion unit and the first electrode of the second photoelectric conversion unit may be electrically connected to the charge accumulation unit formed in the semiconductor substrate, via a conductive portion that penetrates at least the first photoelectric conversion unit, the insulation film portion may be disposed at least on a part of the outer circumference of the conductive portion, the insulation film portion may include the at least one layer of the insulation film, the at least one layer of the insulation film may have fixed charge of a type identical to a type of the charge accumulated in the charge accumulation unit, the first photoelectric conversion unit may have a plurality of first pixels, the second photoelectric conversion unit may have a plurality of second pixels, each of the first pixels may have the one charge accumulation electrode, each of the second pixels may have the one charge accumulation electrode, and the charge accumulation unit may be shared by at least one of the first pixels and at least one of the second pixels.

According to the solid-state imaging device of the first aspect of the present technology, the insulation film portion may include an insulation film that has fixed charge of a type identical to a type of the charge accumulated in the charge accumulation unit and an insulation film that has a high dielectric constant material.

According to the solid-state imaging device of the first aspect of the present technology, the insulation film that has the high dielectric constant material may be so disposed as to cover the outer circumference of the conductive portion, the insulation film that has the fixed charge may be so disposed as to cover an outer circumference of the insulation film that has the high dielectric constant material, the insulation film that has the high dielectric constant material may be disposed between the conductive portion and the insulation film that has the fixed charge, and the insulation film that has the fixed charge may be disposed between the insulation film that has the high dielectric constant material and the first photoelectric conversion unit.

According to the solid-state imaging device of the first aspect of the present technology, the insulation film that has the fixed charge may be so disposed as to cover the outer circumference of the conductive portion, the insulation film that has the high dielectric constant may be so disposed as to cover the outer circumference of the insulation film that has the fixed charge, the insulation film that has the fixed charge may be disposed between the conductive portion and the insulation film that has the high dielectric constant, and the insulation film that has the high dielectric constant may be disposed between the insulation film that has the fixed charge and the first photoelectric conversion unit.

According to the solid-state imaging device of the first aspect of the present technology, each of the first photoelectric conversion unit and the second photoelectric conversion unit may further include a transfer layer disposed between the first electrode and the photoelectric conversion film.

According to the solid-state imaging device of the first aspect of the present technology, the at least one layer of the insulation film may be disposed between the conductive portion and the first photoelectric conversion unit and the transfer layer included in the first photoelectric conversion unit such that the at least one layer of the insulation film covers the outer circumference of the conductive portion.

According to the solid-state imaging device of the first aspect of the present technology, the conductive portion may penetrate the first photoelectric conversion unit and reach an inside of the semiconductor substrate, and the at least one layer of the insulation film may be disposed between the conductive portion and the first photoelectric conversion unit, the transfer layer included in the first photoelectric conversion unit, and the semiconductor substrate such that the at least one layer of the insulation film covers the outer circumference of the conductive portion.

In addition, a second aspect of the present technology provides a solid-state imaging device including a semiconductor substrate, a first photoelectric conversion unit that is provided above the semiconductor substrate and that converts light into charge, a second photoelectric conversion unit that is provided above the first photoelectric conversion unit and that converts light into charge, and a third photoelectric conversion unit that is provided above the second photoelectric conversion unit and that converts light into charge, in which each of the first photoelectric conversion unit, the second photoelectric conversion unit, and the third photoelectric conversion unit includes at least a first electrode, a second electrode, and a photoelectric conversion film disposed between the first electrode and the second electrode, the first electrode of the second photoelectric conversion unit and a first charge accumulation unit formed in the semiconductor substrate are electrically connected to each other via a first conductive portion penetrating at least the first photoelectric conversion unit, a first insulation film portion is disposed at least on a part of an outer circumference of the first conductive portion, the first insulation film portion includes at least one layer of a first insulation film, the at least one layer of the first insulation film has fixed charge of a type identical to a type of the charge accumulated in the first charge accumulation unit, the first electrode of the third photoelectric conversion unit and a second charge accumulation unit formed in the semiconductor substrate are electrically connected to each other via a second conductive portion penetrating at least the second photoelectric conversion unit and the first photoelectric conversion unit, a second insulation film portion is disposed at least on a part of an outer circumference of the second conductive portion, the second insulation film portion includes at least one layer of a second insulation film, and the at least one layer of the second insulation film has fixed charge of a type identical to a type of the charge accumulated in the second charge accumulation unit.

According to the solid-state imaging device of the second aspect of the present technology, the at least one layer of the first insulation film may be disposed between the first conductive portion and the first photoelectric conversion unit such that the at least one layer of the first insulation film covers the outer circumference of the first conductive portion, and the at least one layer of the second insulation film may be disposed between the second conductive portion and the second photoelectric conversion unit and between the second conductive portion and the first photoelectric conversion unit such that the at least one layer of the second insulation film covers the outer circumference of the second conductive portion.

According to the solid-state imaging device of the second aspect of the present technology, each of the first photoelectric conversion unit, the second photoelectric conversion unit, and the third photoelectric conversion unit may be disposed away from the first electrode, and include a charge accumulation electrode so disposed as to face the photoelectric conversion film via an insulation layer.

According to the solid-state imaging device of the second aspect of the present technology, each of the first photoelectric conversion unit, the second photoelectric conversion unit, and the third photoelectric conversion unit may further include a transfer layer disposed between the first electrode and the photoelectric conversion film.

According to the solid-state imaging device of the second aspect of the present technology, the at least one layer of the first insulation film may be disposed between the first conductive portion and the first photoelectric conversion unit and the transfer layer included in the first photoelectric conversion unit, such that the at least one layer of the first insulation film covers the outer circumference of the first conductive portion, and the at least one layer of the second insulation film may be disposed between the second conductive portion and the second photoelectric conversion unit, the transfer layer included in the second photoelectric conversion unit, the first photoelectric conversion unit, and the transfer layer included in the first photoelectric conversion unit, such that the at least one layer of the second insulation film covers the outer circumference of the second conductive portion.

Further, a third aspect of the present technology provides a solid-state imaging device including a semiconductor substrate, and a photoelectric conversion unit that is provided above the semiconductor substrate and that converts light into charge, in which the photoelectric conversion unit includes at least a first electrode, a second electrode, a transfer layer, a photoelectric conversion film disposed between the second electrode and the transfer layer, and a charge accumulation electrode disposed away from the first electrode and so disposed as to face the transfer layer via an insulation layer, the first electrode penetrates at least the photoelectric conversion film and the second electrode, the first electrode is electrically connected to a charge accumulation unit formed in the semiconductor substrate, an insulation film portion is disposed at least on a part of an outer circumference of the first electrode, the insulation film portion includes at least one layer of an insulation film, and the at least one layer of the insulation film has fixed charge of a type identical to a type of the charge accumulated in the charge accumulation unit.

According to the solid-state imaging device of the third aspect of the present technology, the at least one layer of the insulation film may be disposed between the first electrode and the photoelectric conversion film and the second electrode such that the at least one layer of the insulation film covers the outer circumference of the first electrode.

Further, a fourth aspect of the present technology provides a solid-state imaging device including a semiconductor substrate, and N (N: two or larger integer) photoelectric conversion units that are provided above the semiconductor substrate and that convert light into charge, in which the N photoelectric conversion units have a laminated structure, each of the N photoelectric conversion units includes at least a first electrode, a second electrode, and a photoelectric conversion unit disposed between the first electrode and the second electrode, the first electrode of the nth (n: two or larger but N or smaller) photoelectric conversion unit counted from the semiconductor substrate side is electrically connected to an (n−1)th charge accumulation unit formed in the semiconductor substrate, via an (n−1)th conductive portion that penetrates at least first to (n−1)th photoelectric conversion units counted from the semiconductor substrate (n: two or larger but N or smaller; a first photoelectric conversion unit counted from the semiconductor substrate when n=2), an (n−1)th insulation film portion is disposed at least on a part of an outer circumference of the (n−1)th conductive portion, the (n−1)th insulation film portion includes at least one layer of an (n−1)th insulation film, and the at least one layer of the (n−1)th insulation film has fixed charge of a type identical to a type of the charge accumulated on the (n−1)th charge accumulation unit.

According to the solid-state imaging device of the fourth aspect of the present technology, the at least one layer of the (n−1)th insulation film may be disposed between the (n−1)th conductive portion and the first to (n−1)th photoelectric conversion units counted from the semiconductor substrate (the first photoelectric conversion unit counted from the semiconductor substrate when n=2), such that the at least one layer of the (n−1)th insulation film covers the outer circumference of the (n−1)th conductive portion.

According to the solid-state imaging device of the fourth aspect of the present technology, the (n−1)th conductive portion may penetrate the first to (n−1)th photoelectric conversion units counted from the semiconductor substrate (the first photoelectric conversion unit counted from the semiconductor substrate when n=2) and the semiconductor substrate, and the at least one layer of the (n−1)th insulation film may be disposed between the (n−1)th conductive portion and the first to (n−1)th photoelectric conversion units counted from the semiconductor substrate (the first photoelectric conversion unit counted from the semiconductor substrate when n=2) and the semiconductor substrate such that the at least one layer of the (n−1)th insulation film covers the outer circumference of the (n−1)th conductive portion.

According to the solid-state imaging device of the fourth aspect of the present technology, each of the N photoelectric conversion units may be disposed away from the first electrode included in the corresponding one of the N photoelectric conversion units, and may include corresponding one of N charge accumulation electrodes so disposed as to face the photoelectric conversion film included in the corresponding one of the N photoelectric conversion units, via an insulation layer.

According to the solid-state imaging device of the fourth aspect of the present technology, the nth photoelectric conversion unit may have a plurality of nth pixels, each of the nth pixels may have the one nth charge accumulation electrode, and the nth charge accumulation unit may be shared by the plurality of nth pixels.

According to the solid-state imaging device of the fourth aspect of the present technology, the first electrode of each of nth photoelectric conversion unit and the first to (n−1)th photoelectric conversion units counted from the semiconductor substrate (the first photoelectric conversion unit counted from the semiconductor substrate when n=2) may be electrically connected to the (n−1)th charge accumulation unit formed in the semiconductor substrate, via the (n−1)th conductive portion that penetrates at least the first to (n−1)th photoelectric conversion units counted from the semiconductor substrate (the first photoelectric conversion unit counted from the semiconductor substrate when n=2), the (n−1)th insulation film portion may be disposed at least on a part of the outer circumference of the (n−1)th conductive portion, the (n−1)th insulation film portion may include the at least one layer of the (n−1)th insulation film, the at least one layer of the (n−1)th insulation film may have fixed charge of a type identical to a type of the charge accumulated in the (n−1)th charge accumulation unit, the nth photoelectric conversion unit may have a plurality of nth pixels, the first to (n−1)th photoelectric conversion units counted from the semiconductor substrate (the first photoelectric conversion unit counted from the semiconductor substrate when n=2) may have a plurality of first to (n−1)th pixels, respectively, each of the nth pixels may have the one nth charge accumulation electrode, each of the first to (n−1)th pixels (the first pixel when n=2) may have the one first to (n−1)th charge accumulation electrodes, respectively, and the (n−1)th charge accumulation unit may be shared by at least one of the nth pixels and at least each one of the first to (n−1)th pixels.

According to the solid-state imaging device of the fourth aspect of the present technology, the (n−1)th insulation film portion may include an (n−1)th insulation film that has fixed charge of a type identical to a type of the charge accumulated in the (n−1)th charge accumulation unit, and an (n−1)th insulation film that has a high dielectric constant material.

According to the solid-state imaging device of the fourth aspect of the present technology, the (n−1)th insulation film that has the high dielectric constant material may be so disposed as to cover the outer circumference of the (n−1)th conductive portion, the (n−1)th insulation film that has the fixed charge may be so disposed as to cover an outer circumference of the (n−1)th insulation film that has the high dielectric constant material, the (n−1)th insulation film that has the high dielectric constant material may be disposed between the (n−1)th conductive portion and the (n−1)th insulation film that has the fixed charge, and the (n−1)th insulation film that has the fixed charge may be disposed between the (n−1)th insulation film that has the high dielectric constant material and the (n−1)th photoelectric conversion unit.

According to the solid-state imaging device of the fourth aspect of the present technology, the (n−1)th insulation film that has the fixed charge may be so disposed as to cover the outer circumference of the (n−1)th conductive portion, the (n−1)th insulation film that has the high dielectric constant may be so disposed as to cover the outer circumference of the (n−1)th insulation film that has the fixed charge, the (n−1)th insulation film that has the fixed charge may be disposed between the (n−1)th conductive portion and the (n−1)th insulation film that has the high dielectric constant, and the (n−1)th insulation film that has the high dielectric constant may be disposed between the (n−1)th insulation film that has the fixed charge and the photoelectric conversion unit.

According to the solid-state imaging device of the fourth aspect of the present technology, each of the N photoelectric conversion units may further include corresponding one of N transfer layers disposed between the first electrode and the photoelectric conversion film.

According to the solid-state imaging device of the fourth aspect of the present technology, the at least one layer of the (n−1)th insulation film may be disposed between the (n−1)th conductive portion and the first to (n−1)th photoelectric conversion units counted from the semiconductor substrate (the first photoelectric conversion unit counted from the semiconductor substrate when n=2) and the transfer layers included in the first to (n−1)th photoelectric conversion units counted from the semiconductor substrate (the first photoelectric conversion unit counted from the semiconductor substrate when n=2), such that the at least one layer of the (n−1)th insulation film covers the outer circumference of the (n−1)th conductive portion.

According to the solid-state imaging device of the fourth aspect of the present technology, the nth conductive portion may penetrate the first to (n−1)th photoelectric conversion units counted from the semiconductor substrate (the first photoelectric conversion unit counted from the semiconductor substrate when n=2) and the semiconductor substrate, and the at least one layer of the (n−1)th insulation film may be disposed between the (n−1)th conductive portion and the first to (n−1)th photoelectric conversion units counted from the semiconductor substrate (the first photoelectric conversion unit counted from the semiconductor substrate when n=2), the transfer layers included in the first to (n−1)th photoelectric conversion units counted from the semiconductor substrate (the first photoelectric conversion unit counted from the semiconductor substrate when n=2), and the semiconductor substrate, such that the at least one layer of the (n−1)th insulation film covers the outer circumference of the (n−1)th conductive portion.

Furthermore, provided is an electronic apparatus on which the solid-state imaging device according to any one of the first to fourth aspects according to the present technology is mounted.

According to the present technology, higher image quality of a solid-state imaging device is achievable. Note that advantageous effects to be produced are not limited to the advantageous effects described herein, and may include any of the advantageous effects described in the present disclosure.

BRIEF DESCRIPTION OF DRAWINGS

FIGS. 3A, 3B, 3C, 3D, 3E, and 3F depict diagrams illustrating a configuration example of a solid-state imaging device according to the first embodiment to which the present technology is applied.

FIGS. 4A, 4B, 4C, 4D, 4E, and 4F depict diagrams illustrating a configuration example of a solid-state imaging device according to the first embodiment to which the present technology is applied.

DESCRIPTION OF EMBODIMENTS

Figure 1:
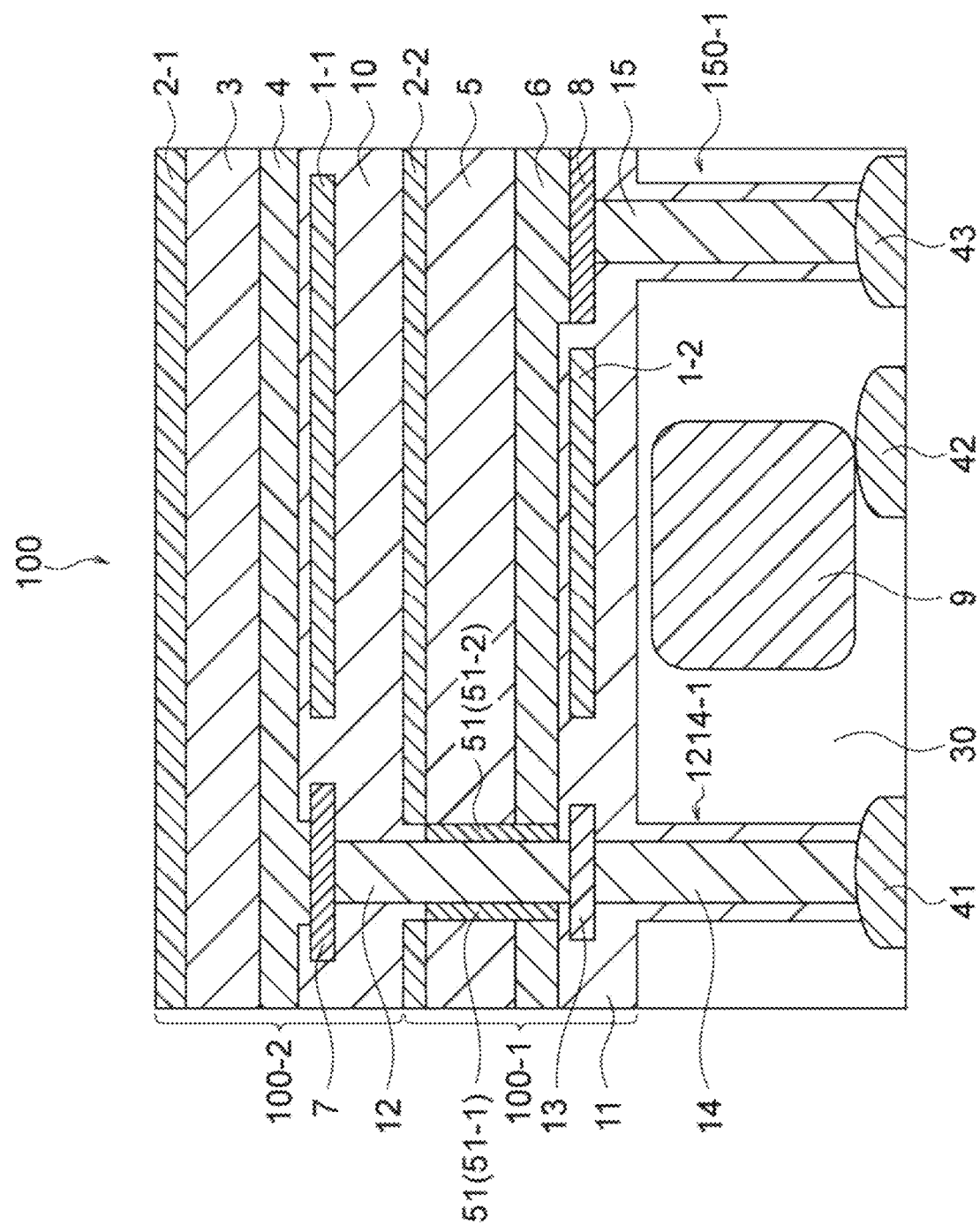
FIG. 1 is a diagram depicting a configuration example of a solid-state imaging device according to a first embodiment to which the present technology is applied.

Preferred embodiments for carrying out the present technology will hereinafter be described. The embodiments described hereinafter are only examples of typical embodiments of the present technology. It is therefore not intended that interpretation of the scope of the present technology should be narrowed by these examples. In addition, unless specified otherwise, "up" in the figures refers to an upward direction or an upper side in the figures, "down" in the figures refers to a downward direction or a lower side in the figures, "left" in the figures refers to a leftward direction or a left side in the figures, and "right" in the figures refers to a rightward direction or a right side in the figures. Moreover, identical or similar elements or parts in the figures are given identical reference numbers, and repetitive explanation will be omitted.

The description will be presented in the following order.
1. Outline of present technology
2. First embodiment (example 1 of solid-state imaging device)
3. Second embodiment (example 2 of solid-state imaging device)
4. Third embodiment (example 3 of solid-state imaging device)
5. Fourth embodiment (example 4 of solid-state imaging device)
6. Fifth embodiment (example 5 of solid-state imaging device)
7. Sixth embodiment (example 6 of solid-state imaging device)
8. Seventh embodiment (example of electronic apparatus)
9. Use example of solid-state imaging device to which present technology is applied
10. Example of application to endoscopic surgery system
11. Example of application to mobile body 1. Outline of Present Technology An outline of the present technology will first be described.

In recent years, development of technologies has been actively promoted with respect to a solid-state imaging device which has a structure longitudinally laminating photodiodes for photoelectrically converting each light having different wavelengths, a solid-state imaging device which uses a photoelectric conversion film including organic semiconductors for photoelectrically converting each light having different wavelengths, a solid-state imaging device which uses a photoelectric conversion element having an MIS type (Metal Insulator Semiconductor) region, a solid-state imaging device which has a semiconductor layer between a photoelectric conversion layer and an insulation layer for smooth transfer of accumulated charge, for example.

In a case of a structure which has N (N: two or larger integer) or more photoelectric conversion films (photoelectric conversion units) laminated in the longitudinal direction, it is necessary to separate the photoelectric conversion films (photoelectric conversion unit) in a lower layer by use of an insulation film penetrating this photoelectric conversion unit and provide a signal reading electrode to read signals from the photoelectric conversion films (photoelectric conversion units) in an upper layer.

However, this signal reading electrode demodulates a potential of at least one of photoelectric conversion films (photoelectric conversion units) in the lower layer, and captures the charge to be read. In this case, a signal drop may be caused. Moreover, at least one of the photoelectric conversion films (photoelectric conversion units) in the lower layer is damaged at the time of formation of the signal reading electrode. In this case, a dark current may be produced. To overcome the foregoing problems, technologies for designing an impurity profile by ion doping or other methods have been established for a photodiode (PD) formed on an existing semiconductor substrate (Si substrate). However, no technology for those problems has been established for a photoelectric conversion film using an organic semiconductor material or the like, under the current conditions.

The present technology has been developed in consideration of these circumstances. The present technology is characterized by such a structure where a signal reading electrode (including a configuration of a signal reading electrode to which a through electrode is added) of a photoelectric conversion film (photoelectric conversion unit) at least in a layer one above is covered by a film having fixed charge of the same polarity as that of signal charge. For example, in a case where the signal charge to be read is an electron, fixed charge of an insulation film covering the signal reading electrode and/or the through electrode is negative fixed charge. In a case where the signal charge to be read is a hole, fixed charge of an insulation film covering the signal reading electrode and/or the through electrode is positive fixed charge. This structure at least improves an opening rate of a photoelectric conversion film (photoelectric conversion unit) at least in a layer one below, and reduces afterimages and a signal drop. In addition, reduction of dark current is achievable.

An entire configuration example of a solid-state imaging device according to the present technology will next be described with reference to FIG. 20.

Figure 20:
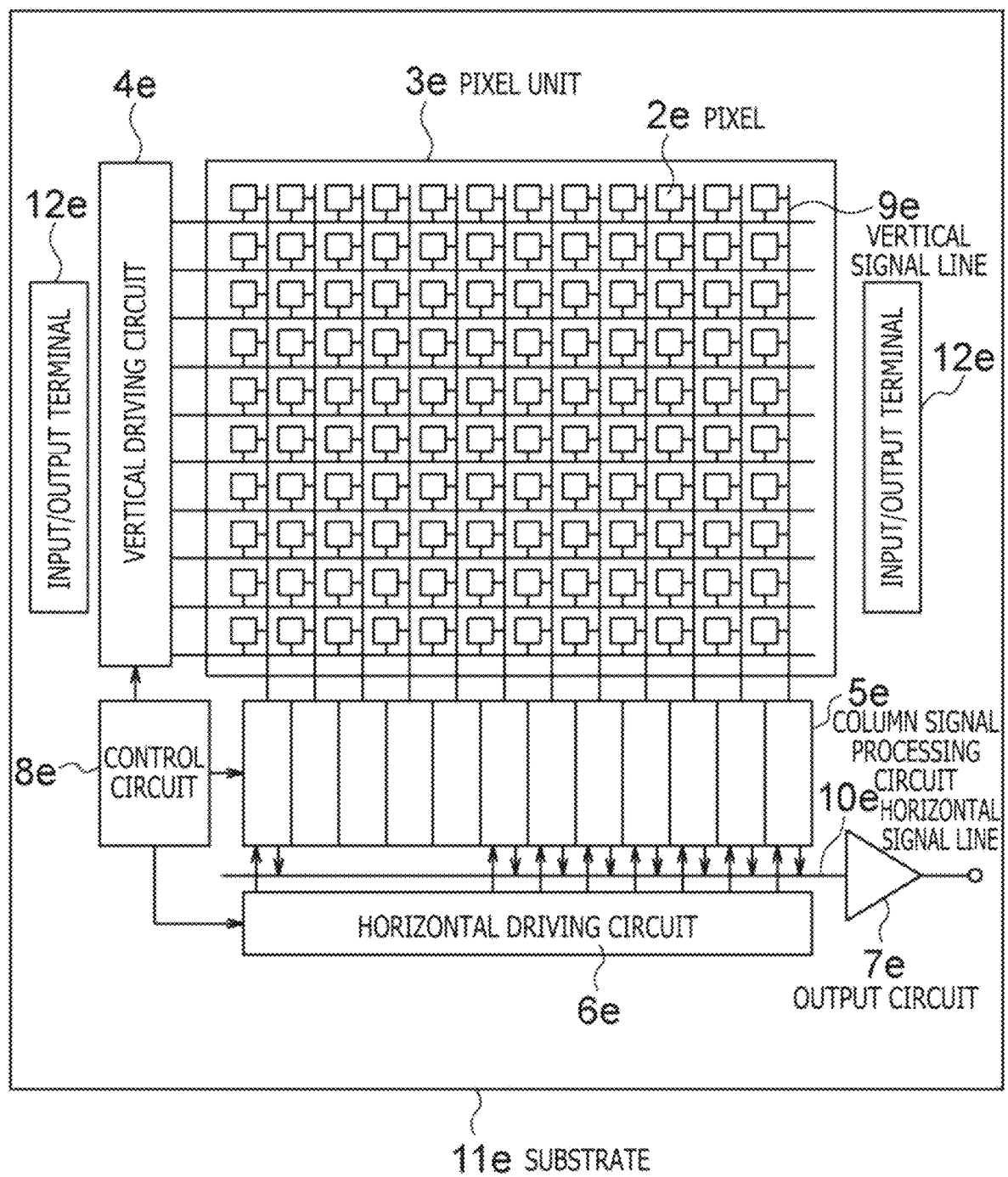
FIG. 20 is a schematic diagram depicting an entire configuration example of a solid-state imaging device according to the present technology.

FIG. 20 is a schematic diagram depicting an entire configuration example of a solid-state imaging device (solid-state imaging device 1e in FIG. 20) according to the present technology.

As depicted in FIG. 20, the solid-state imaging device 1e includes a pixel region (what is generally called an imaging region, pixel unit) 3e where a plurality of pixels 2e each containing a photoelectric conversion element are regularly and two-dimensionally arranged on a semiconductor substrate 11e, such as a silicon substrate, and peripheral circuit units. Each of the pixels 2e includes a photoelectric conversion film constituting a photoelectric conversion unit, such as a photoelectric conversion film containing an organic semiconductor, a photoelectric conversion film containing an inorganic semiconductor (e.g., photodiode (PD)), and a plurality of pixel transistors (what are generally called MOS transistors). For example, the plurality of pixel transistors may include three transistors, i.e., a transfer transistor, a reset transistor, and an amplification transistor. Alternatively, a selection transistor may be added to constitute four transistors. An equivalent circuit of a unit pixel is similar to an ordinary equivalent circuit. Accordingly, detailed description in this point is omitted. Each of the pixels 2e may have a shared pixel structure. For example, this pixel shared structure includes a plurality of photodiodes, a plurality of transfer transistors, one shared floating diffusion, and other shared pixel transistors one for each.

The peripheral circuit units include a vertical driving circuit 4e, column signal processing circuits 5e, a horizontal driving circuit 6e, an output circuit 7e, a control circuit 8e, and others.

The control circuit 8e receives an input clock and data for commanding an operation mode or the like, and outputs such data as internal information associated with the solid-state imaging device. Specifically, the control circuit 8e generates a clock signal and a control signal corresponding to references for such operations as operations of the vertical driving circuit 4e, the column signal processing circuits 5e, the horizontal driving circuit 6e, and others, in reference to a vertical synchronized signal, a horizontal synchronized signal, and a master clock. Thereafter, the control circuit 8e inputs these signals to the vertical driving circuit 4e, the column signal processing circuits 5e, the horizontal driving circuit 6e, and others.

The vertical driving circuit 4e includes, for example, a shift register, and is configured to select a pixel driving wire, supply pulses for driving pixels to the selected pixel driving wire, and drive pixels for each row. Specifically, the vertical driving circuit 4e selectively scans the respective pixels 2e in the pixel region (pixel unit) 3e sequentially in the vertical direction for each row, and supplies, to the column signal processing circuits 5e via vertical signal lines 9e, pixel signals based on signal charge generated according to amounts of light received by the photoelectric conversion films of the respective pixels 2e, such as photoelectric conversion films each containing an organic semiconductor and photodiodes (PDs).

The column signal processing circuits 5e are provided such that one column signal processing circuit 5e is disposed for each column of the pixels 2e, for example, and perform signal processing such as noise removal for each pixel column to process signals output from the pixels 2e in one row. Specifically, the column signal processing circuit 5e performs signal processing such as CDS, signal amplification, and AD conversion for removing fixed pattern noise unique to the pixels 2e. A horizontal selection switch (not depicted) is provided between and connected to an output stage of each of the column signal processing circuits 5e and a horizontal signal line 10e.

The horizontal driving circuit 6e includes, for example, a shift register, and is configured to sequentially select the respective column signal processing circuits 5 and cause the respective column signal processing circuits 5 to output pixel signals to the horizontal signal line 10e, by sequentially outputting horizontal scanning pulses.

The output circuit 7e performs signal processing for signals sequentially supplied from the column signal processing circuits 5e via the horizontal signal line 10e, and outputs the processed signals. For example, the output circuit 7e only buffers the signals in some cases, or performs black level adjustment, column variation correction, various types of digital signal processing, or the like in other cases. The input/output terminal 12e exchanges signals with the outside.

Preferred embodiments for carrying out the present technology will hereinafter be described specifically, with reference to the drawings. The embodiments described hereinafter are presented as one example of typical embodiments of the present technology. It is therefore not intended that interpretation of the scope of the present technology should be narrowed by these examples.

2. First Embodiment (Example 1 of Solid-State Imaging Device)

A solid-state imaging device according to a first embodiment of the present technology (example 1 of solid-state imaging device) will be described with reference to FIGS. 1, 2, 3A, 3B, 3C, 3D, 3E, 3F, 4A, 4B, 4C, 4D, 4E, 4F, 5A, 5B, 6, 18A and 18B.

Description with reference to FIG. 1 will first be presented. FIG. 1 is a cross-sectional diagram depicting a configuration example of a solid-state imaging device (solid-state imaging device 100) according to the first embodiment of the present technology.

The solid-state imaging device 100 includes a semiconductor substrate 30, a first photoelectric conversion unit 100-1 that is provided above the semiconductor substrate 30 (on the light entrance side and the upper side in FIG. 1) and that converts light into charge, and a second photoelectric conversion unit 100-2 that is provided above the first photoelectric conversion unit 100-1 (on the light entrance side and the upper side in FIG. 1) and that converts light into charge.

The first photoelectric conversion unit 100-1 includes a first electrode 8 (corresponding to a reading electrode, and a lower electrode in FIG. 1), a second electrode 2-2 (corresponding to an upper electrode in FIG. 1), and a photoelectric conversion film 5 provided between the first electrode (reading electrode) 8 and the second electrode 2-2.

The second photoelectric conversion unit 100-2 includes a first electrode 7 (corresponding to a reading electrode, and a lower electrode in FIG. 1), a second electrode 2-1 (corresponding to an upper electrode in FIG. 1), and a photoelectric conversion film 3 provided between the first electrode (reading electrode) 7 and the second electrode 2-1.

In the first photoelectric conversion unit 100-1, a transfer layer 6 is provided between the first electrode 8 and the photoelectric conversion film 5, and a charge accumulation electrode 1-2 is disposed away from the first electrode 8 and located in an insulation layer 11 in such a position as to face the photoelectric conversion film 5 (transfer layer 6) via the insulation layer 11 below the transfer layer 6. Meanwhile, in the second photoelectric conversion unit 100-2, a transfer layer 4 is provided between the first electrode 7 and the photoelectric conversion film 3, and a charge accumulation electrode 1-1 is disposed away from the first electrode 7 and located in an insulation layer 10 in such a position as to face the photoelectric conversion film 3 (transfer layer 4) via the insulation layer 10 below the transfer layer 4.

The first photoelectric conversion unit 100-1 may have a buffer layer between the photoelectric conversion film 5 and the transfer layer 6, or a buffer layer between the photoelectric conversion film 5 and the second electrode 2-2. Moreover, the first photoelectric conversion unit 100-1 may have a charge injection layer between the transfer layer 6 and the buffer layer, or a charge injection layer between the second electrode 2-2 and the buffer layer. The second photoelectric conversion unit 100-2 may have a buffer layer between the photoelectric conversion film 3 and the transfer layer 4, or a buffer layer between the photoelectric conversion film 3 and the second electrode 2-1. Moreover, the second photoelectric conversion unit 100-2 may have a charge injection layer between the transfer layer 4 and the buffer layer, or a charge injection layer between the second electrode 2-1 and the buffer layer.

The first electrode 7 of the second photoelectric conversion unit 100-2 and a charge accumulation unit 41 formed in the semiconductor substrate 30 are electrically connected to each other via a conductive portion (through electrode) 12 penetrating the first photoelectric conversion unit 100-1. Specifically, the solid-state imaging device 100 has a connection hole 1214-1 penetrating the insulation layer 10, the first photoelectric conversion unit 100-1, and the semiconductor substrate 30, to electrically connect the first electrode 7 of the second photoelectric conversion unit 100-2 and the charge accumulation unit 41 formed in the semiconductor substrate 30. The conductive portion (through electrode) 12 and a conductive portion (through electrode) 14 are formed in the connection hole 1214-1. The conductive portion (through electrode) 12 connected to the first electrode 7 and the conductive portion (through electrode) 14 connected to the charge accumulation unit 41 are connected to each other via a via 13 formed in the insulation layer 11. A photodiode (PD) 9 formed in the semiconductor substrate 30 is connected to a charge accumulation unit 42. Further, a connection hole 150-1 penetrating the insulation layer 11 and the semiconductor substrate 30 is formed to electrically connect the first electrode 8 of the first photoelectric conversion unit 100-1 and a charge accumulation unit 43 formed in the semiconductor substrate 30. Specifically, the first electrode 8 is connected to the charge accumulation unit 43 via a conductive portion (through electrode) 15 formed in the connection hole 150-1.

An insulation film 51 having fixed charge of a type identical to a type of charge accumulated in the charge accumulation unit 41 is formed in the connection hole 1214-1, between the conductive portion 12 (through electrode) and the photoelectric conversion film 5 and the transfer layer 6 below the photoelectric conversion film 5 (lower side in FIG. 1) such that the insulation film 51 covers an outer circumference of the conductive portion 12 (through electrode). Specifically, with respect to the connection hole 1214-1 in FIG. 1 as a center reference in the left-right direction in this figure, the photoelectric conversion film 5, the transfer layer 6, an insulation film 51-1 (51), and the conductive portion 12 are formed in this order on the left side, while the photoelectric conversion film 5, the transfer layer 6, an insulation film 51-2 (51), and the conductive portion 12 are formed in this order on the right side. As viewed in the up-down direction in FIG. 1, the insulation film 51 extends from an upper portion of the photoelectric conversion film 5 (upper side in FIG. 1) to a lower portion of the transfer layer 6 (lower side in FIG. 1), i.e., extends throughout a side surface of the photoelectric conversion film 5 and throughout a side surface of the transfer layer 6.

In a case where the signal charge to be read is an electron, the insulation film 51 is an insulation film having negative fixed charge. In a case where the signal charge to be read is a hole, the insulation film 51 is an insulation film having positive fixed charge. By the presence of the insulation film 51 in the solid-state imaging device 100, signal charge photoelectrically converted by the photoelectric conversion film 5 is not captured by the conductive portion 12 (through electrode), but is accumulated in the transfer layer 6 above the accumulation electrode 1-2.

In a case where the insulation film 51 is an insulation film having negative fixed charge, the insulation film 51 may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 51 may contain an insulation material such as a silicon oxide film in addition to the above material, or may additionally include an insulation material such as a silicon oxide film as a film (layer) other than the film (layer) including any of the above material.

In a case where the insulation film 51 is an insulation film having positive fixed charge, the insulation film 51 may contain at least one type of material selected from a group including silicon oxynitride and silicon nitride (SiN), for example. Moreover, the insulation film 51 may contain an insulation material such as a silicon oxide film in addition to the above material, or may additionally include an insulation material such as a silicon oxide film as a film (layer) other than the film (layer) including any of the above material.

Figure 2:
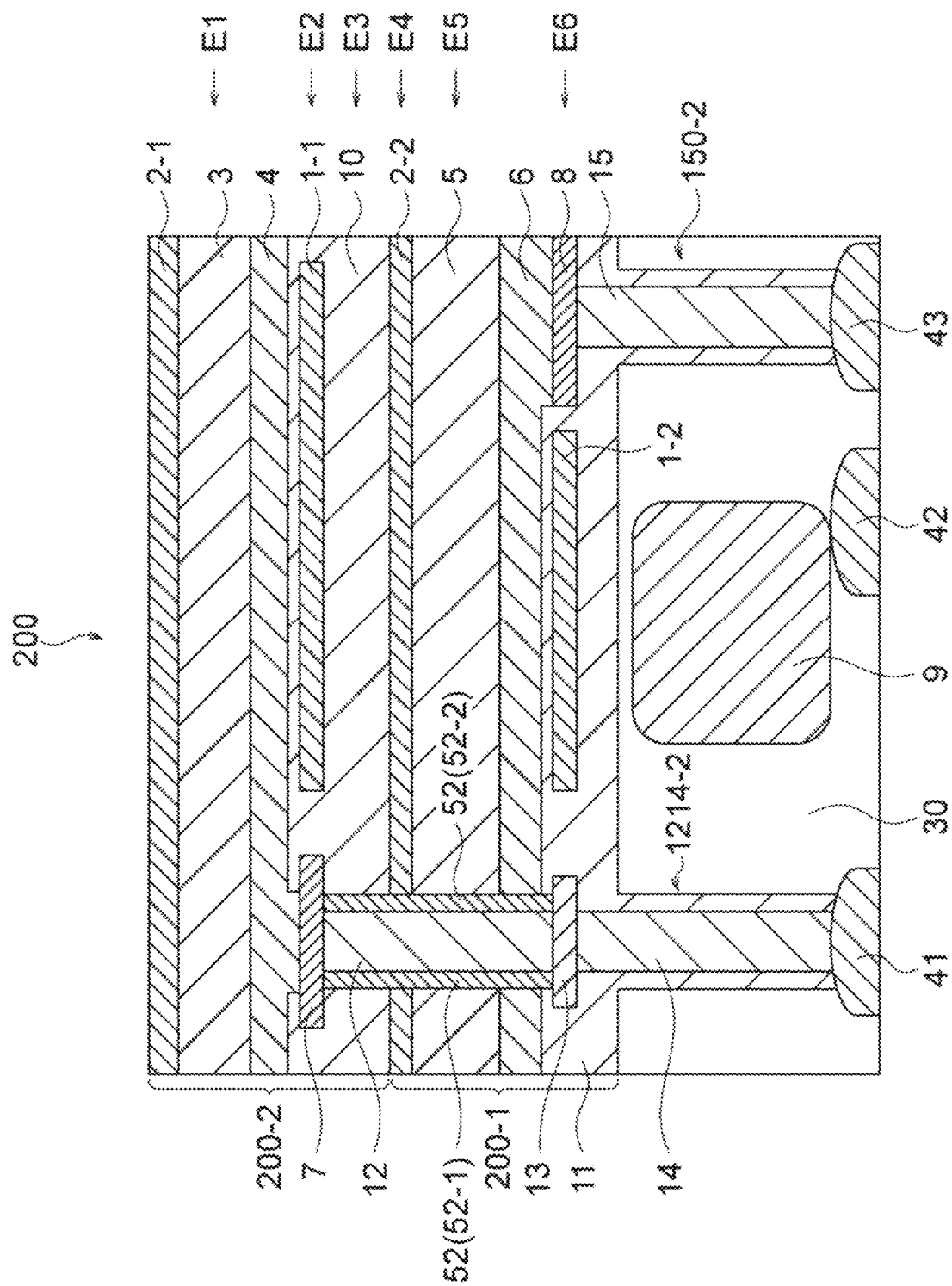
FIG. 2 is a diagram depicting a configuration example of a solid-state imaging device according to the first embodiment to which the present technology is applied.

Description with reference to FIG. 2 will next be presented. FIG. 2 is a cross-sectional diagram depicting a configuration example of a solid-state imaging device (solid-state imaging device 200) according to the first embodiment of the present technology.

The solid-state imaging device 200 includes the semiconductor substrate 30, a first photoelectric conversion unit 200-1 that is provided above the semiconductor substrate 30 (on the light entrance side and the upper side in FIG. 2) and that converts light into charge, and a second photoelectric conversion unit 200-2 that is provided above the first photoelectric conversion unit 200-1 (on the light entrance side and the upper side in FIG. 2) and that converts light into charge.

The first photoelectric conversion unit 200-1 includes the first electrode 8 (corresponding to a reading electrode, and a lower electrode in FIG. 2), the second electrode 2-2 (corresponding to an upper electrode in FIG. 2), and the photoelectric conversion film 5 provided between the first electrode (reading electrode) 8 and the second electrode 2-2.

The second photoelectric conversion unit 200-2 includes the first electrode 7 (corresponding to a reading electrode, and a lower electrode in FIG. 2), the second electrode 2-1 (corresponding to an upper electrode in FIG. 2), and the photoelectric conversion film 3 provided between the first electrode (reading electrode) 7 and the second electrode 2-1.

In the first photoelectric conversion unit 200-1, the transfer layer 6 is provided between the first electrode 8 and the photoelectric conversion film 5, and the charge accumulation electrode 1-2 is disposed away from the first electrode 8 and located in the insulation layer 11 in such a position as to face the photoelectric conversion film 5 (transfer layer 6) via the insulation layer 11 below the transfer layer 6. Meanwhile, in the second photoelectric conversion unit 200-2, the transfer layer 4 is provided between the first electrode 7 and the photoelectric conversion film 3, and the charge accumulation electrode 1-1 is disposed away from the first electrode 7 and located in the insulation layer 10 in such a position as to face the photoelectric conversion film 3 (transfer layer 4) via the insulation layer 10 below the transfer layer.

The first electrode 7 of the second photoelectric conversion unit 200-2 and the charge accumulation unit 41 formed in the semiconductor substrate 30 are electrically connected to each other via the conductive portion (through electrode) 12 penetrating the first photoelectric conversion unit 200-1. Specifically, the solid-state imaging device 200 has a connection hole 1214-2 penetrating the insulation layer 10, the first photoelectric conversion unit 200-1, and the semiconductor substrate 30, to electrically connect the first electrode 7 of the second photoelectric conversion unit 200-2 and the charge accumulation unit 41 formed in the semiconductor substrate 30. The conductive portion (through electrode) 12 and the conductive portion (through electrode) 14 are formed in the connection hole 1214-2. The conductive portion (through electrode) 12 connected to the first electrode 7 and the conductive portion (through electrode) 14 connected to the charge accumulation unit 41 are connected to each other via the via 13. The photodiode (PD) 9 formed in the semiconductor substrate 30 is connected to the charge accumulation unit 42. Further, a connection hole 150-2 penetrating the insulation layer 11 and the semiconductor substrate 30 is formed to electrically connect the first electrode 8 of the first photoelectric conversion unit 200-1 and the charge accumulation unit 43 formed in the semiconductor substrate 30. Specifically, the first electrode 8 is connected to the charge accumulation unit 43 via the conductive portion (through electrode) 15 formed in the connection hole 150-2.

An insulation film 52 having fixed charge of a type identical to a type of charge accumulated in the charge accumulation unit 41 is formed in the connection hole 1214-2, between the conductive portion 12 (through electrode) and the insulation layer 10, the second electrode 2-2 below the insulation layer 10, the photoelectric conversion film 5 below the second electrode 2-2, the transfer layer 6 below the photoelectric conversion film 5, and the insulation layer 11 below the transfer layer 6 such that the insulation film 52 covers the outer circumference of the conductive portion 12 (through electrode). Specifically, with respect to the connection hole 1214-2 in FIG. 2 as a center reference in the left-right direction in this figure, the insulation layer 10, the second electrode 2-2 below the insulation layer 10, the photoelectric conversion film 5 below the second electrode 2-2, the transfer layer 6 below the photoelectric conversion film 5, the insulation layer 11 below the transfer layer 6, an insulation film 52-1 (52), and the conductive portion 12 are formed in this order on the left side, while the insulation layer 10, the second electrode 2-2 below the insulation layer 10, the photoelectric conversion film 5 below the second electrode 2-2, the transfer layer 6 below the photoelectric conversion film 5, the insulation layer 11 below the transfer layer 6, an insulation film 52-2 (52), and the conductive portion 12 are formed in this order on the right side. As viewed in the up-down direction in FIG. 2, the insulation film 52 extends from the first electrode 7 formed in the insulation layer 10 to the via 13 formed in the insulation layer 11.

In a case where the signal charge to be read is an electron, the insulation film 52 is an insulation film having negative fixed charge. In a case where the signal charge to be read is a hole, the insulation film 52 is an insulation film having positive fixed charge. In the presence of the insulation film 52 in the solid-state imaging device 200, signal charge photoelectrically converted by the photoelectric conversion film 5 is not captured by the conductive portion 12 (through electrode), but is accumulated in the transfer layer 6 above the accumulation electrode 1-2.

In a case where the insulation film 52 is an insulation film having negative fixed charge, the insulation film 52 may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 52 may contain an insulation material such as a silicon oxide film in addition to the above material, or may additionally include an insulation material such as a silicon oxide film as a film (layer) other than the film (layer) including any of the above material.

In a case where the insulation film 52 is an insulation film having positive fixed charge, the insulation film 52 may contain at least one type of material selected from a group including silicon oxynitride and silicon nitride (SiN), for example. Moreover, the insulation film 52 may contain an insulation material such as a silicon oxide film in addition to the above material, or may additionally include an insulation material such as a silicon oxide film as a film (layer) other than the film (layer) including any of the above material.

Description with reference to FIGS. 3A, 3B, 3C, 3D, 3E, and 3F will now be presented. FIGS. 3A, 3B, 3C, 3D, 3E, and 3F depict plan layout diagrams illustrating a configuration example of a solid-state imaging device (solid-state imaging device 300) according to the first embodiment of the present technology. More specifically, FIG. 3A is a plan layout diagram depicting one pixel of the solid-state imaging device 200 at a position E1 in FIG. 2, FIG. 3B is a plan layout diagram depicting one pixel of the solid-state imaging device 200 at a position E2 in FIG. 2, FIG. 3C is a plan layout diagram depicting one pixel of the solid-state imaging device 200 at a position E3 in FIG. 2, FIG. 3D is a plan layout diagram depicting one pixel of the solid-state imaging device 200 at a position E4 in FIG. 2, FIG. 3E is a plan layout diagram depicting one pixel of the solid-state imaging device 200 at a position E5 in FIG. 2, and FIG. 3F is a plan layout diagram depicting one pixel of the solid-state imaging device 200 at a position E6 in FIG. 2. In addition, it is assumed that one pixel has one charge accumulation electrode 1-1 or 1-2 (or one photodiode (PD) 9). The solid-state imaging device 200 depicted in FIG. 2 includes one second pixel included in the second photoelectric conversion unit 200-2 having the one charge accumulation electrode 1-1, one first pixel included in the first photoelectric conversion unit 200-1 having the one charge accumulation electrode 1-2, and one third pixel having one photodiode (PD) (the one first pixel, the one second pixel, and the one third pixel will collectively be referred to as one pixel unit in some cases; the same shall apply hereinafter). Meanwhile, in a case where the charge accumulation electrode 1-1 or 1-2 includes a plurality of charge accumulation electrode segments, it is assumed that one pixel has the plurality of charge accumulation electrode segments combined into one electrode (one charge accumulation electrode 1-1 or 1-2). In other words, one charge accumulation electrode segment is not considered to be provided for each pixel. These definitions of pixels are applicable to at least the present technology.

FIG. 3A depicts the photoelectric conversion film 3 corresponding to one pixel (one second pixel). The photoelectric conversion film 3 is a photoelectric conversion film which absorbs green light (e.g., light having a wavelength ranging from 495 to 570 nm), for example.

FIG. 3B depicts the first electrode (signal reading electrode) 7 formed in the insulation layer 10 and the charge accumulation electrode 1-1 formed in the insulation layer 10 disposed in this order from the left in FIG. 3B. As depicted in FIG. 3B, the first electrode (signal reading electrode) 7 and the charge accumulation electrode 1-1 are disposed substantially in the same plane. One charge accumulation unit (floating diffusion (FD)) (not depicted in FIG. 3B) connected to the first electrode (signal reading electrode) 7 via the conductive portion 12 (through electrode) described below is provided for each second pixel.

FIG. 3C depicts the conductive portion 12 (through electrode) formed in the insulation layer 10 and an insulation film 53-c having negative or positive fixed charge in a left part of FIG. 3C. As depicted in FIG. 3C, the insulation film 53-c is so formed as to cover the outer circumference of the conductive portion 12 (through electrode).

FIG. 3D depicts the second electrode 2-2 and the conductive portion 12 (through electrode) and an insulation film 53-d having negative or positive fixed charge both formed in a left part of FIG. 3D. As depicted in FIG. 3D, the insulation film 53-d is so formed as to cover the outer circumference of the conductive portion 12 (through electrode). The conductive portion 12 and the second electrode 2-2 are insulated from each other by the insulation film 53-d.

FIG. 3E depicts the photoelectric conversion film 5 corresponding to one pixel (one first pixel) and the conductive portion 12 (through electrode) and an insulation film 53-e having negative or positive fixed charge both formed in a left part of FIG. 3E. For example, the photoelectric conversion film 5 is a photoelectric conversion film which absorbs red light (e.g., light having a wavelength ranging from 620 to 750 nm). As depicted in FIG. 3E, the insulation film 53-e is so formed as to cover the outer circumference of the conductive portion 12 (through electrode). Signal charge (electron or hole) photoelectrically converted by the photoelectric conversion film 5 is not captured by the conductive portion 12 (through electrode) in the presence of the insulation film 53-e.

FIG. 3F depicts the conductive portion 12 (through electrode) formed in the insulation layer 11, an insulation film 53-f that is so formed as to cover the outer circumference of the conductive portion 12 (through electrode) and that has negative or positive fixed charge, the charge accumulation electrode 1-2, and the first electrode (signal reading electrode) 8 in this order from the left of FIG. 3F. As depicted in FIG. 3F, the insulation film 53-f and the insulation layer 11 insulate the conductive portion 12 (through electrode) from the charge accumulation electrode 1-2, and the insulation layer 11 insulates the charge accumulation electrode 1-2 from the first electrode (signal reading electrode) 8. In addition, the first electrode (signal reading electrode) 8 and the charge accumulation electrode 1-2 are disposed substantially in the same plane. One charge accumulation unit (floating diffusion (FD)) (not depicted in FIG. 3B) connected to the first electrode (signal reading electrode) 8 via a conductive portion 15 (through electrode) (not depicted in FIGS. 3A, 3B, 3C, 3D, 3E, and 3F) are provided for each first pixel.

Description with reference to FIGS. 4A, 4B, 4C, 4D, 4E, and 4F will next be presented. FIGS. 4A, 4B, 4C, 4D, 4E, and 4F are plan layout diagrams depicting a configuration example of a solid-state imaging device (solid-state imaging device 400) according to the first embodiment of the present technology. More specifically, FIG. 4A is a plan layout diagram depicting four pixels of the solid-state imaging device 200 at a position E1 in FIG. 2, FIG. 4B is a plan layout diagram depicting four pixels of the solid-state imaging device 200 at a position E2 in FIG. 2, FIG. 4C is a plan layout diagram depicting four pixels of the solid-state imaging device 200 at a position E3 in FIG. 2, FIG. 4D is a plan layout diagram depicting four pixels of the solid-state imaging device 200 at a position E4 in FIG. 2, FIG. 4E is a plan layout diagram depicting four pixels of the solid-state imaging device 200 at a position E5 in FIG. 2, and FIG. 4F is a plan layout diagram depicting four pixels of the solid-state imaging device 200 at a position E6 in FIG. 2. Meanwhile, as described above, the solid-state imaging device 200 depicted in FIG. 2 includes one second pixel included in the second photoelectric conversion unit 200-2 having the one charge accumulation electrode 1-1, one first pixel included in the first photoelectric conversion unit 200-1 having the one charge accumulation electrode 1-2, and one third pixel having one photodiode (PD) (the one first pixel, the one second pixel, and the one third pixel will collectively be referred to as one pixel unit in some cases; the same shall apply hereinafter). Accordingly, the cross-sectional diagram of the solid-state imaging device 200 in FIG. 2 depicting one pixel unit does not coincide with the plan layout diagrams of the solid-state imaging device 400 in FIGS. 4A, 4B, 4C, 4D, 4E, and 4F depicting four pixel units, in a strict sense.

FIG. 4A depicts the photoelectric conversion films 3 (photoelectric conversion films 3-1 to 3-4) corresponding to four pixels (four second pixels). For example, each of the photoelectric conversion films 3 is a photoelectric conversion film which absorbs green light (e.g., light having a wavelength ranging from 495 to 570 nm).

FIG. 4B depicts respective charge accumulation electrodes 1-1-1 to 1-1-4 (corresponding to four pixels) formed in an insulation layer 10-1 for each second pixel. A first electrode (signal reading electrode) 7-1 is provided at a central portion of the four pixels. As depicted in FIG. 3B, the first electrode (signal reading electrode) 7-1 and the four charge accumulation electrodes 1-1-1 to 1-1-4 are disposed substantially in the same plane. The first electrode (signal reading electrode) 7-1 and one charge accumulation unit (floating diffusion (FD)) (not depicted in FIG. 4B) connected to the first electrode (signal reading electrode) 7-1 via a conductive portion 12-1 (through electrode) described below are shared by the four second pixels. Note that the number of the second pixels sharing the first electrode (signal reading electrode) 7-1 and the charge accumulation unit (floating diffusion (FD)) is not limited to four.

FIG. 4C depicts the conductive portion 12-1 (through electrode) formed in the insulation layer 10-1 and an insulation film 54-c having negative or positive fixed charge, both formed in a central part of FIG. 4C (central part of four pixels). As depicted in FIG. 4C, the insulation film 54-c is so formed as to cover the outer circumference of the conductive portion 12 (through electrode).

FIG. 4D depicts a second electrode 2-2-1 and the conductive portion 12-1 (through electrode) and an insulation film 54-d having negative or positive fixed charge both formed in a central part of FIG. 4D (central part of four pixels). As depicted in FIG. 4D, the insulation film 54-d is so formed as to cover the outer circumference of the conductive portion 12-1 (through electrode). The conductive portion 12-1 and the second electrode 2-2-1 are insulated from each other by the insulation film 54-d.

FIG. 4E depicts a photoelectric conversion film 5-1 corresponding to four pixels and the conductive portion 12-1 (through electrode) and an insulation film 54-e having negative or positive fixed charge both formed in a central part of FIG. 4E (central part of four pixels). For example, the photoelectric conversion film 5-1 corresponding to four pixels is a photoelectric conversion film which absorbs red light (e.g., light having a wavelength ranging from 620 to 750 nm). As depicted in FIG. 4E, the insulation film 54-*e* is so formed as to cover the outer circumference of the conductive portion 12-1 (through electrode). Signal charge (electron or hole) photoelectrically converted by the photoelectric conversion films 5 (photoelectric conversion films 5-1 to 5-4) is not captured by the conductive portion 12-1 (through electrode) in the presence of the insulation film 54-*e*.

FIG. 4F depicts respective charge accumulation electrodes 1-2-1 to 1-2-4 (corresponding to four pixels) formed in the insulation layer 11-1 for each second pixel. The conductive portion 12-1 (through electrode), and an insulation film 54-*f* that is so formed as to cover the outer circumference of the conductive portion 12-1 (through electrode) and that has negative or positive fixed charge are provided in a central portion of the four pixels. In addition, a first electrode (signal reading electrode) 8-1 is formed on the upper right of the charge accumulation electrode 1-2-1, a second electrode (signal reading electrode) 8-2 is formed on the lower right of the charge accumulation electrode 1-2-2, a second electrode (signal reading electrode) 8-3 is formed on the lower left of the charge accumulation electrode 1-2-3, and a second electrode (signal reading electrode) 8-4 is formed on the upper left of the charge accumulation electrode 1-2-4.

As depicted in FIG. 4F, the insulation film 54-*f* and the insulation layer 11-1 insulate the conductive portion 12-1 (through electrode) from the charge accumulation electrodes 1-2-1 to 1-2-4, and the insulation layer 11 insulates the charge accumulation electrodes 1-2-1 to 1-2-4 from the first electrodes (signal reading electrodes) 8-1 to 8-4. In addition, as depicted in FIG. 4F, the first electrodes (signal reading electrodes) 8-1 to 8-4 and the charge accumulation electrodes 1-2-1 to 1-2-4 are arranged substantially in the same plane. The first electrode (signal reading electrode) 8-1 and one charge accumulation unit (floating diffusion (FD)) (not depicted in FIG. 4F) connected to the first electrode 8-1 via the conductive portion 15 (through electrode) (not depicted in FIGS. 4A, 4B, 4C, 4D, 4E, and 4F) are shared by a pixel having the charge accumulation electrode 1-2-1 and a pixel on the right side (not depicted in FIG. 4F), a pixel on the upper side (not depicted in FIG. 4F), and a pixel on the upper right (not depicted in FIG. 4F) of the pixel having the charge accumulation electrode 1-2-1 (four pixels in total). The first electrode (signal reading electrode) 8-2 and one charge accumulation unit (floating diffusion (FD)) (not depicted in FIG. 4F) connected to the first electrode 8-2 via the conductive portion 15 (through electrode) (not depicted in FIGS. 4A, 4B, 4C, 4D, 4E, and 4F) are shared by a pixel having the charge accumulation electrode 1-2-2 and a pixel on the right side (not depicted in FIG. 4F), a pixel on the lower side (not depicted in FIG. 4F), and a pixel on the lower right (not depicted in FIG. 4F) of the pixel having the charge accumulation electrode 1-2-2 (four pixels in total). The first electrode (signal reading electrode) 8-3 and one charge accumulation unit (floating diffusion (FD)) (not depicted in FIG. 4F) connected to the first electrode 8-3 via the conductive portion 15 (through electrode) (not depicted in FIGS. 4A, 4B, 4C, 4D, 4E, and 4F) are shared by a pixel having the charge accumulation electrode 1-2-3 and a pixel on the left side (not depicted in FIG. 4F), a pixel on the lower side (not depicted in FIG. 4F), and a pixel on the lower left (not depicted in FIG. 4F) of the pixel having the charge accumulation electrode 1-2-3 (four pixels in total). The first electrode (signal reading electrode) 8-4 and one charge accumulation unit (floating diffusion (FD)) (not depicted in FIG. 4F) connected to the first electrode 8-4 via the conductive portion 15 (through electrode) (not depicted in FIGS. 4A, 4B, 4C, 4D, 4E, and 4F) are shared by a pixel having the charge accumulation electrode 1-2-4 and a pixel on the left side (not depicted in FIG. 4F), a pixel on the upper side (not depicted in FIG. 4F), and a pixel on the upper left (not depicted in FIG. 4F) of the pixel having the charge accumulation electrode 1-2-4 (four pixels in total). Note that the number of the second pixels sharing the first electrode (signal reading electrode) 8-1 and the charge accumulation unit (floating diffusion (FD)) is not limited to four. The number of the second pixels sharing the first electrode (signal reading electrode) 8-2 and the charge accumulation unit (floating diffusion (FD)) is not limited to four. The number of the second pixels sharing the first electrode (signal reading electrode) 8-3 and the charge accumulation unit (floating diffusion (FD)) is not limited to four. The number of the second pixels sharing the first electrode (signal reading electrode) 8-4 and the charge accumulation unit (floating diffusion (FD)) is not limited to four.

Figures 5A, 5B:
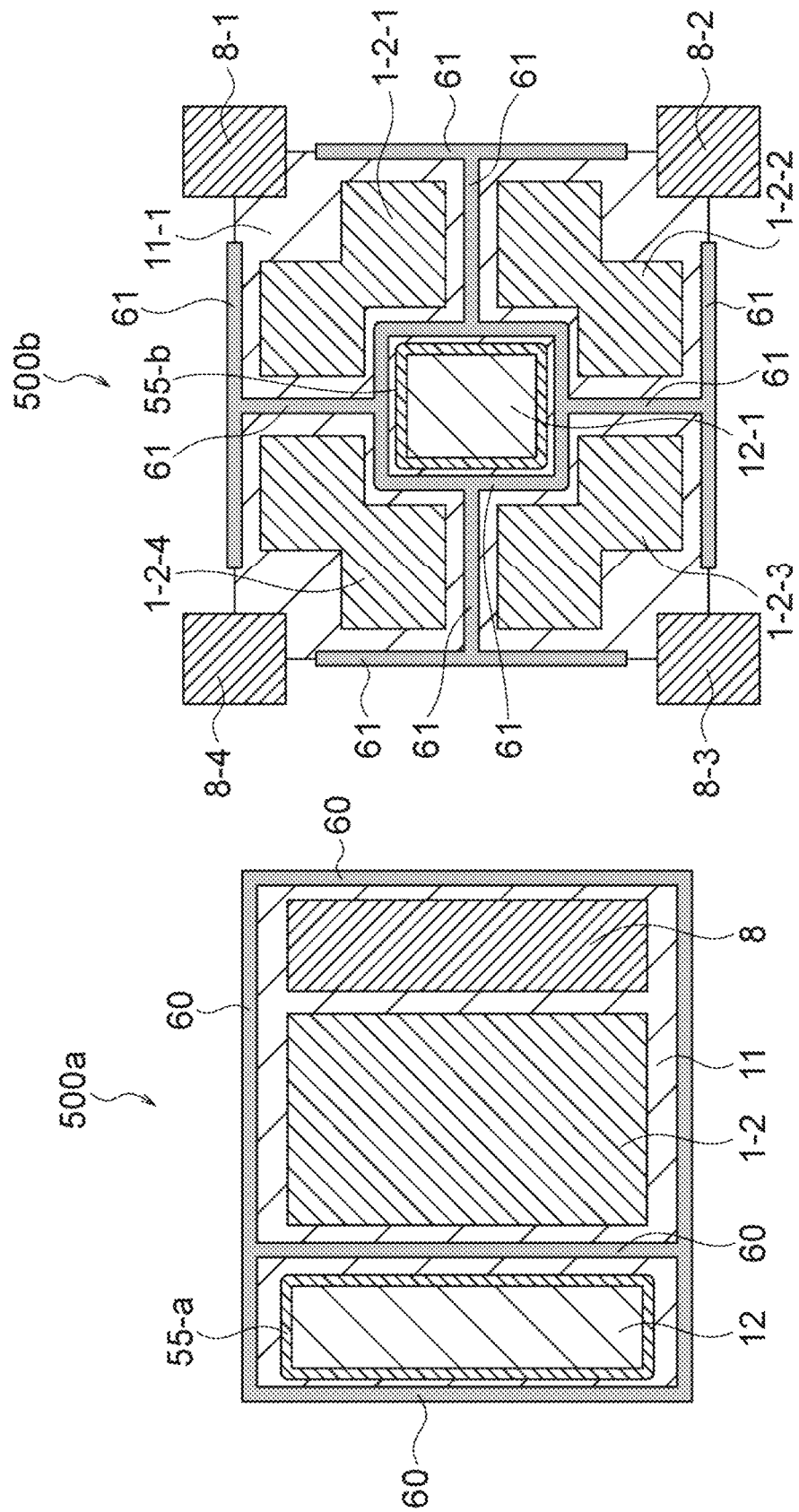
FIGS. 5A and 5B depict diagrams illustrating a configuration example of a solid-state imaging device according to the first embodiment to which the present technology is applied.

Description with reference to FIGS. 5A and 5B will now be presented. FIG. 5A plan layout diagrams depicting a configuration example of a solid-state imaging device (solid-state imaging device 500*a*) according to the first embodiment of the present technology. More specifically, FIG. 5A is a plan layout diagram depicting a state where a light shielding electrode is disposed in FIG. 3F.

FIG. 5B plan layout diagram depicting a configuration example of a solid-state imaging device (solid-state imaging device 500*b*) according to the first embodiment of the present technology. More specifically, FIG. 5B is a plan layout diagram depicting a state where a light shielding electrode is disposed in FIG. 4F.

FIG. 5A depicts a shielding electrode 60 which is so provided as to surround the conductive portion 12 (through electrode) and an insulation film 55-*a* that is so formed as to cover the outer circumference of the conductive portion 12 (through electrode) and that has negative or positive fixed charge. The shielding electrode 60 is so formed as to surround the charge accumulation electrode 1-2 and the first electrode (signal reading electrode) 8.

FIG. 5B depicts a shielding electrode 61 which is so provided as to surround the conductive portion 12-1 (through electrode) and an insulation film 55-*b* that is so formed as to cover the outer circumference of the conductive portion 12-1 (through electrode) and that has negative or positive fixed charge. In addition, with reference to a central portion of the four pixels, the shielding electrode 61 is so formed as to surround the charge accumulation electrode 1-2-1 included in the upper right pixel of the four pixels, the shielding electrode 61 is so formed as to surround the charge accumulation electrode 1-2-2 included in the lower right pixel of the four pixels, the shielding electrode 61 is so formed as to surround the charge accumulation electrode 1-2-3 included in the lower left pixel of the four pixels, and the shielding electrode 61 is so formed as to surround the charge accumulation electrode 1-2-4 included in the upper left pixel of the four pixels.

Figure 6:
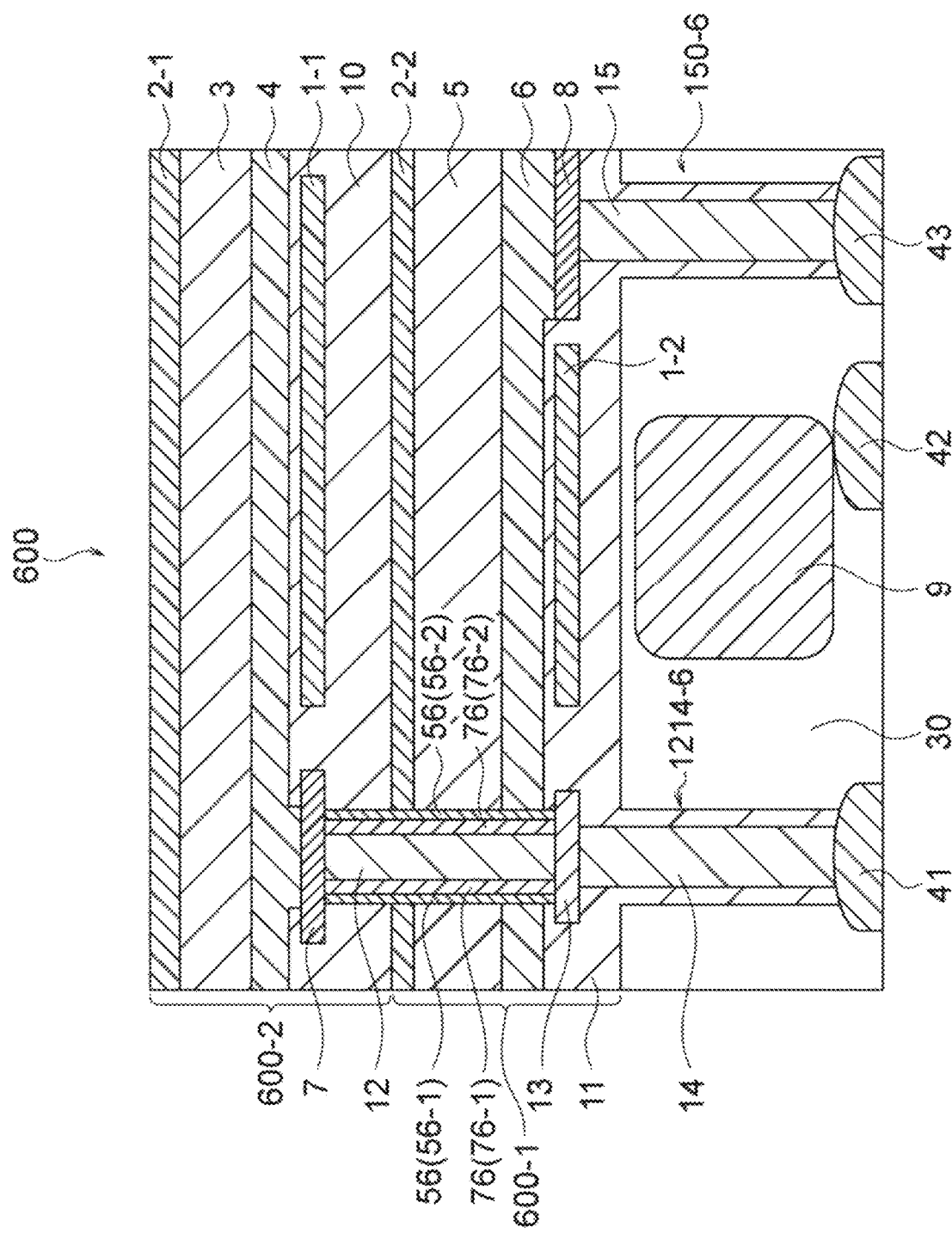
FIG. 6 is a diagram depicting a configuration example of a solid-state imaging device according to the first embodiment to which the present technology is applied.

Description with reference to FIG. 6 will next be presented. FIG. 6 is a cross-sectional diagram depicting a configuration example of a solid-state imaging device (solid-state imaging device 600) according to the first embodiment of the present technology.

The solid-state imaging device 600 includes the semiconductor substrate 30, a first photoelectric conversion unit 600-1 that is provided above the semiconductor substrate 30 (on the light entrance side and the upper side in FIG. 6) and that converts light into charge, and a second photoelectric conversion unit 600-2 that is provided above the first photoelectric conversion unit 600-1 (on the light entrance side and the upper side in FIG. 6) and that converts light into charge.

The first photoelectric conversion unit 600-1 includes the first electrode 8 (corresponding to a reading electrode, and a lower electrode in FIG. 6), the second electrode 2-2 (corresponding to an upper electrode in FIG. 6), and the photoelectric conversion film 5 provided between the first electrode (reading electrode) 8 and the second electrode 2-2.

The second photoelectric conversion unit 600-2 includes the first electrode 7 (corresponding to a reading electrode, and a lower electrode in FIG. 6), the second electrode 2-1 (corresponding to an upper electrode in FIG. 6), and the photoelectric conversion film 3 provided between the first electrode (reading electrode) 7 and the second electrode 2-1.

In the first photoelectric conversion unit 600-1, the transfer layer 6 is provided between the first electrode 8 and the photoelectric conversion film 5, and the charge accumulation electrode 1-2 is disposed away from the first electrode 8 and located in the insulation layer 11 in such a position as to face the photoelectric conversion film 5 (transfer layer 6) via the insulation layer 11 below the transfer layer 6. Meanwhile, in the second photoelectric conversion unit 600-2, the transfer layer 4 is provided between the first electrode 7 and the photoelectric conversion film 3, and the charge accumulation electrode 1-1 is disposed away from the first electrode 7 and located in the insulation layer 10 in such a position as to face the photoelectric conversion film 3 (transfer layer 4) via the insulation layer 10 below the transfer layer 4.

The first electrode 7 of the second photoelectric conversion unit 600-2 and the charge accumulation unit 41 formed in the semiconductor substrate 30 are electrically connected to each other via the conductive portion (through electrode) 12 penetrating the first photoelectric conversion unit 600-1. Specifically, the solid-state imaging device 600 has a connection hole 1214-6 penetrating the insulation layer 10, the first photoelectric conversion unit 600-1, and the semiconductor substrate 30, to electrically connect the first electrode 7 of the second photoelectric conversion unit 600-2 and the charge accumulation unit 41 formed in the semiconductor substrate 30. The conductive portion (through electrode) 12 and the conductive portion (through electrode) 14 are formed in the connection hole 1214-6. The conductive portion (through electrode) 12 connected to the first electrode 7 and the conductive portion (through electrode) 14 connected to the charge accumulation unit 41 are connected to each other via the via 13. The photodiode (PD) 9 formed in the semiconductor substrate 30 is connected to the charge accumulation unit 42. Moreover, a connection hole 150-6 penetrating the insulation layer 11 and the semiconductor substrate 30 is formed to electrically connect the first electrode 8 of the first photoelectric conversion unit 600-1 and the charge accumulation unit 43 formed in the semiconductor substrate 30. Specifically, the first electrode 8 is connected to the charge accumulation unit 43 via the conductive portion (through electrode) 15 formed in the connection hole 150-6.

In the connection hole 1214-6, an insulation film 76 containing a high dielectric constant material is formed between the conductive portion 12 (through electrode) and the insulation layer 10, the second electrode 2-2 below the insulation layer 10, the photoelectric conversion film 5 below the second electrode 2-2, the transfer layer 6 below the photoelectric conversion film 5, and the insulation layer 11 below the transfer layer 6 such that the insulation film 76 covers the outer circumference of the conductive portion 12 (through electrode), and an insulation film 56 having fixed charge of a type identical to a type of charge accumulated in the charge accumulation unit 41 is formed between the conductive portion 12 (through electrode) and the insulation layer 10, the second electrode 2-2 below the insulation layer 10, the photoelectric conversion film 5 below the second electrode 2-2, the transfer layer 6 below the photoelectric conversion film 5, and the insulation layer 11 below the transfer layer 6 such that the insulation film 56 covers an outer circumference of the insulation film 76 containing the high dielectric constant material. Specifically, with respect to the connection hole 1214-16 in FIG. 6 as a center reference in the left-right direction in this figure, the insulation layer 10, the second electrode 2-2 below the insulation layer 10, the photoelectric conversion film 5 below the second electrode 2-2, the transfer layer 6 below the photoelectric conversion film 5, the insulation layer 11 below the transfer layer 6, an insulation film 56-1 (56), an insulation film 76-1 (76), and the conductive portion 12 are formed in this order on the left side, while the insulation layer 10, the second electrode 2-2 below the insulation layer 10, the photoelectric conversion film 5 below the second electrode 2-2, the transfer layer 6 below the photoelectric conversion film 5, the insulation layer 11 below the transfer layer 6, an insulation film 56-2 (56), the insulation film 76-1 (76), and the conductive portion 12 are formed in this order on the right side. As viewed in the up-down direction in FIG. 6, the insulation film 56 and the insulation film 76 extend from the first electrode 7 formed in the insulation layer 10 to the via 13 formed in the insulation layer 11.

In a case where the signal charge to be read is an electron, the insulation film 56 is an insulation film having negative fixed charge. In a case where the signal charge to be read is a hole, the insulation film 56 is an insulation film having positive fixed charge. In the presence of the insulation film 56 in the solid-state imaging device 600, signal charge photoelectrically converted by the photoelectric conversion film 5 is not captured by the conductive portion 12 (through electrode), but is accumulated in the transfer layer 6 above the accumulation electrode 1-2.

In a case where the insulation film 56 is an insulation film having negative fixed charge, the insulation film 56 may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 56 may contain an insulation material such as a silicon oxide film in addition to the above material, or may additionally include an insulation material such as a silicon oxide film as a film (layer) other than the film (layer) including any of the above material.

In a case where the insulation film 56 is an insulation film having positive fixed charge, the insulation film 56 may contain at least one type of material selected from a group including silicon oxynitride and silicon nitride (SiN), for example. Moreover, the insulation film 56 may contain an insulation material such as a silicon oxide film in addition to the above material, or may additionally include an insulation material such as a silicon oxide film as a film (layer) other than the film (layer) including any of the above material.

An effect of potential modulation imposed by the through electrode can be more reduced by using the insulation film 76 containing a high dielectric constant material. For example, the insulation film 76 containing a high dielectric constant material may contain at least one type selected from a group including hafnium oxide ($HfO_2$), aluminum oxide ($Al_2O_3$), titanium oxide ($TiO_2$), and STO (Strontium Titan Oxide).

The insulation film 56 having fixed charge and the insulation film 76 containing a high dielectric constant material may have a double-layer structure (double-film structure). However, the insulation film 56 and the insulation film 76 are not required to have this structure. For example, the insulation film 56 having fixed charge and the insulation film 76 containing a high dielectric constant material may be unified into one layer (one film).

Figure 18A:
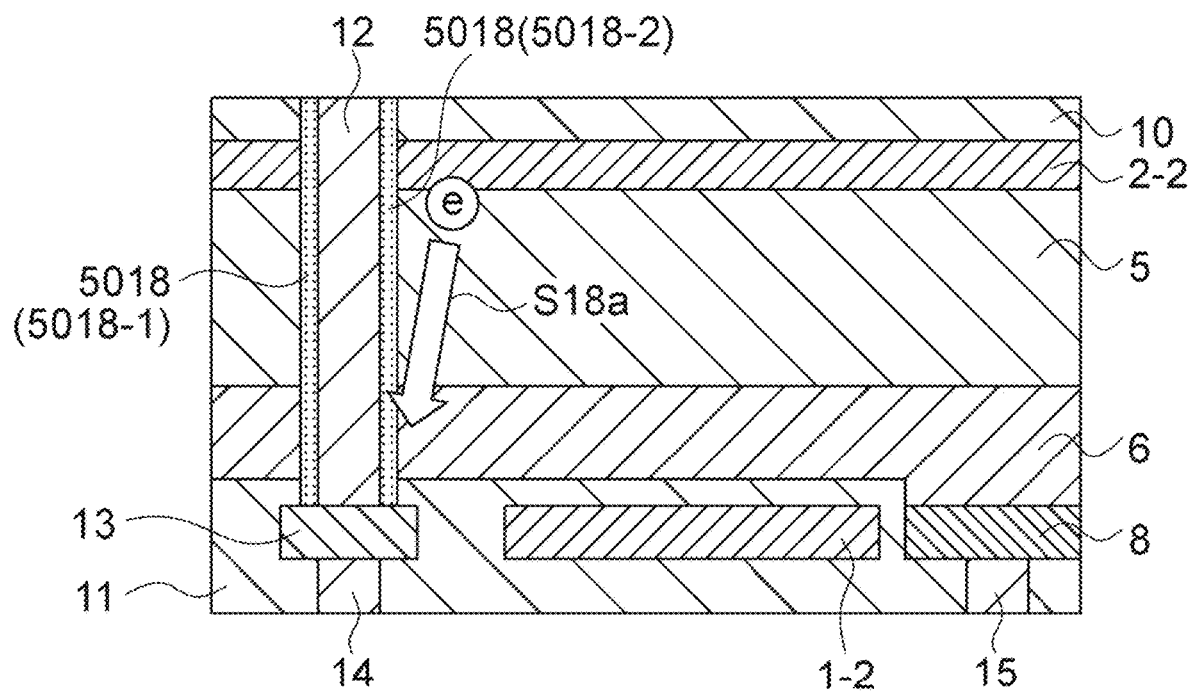
FIGS. 18A and 18B depict diagrams illustrating one example of a result of comparison between an insulation film having fixed charge and an insulation film not having fixed charge.
Figure 18B:
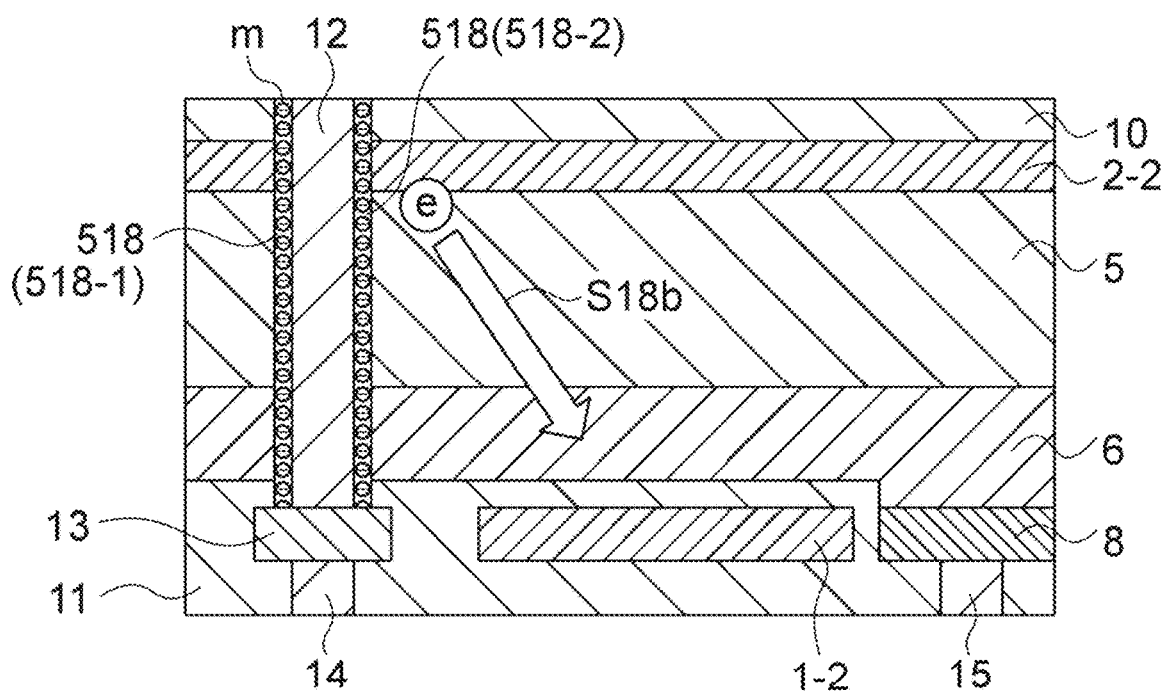

Description with reference to FIGS. 18A and 18B will finally be presented. FIGS. 18A and 18B depict diagram illustrating one example of a result of comparison between an insulation film having fixed charge and an insulation film not having fixed charge. More specifically, FIG. 18A depicts an insulation film 5018 that is so formed as to cover the outer circumference of the conductive portion 12 but that does not have fixed charge (a left part of FIG. 18A depicts an insulation film 5018-1, while a right part of FIG. 18B depicts an insulation film 5018-2). FIG. 18B depicts an insulation film 518 that is so formed as to cover the outer circumference of the conductive portion 12 and that has fixed charge (negative fixed charge m in FIG. 18B) (a left part of FIG. 18B depicts an insulation film 518-1, while a right part of FIG. 18B depicts an insulation film 518-2).

As depicted in FIG. 18A, signal charge (electron in the case of FIG. 18A) generated by photoelectric conversion using the photoelectric conversion film 5 is captured by the conductive portion 12 (through electrode) as indicated by an arrow S18a. In this case, an opening rate of the photoelectric conversion film 5 decreases, and afterimages and random noise become worse.

As depicted in FIG. 18B, signal charge (electron in the case of FIG. 18B) generated by photoelectric conversion using the photoelectric conversion film 5 is not captured by the conductive portion 12 (through electrode) but accumulated in the transfer layer 6 as indicated by an arrow S18b. In this case, the opening rate of the photoelectric conversion film 5 does not decrease, and afterimages and random noise do not become worse. Accordingly, dark current improves. Moreover, the shielding electrode described with reference to FIGS. 5A and 5B are not needed. Accordingly, for example, the quantity of electrons of the photodiode (PD) is allowed to increase in association with elimination of the necessity of the shielding electrode. Furthermore, the area of the charge accumulation electrode 1-2 is allowed to increase according to a space reduced by elimination of the necessity of the shielding electrode.

The above-described details associated with the solid-state imaging device of the first embodiment according to the present technology (example 1 of the solid-state imaging device) are applicable to solid-state imaging devices of second to sixth embodiments according to the present technology described below as long as no technical inconsistency is produced.

3. Second Embodiment (Example 2 of Solid-State Imaging Device)

A solid-state imaging device according to the second embodiment of the present technology (example 2 of the solid-state imaging device) will be described with reference to FIGS. 7 to 10.

Figure 7:
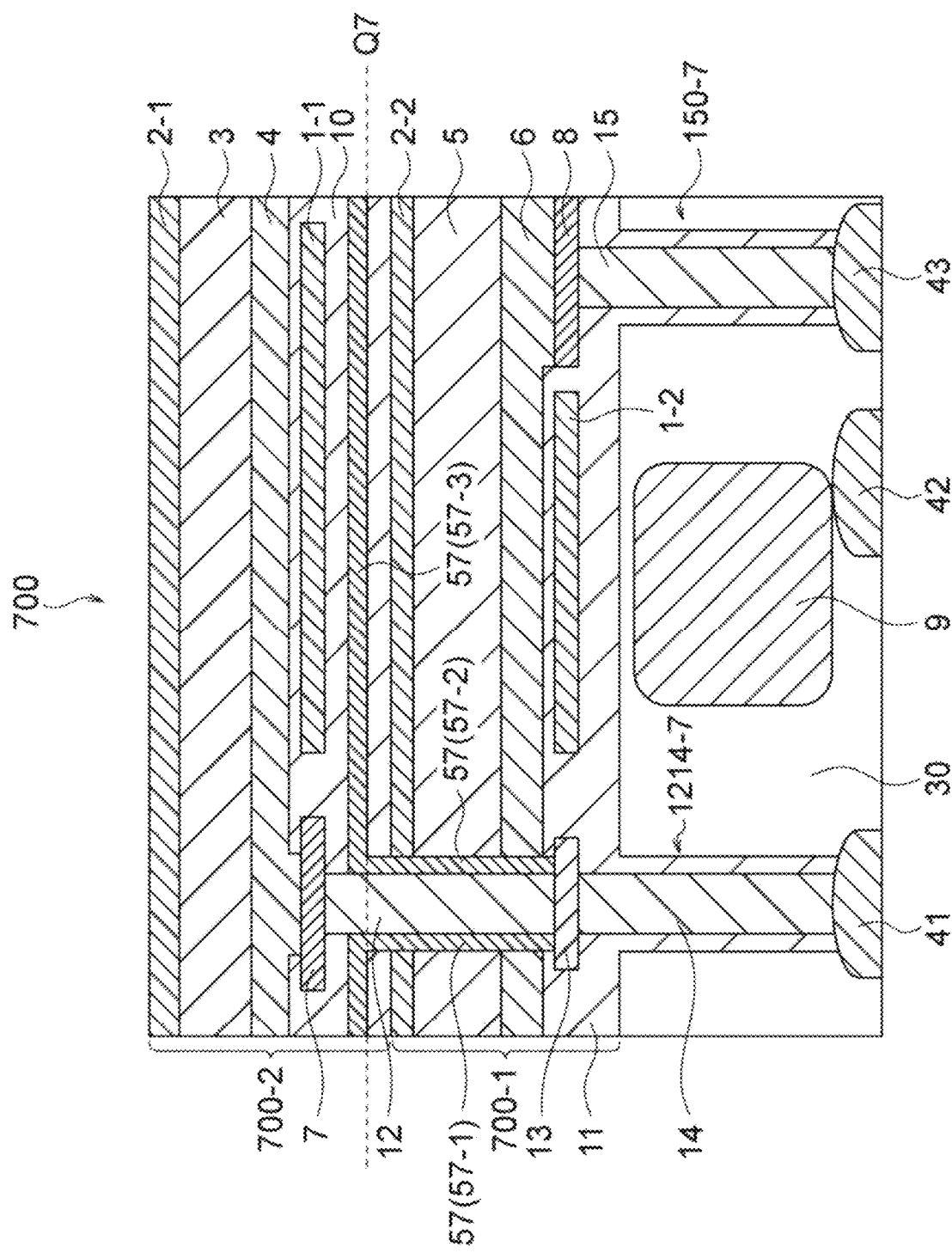
FIG. 7 is a diagram depicting a configuration example of a solid-state imaging device according to a second embodiment to which the present technology is applied.

Description with reference to FIG. 7 will first be presented. FIG. 7 is a cross-sectional diagram depicting a configuration example of a solid-state imaging device (solid-state imaging device 700) according to the second embodiment of the present technology.

The solid-state imaging device 700 includes the semiconductor substrate 30, a first photoelectric conversion unit 700-1 that is provided above the semiconductor substrate 30 (on the light entrance side and the upper side in FIG. 7) and that converts light into charge, and a second photoelectric conversion unit 700-2 that is provided above the first photoelectric conversion unit 700-1 (on the light entrance side and the upper side in FIG. 7) and that converts light into charge.

The first photoelectric conversion unit 700-1 includes the first electrode 8 (corresponding to a reading electrode, and a lower electrode in FIG. 7), the second electrode 2-2 (corresponding to an upper electrode in FIG. 7), and the photoelectric conversion film 5 provided between the first electrode (reading electrode) 8 and the second electrode 2-2.

The second photoelectric conversion unit 700-2 includes the first electrode 7 (corresponding to a reading electrode, and a lower electrode in FIG. 7), the second electrode 2-1 (corresponding to an upper electrode in FIG. 7), and the photoelectric conversion film 3 provided between the first electrode (reading electrode) 7 and the second electrode 2-1.

In the first photoelectric conversion unit 700-1, the transfer layer 6 is provided between the first electrode 8 and the photoelectric conversion film 5, and the charge accumulation electrode 1-2 is disposed away from the first electrode 8 and located in the insulation layer 11 in such a position as to face the photoelectric conversion film 5 (transfer layer 6) via the insulation layer 11 below the transfer layer 6. Meanwhile, in the second photoelectric conversion unit 700-2, the transfer layer 4 is provided between the first electrode 7 and the photoelectric conversion film 3, and the charge accumulation electrode 1-1 is disposed away from the first electrode 7 and located in the insulation layer 10 in such a position as to face the photoelectric conversion film 3 (transfer layer 4) via the insulation layer 10 below the transfer layer 4.

The first electrode 7 of the second photoelectric conversion unit 700-2 and the charge accumulation unit 41 formed in the semiconductor substrate 30 are electrically connected to each other via the conductive portion (through electrode) 12 penetrating the first photoelectric conversion unit 700-1. Specifically, the solid-state imaging device 700 has a connection hole 1214-7 penetrating the insulation layer 10, the first photoelectric conversion unit 700-1, and the semiconductor substrate 30, to electrically connect the first electrode 7 of the second photoelectric conversion unit 700-2 and the charge accumulation unit 41 formed in the semiconductor substrate 30. The conductive portion (through electrode) 12 and the conductive portion (through electrode) 14 are formed in the connection hole 1214-7. The conductive portion (through electrode) 12 connected to the first electrode 7 and the conductive portion (through electrode) 14 connected to the charge accumulation unit 41 are connected to each other via the via 13. The photodiode (PD) 9 formed in the semiconductor substrate 30 is connected to the charge accumulation unit 42. Moreover, a connection hole 150-7 penetrating the insulation layer 11 and the semiconductor substrate 30 is formed to electrically connect the first electrode 8 of the first photoelectric conversion unit 700-1 and the charge accumulation unit 43 formed in the semiconductor substrate 30. Specifically, the first electrode 8 is connected to the charge accumulation unit 43 via the conductive portion (through electrode) 15 formed in the connection hole 150-7.

An insulation film 57 having fixed charge of a type identical to a type of charge accumulated in the charge accumulation unit 41 is formed in the connection hole 1214-7, between the conductive portion 12 (through electrode) and the insulation layer 10, the second electrode 2-2 below the insulation layer 10, the photoelectric conversion film 5 below the second electrode 2-2, the transfer layer 6 below the photoelectric conversion film 5, and the insulation layer 11 below the transfer layer 6 such that the insulation film 57 covers the outer circumference of the conductive portion 12 (through electrode). Specifically, with respect to the connection hole 1214-7 in FIG. 7 as a center reference in the left-right direction in this figure, the insulation layer 10, the second electrode 2-2 below the insulation layer 10, the photoelectric conversion film 5 below the second electrode 2-2, the transfer layer 6 below the photoelectric conversion film 5, the insulation layer 11 below the transfer layer 6, an insulation film 57-1 (57), and the conductive portion 12 are formed in this order on the left side, while the insulation layer 10, the second electrode 2-2 below the insulation layer 10, the photoelectric conversion film 5 below the second electrode 2-2, the transfer layer 6 below the photoelectric conversion film 5, the insulation layer 11 below the transfer layer 6, an insulation film 57-2 (57), and the conductive portion 12 are formed in this order on the right side. As viewed in the up-down direction in FIG. 7, the insulation film 57 extends from an insulation film 57-3 (57) that has a flat shape (solid shape) and that is formed in the insulation layer 10 to the via 13 formed in the insulation layer 11.

In the case of the solid-state imaging device 700, after formation up to Q7 in FIG. 7 is completed, i.e., after the semiconductor substrate 30, the first photoelectric conversion unit 700-1, and the insulation layer 10 are formed, the connection hole 1214-7 is so formed as to penetrate the inside of the solid-state imaging device 700 from the position of Q7 to the position of the first electrode 8 (via 13) as a height level (up-down direction in FIG. 7). Thereafter, the insulation film 57 is embedded in the connection hole 1214-7 by the ALD method, for example, and the insulation film 57-3 (57) is formed in a solid shape (flat shape) on the insulation layer 10. Note that the insulation film 57-3 (57) may be removed by etching or other methods after being formed.

In a case where the signal charge to be read is an electron, the insulation film 57 is an insulation film having negative fixe charge. In a case where the signal charge to be read is a hole, the insulation film 57 is an insulation film having positive fixed charge. In the presence of the insulation film 57 in the solid-state imaging device 700, signal charge photoelectrically converted by the photoelectric conversion film 5 is not captured by the conductive portion 12 (through electrode), but is accumulated in the transfer layer 6 above the accumulation electrode 1-2.

In a case where the insulation film 57 is an insulation film having negative fixed charge, the insulation film 57 may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 57 may contain an insulation material such as a silicon oxide film in addition to the above material, or may additionally include an insulation material such as a silicon oxide film as a film (layer) other than the film (layer) including any of the above material.

In a case where the insulation film 57 is an insulation film having positive fixed charge, the insulation film 57 may contain at least one type of material selected from a group including silicon oxynitride and silicon nitride (SiN), for example. Moreover, the insulation film 57 may contain an insulation material such as a silicon oxide film in addition to the above material, or may additionally include an insulation material such as a silicon oxide film as a film (layer) other than the film (layer) including any of the above material.

Figure 8:
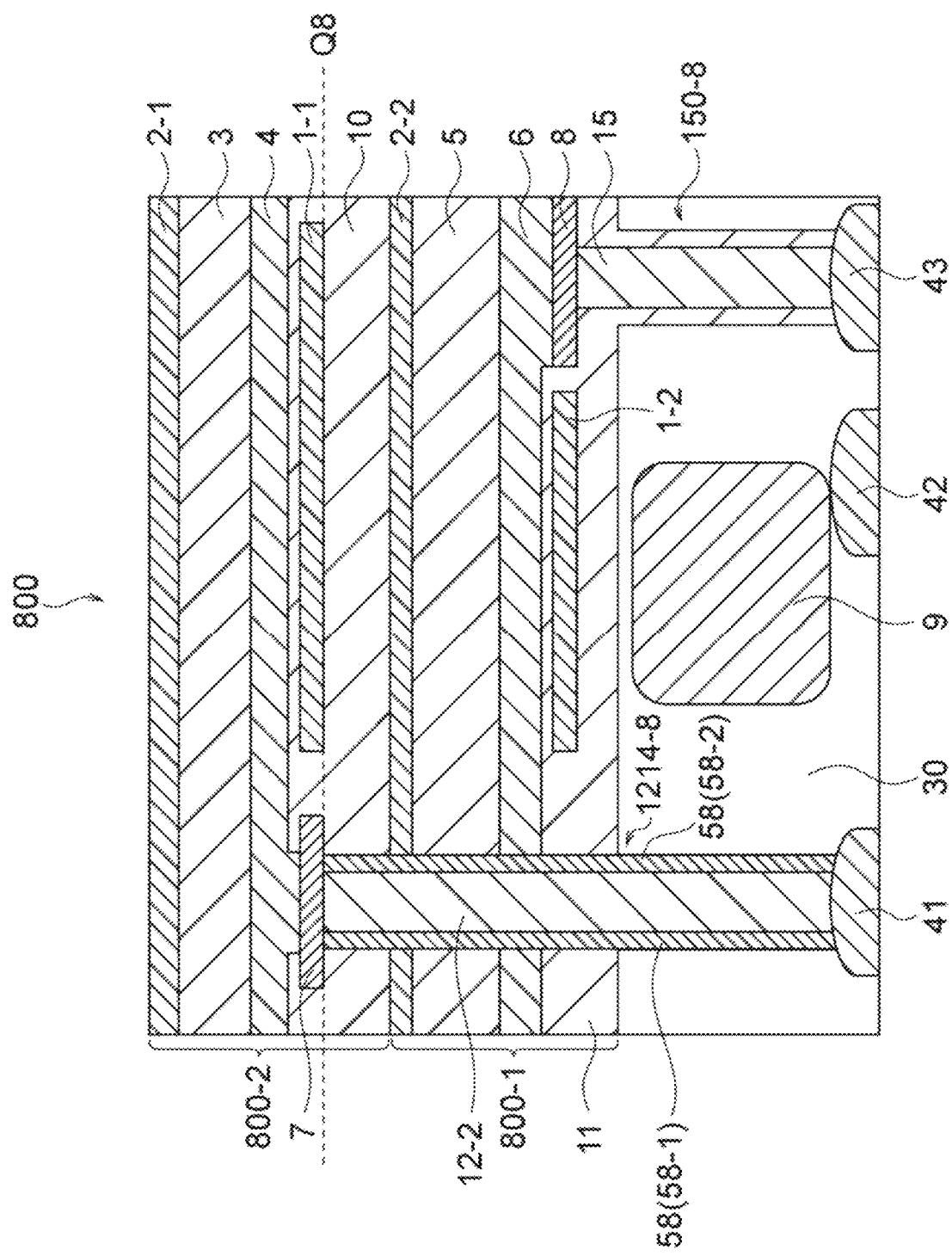
FIG. 8 is a diagram depicting a configuration example of a solid-state imaging device according to the second embodiment to which the present technology is applied.

Description with reference to FIG. 8 will next be presented. FIG. 8 is a cross-sectional diagram depicting a configuration example of a solid-state imaging device (solid-state imaging device 800) according to the second embodiment of the present technology.

The solid-state imaging device 800 includes the semiconductor substrate 30, a first photoelectric conversion unit 800-1 that is provided above the semiconductor substrate 30 (on the light entrance side and the upper side in FIG. 8) and that converts light into charge, and a second photoelectric conversion unit 800-2 that is provided above the first photoelectric conversion unit 800-1 (on the light entrance side and the upper side in FIG. 8) and that converts light into charge.

The first photoelectric conversion unit 800-1 includes the first electrode 8 (corresponding to a reading electrode, and a lower electrode in FIG. 8), the second electrode 2-2 (corresponding to an upper electrode in FIG. 8), and the photoelectric conversion film 5 provided between the first electrode (reading electrode) 8 and the second electrode 2-2.

The second photoelectric conversion unit 800-2 includes the first electrode 7 (corresponding to a reading electrode, and a lower electrode in FIG. 8), the second electrode 2-1 (corresponding to an upper electrode in FIG. 8), and the photoelectric conversion film 3 provided between the first electrode (reading electrode) 7 and the second electrode 2-1.

In the first photoelectric conversion unit 800-1, the transfer layer 6 is provided between the first electrode 8 and the photoelectric conversion film 5, and the charge accumulation electrode 1-2 is disposed away from the first electrode 8 and located in the insulation layer 11 in such a position as to face the photoelectric conversion film 5 (transfer layer 6) via the insulation layer 11 below the transfer layer 6. Meanwhile, in the second photoelectric conversion unit 800-2, the transfer layer 4 is provided between the first electrode 7 and the photoelectric conversion film 3, and the charge accumulation electrode 1-1 is disposed away from the first electrode 7 and located in the insulation layer 10 in such a position as to face the photoelectric conversion film 3 (transfer layer 4) via the insulation layer 10 below the transfer layer 4.

The first electrode 7 of the second photoelectric conversion unit 800-2 and the charge accumulation unit 41 formed in the semiconductor substrate 30 are electrically connected to each other via a conductive portion (through electrode) 12-2 penetrating the first photoelectric conversion unit 800-1 and the semiconductor substrate 30. Specifically, the solid-state imaging device 800 has a connection hole 1214-8 penetrating the insulation layer 10, the first photoelectric conversion unit 800-1, and the semiconductor substrate 30, to electrically connect the first electrode 7 of the second photoelectric conversion unit 800-2 and the charge accumulation unit 41 formed in the semiconductor substrate 30. The conductive portion (through electrode) 12-2 is formed in the connection hole 1214-8. The first electrode 7 is connected to the charge accumulation unit 41 via the conductive portion (through electrode) 12-2. The photodiode (PD) 9 formed in the semiconductor substrate 30 is connected to the charge accumulation unit 42. Moreover, a connection hole 150-8 penetrating the insulation layer 11 and the semiconductor substrate 30 is formed to electrically connect the first electrode 8 of the first photoelectric conversion unit 800-1 and the charge accumulation unit 43 formed in the semiconductor substrate 30. Specifically, the first electrode 8 is connected to the charge accumulation unit 43 via the conductive portion (through electrode) 15 formed in the connection hole 150-8.

An insulation film 58 having fixed charge of a type identical to a type of charge accumulated in the charge accumulation unit 41 is formed in the connection hole 1214-8, between the conductive portion 12-2 (through electrode) and the insulation layer 10, the first photoelectric conversion unit 800-1, and the semiconductor substrate 30 such that the insulation film 58 covers an outer circumference of the conductive portion 12-2 (through electrode). Specifically, with respect to the connection hole 1214-8 in FIG. 8 as a center reference in the left-right direction in this figure, the insulation layer 10, the first photoelectric conversion unit 800-1, the semiconductor substrate 30, an insulation film 58-1 (58), and the conductive portion 12-2 are formed in this order on the left side, while the insulation layer 10, the insulation layer 10, the first photoelectric conversion unit 800-1, the semiconductor substrate 30, an insulation film 58-2 (58), and the conductive portion 12-2 are formed in this order on the right side. As viewed in the up-down direction in FIG. 8, the insulation film 58 extends from the first electrode 7 formed in the insulation layer 10 to the charge accumulation unit 41 formed in the semiconductor substrate 30.

In the case of the solid-state imaging device 800, after formation up to Q8 in FIG. 8 is completed, i.e., after the semiconductor substrate 30, the first photoelectric conversion unit 800-1, and the insulation layer 10 are formed, the connection hole 1214-8 is so formed as to penetrate the inside of the solid-state imaging device 800 from the position of Q8 to the position of the charge accumulation unit 41 as a height level (up-down direction in FIG. 8). Thereafter, the conductive portion 12-2 and the insulation film 58 are embedded in the connection hole 1214-87.

In a case where the signal charge to be read is an electron, the insulation film 58 is an insulation film having negative fixed charge. In a case where the signal charge to be read is a hole, the insulation film 58 is an insulation film having positive fixed charge. In the presence of the insulation film 58 in the solid-state imaging device 800, signal charge photoelectrically converted by the photoelectric conversion film 5 is not captured by the conductive portion 12-2 (through electrode), but is accumulated in the transfer layer 6 above the accumulation electrode 1-2.

In a case where the insulation film 58 is an insulation film having negative fixed charge, the insulation film 58 may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 58 may contain an insulation material such as a silicon oxide film in addition to the above material, or may additionally include an insulation material such as a silicon oxide film as a film (layer) other than the film (layer) including any of the above material.

In a case where the insulation film 58 is an insulation film having positive fixed charge, the insulation film 58 may contain at least one type of material selected from a group including silicon oxynitride and silicon nitride (SiN), for example. Moreover, the insulation film 58 may contain an insulation material such as a silicon oxide film in addition to the above material, or may additionally include an insulation material such as a silicon oxide film as a film (layer) other than the film (layer) including any of the above material.

Figure 9:
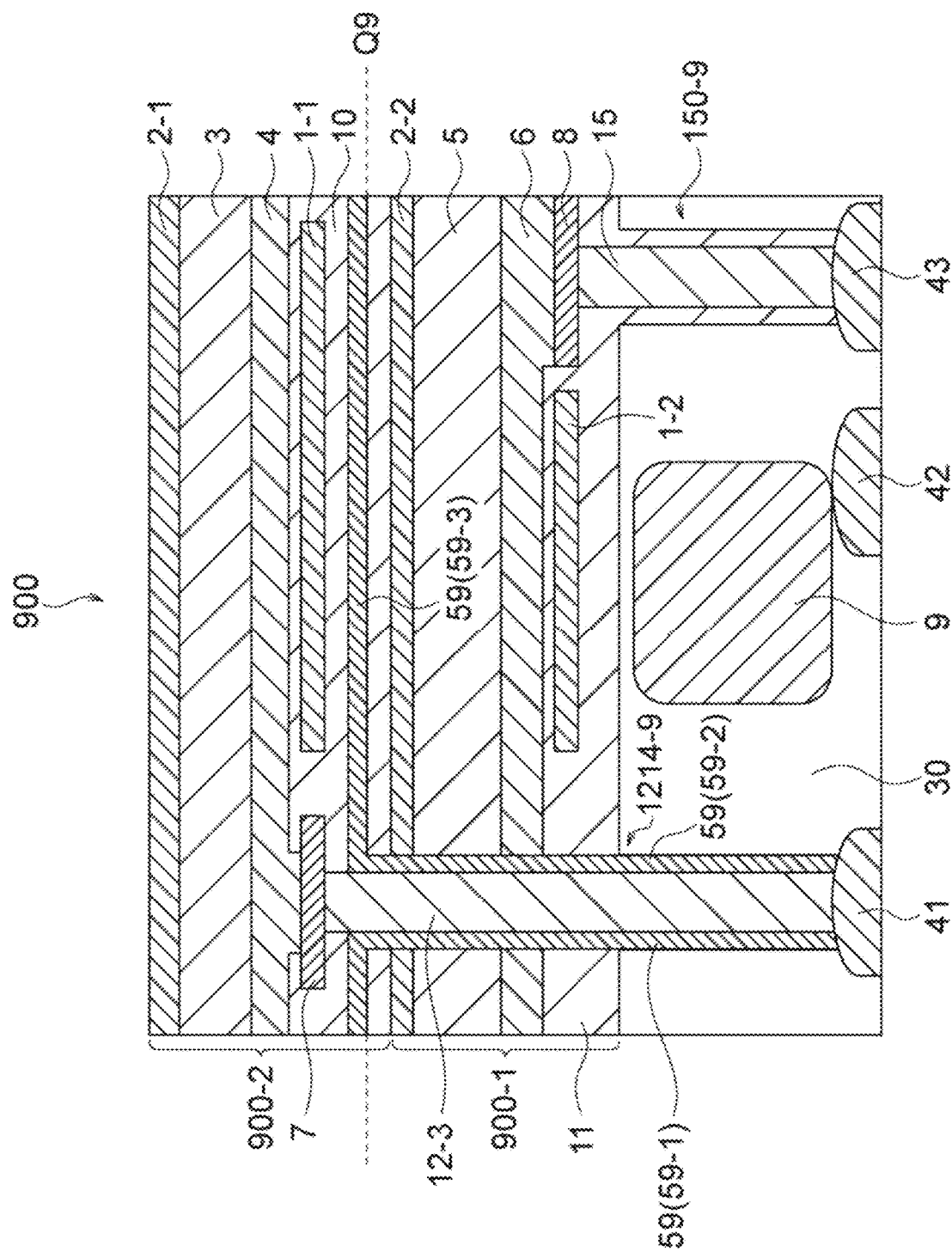
FIG. 9 is a diagram depicting a configuration example of a solid-state imaging device according to the second embodiment to which the present technology is applied.

Description with reference to FIG. 9 will now be presented. FIG. 9 is a cross-sectional diagram depicting a configuration example of a solid-state imaging device (solid-state imaging device 900) according to the second embodiment of the present technology.

The solid-state imaging device 900 includes the semiconductor substrate 30, a first photoelectric conversion unit 900-1 that is provided above the semiconductor substrate 30 (on the light entrance side and the upper side in FIG. 9) and that converts light into charge, and a second photoelectric conversion unit 900-2 that is provided above the first photoelectric conversion unit 900-1 (on the light entrance side and the upper side in FIG. 9) and that converts light into charge.

The first photoelectric conversion unit 900-1 includes the first electrode 8 (corresponding to a reading electrode, and a lower electrode in FIG. 9), the second electrode 2-2 (corresponding to an upper electrode in FIG. 9), and the photoelectric conversion film 5 provided between the first electrode (reading electrode) 8 and the second electrode 2-2.

The second photoelectric conversion unit 900-2 includes the first electrode 7 (corresponding to a reading electrode, and a lower electrode in FIG. 9), the second electrode 2-1 (corresponding to an upper electrode in FIG. 9), and the photoelectric conversion film 3 provided between the first electrode (reading electrode) 7 and the second electrode 2-1.

In the first photoelectric conversion unit 900-1, the transfer layer 6 is provided between the first electrode 8 and the photoelectric conversion film 5, and the charge accumulation electrode 1-2 is disposed away from the first electrode 8 and located in the insulation layer 11 in such a position as to face the photoelectric conversion film 5 (transfer layer 6) via the insulation layer 11 below the transfer layer 6. Meanwhile, in the second photoelectric conversion unit 900-2, the transfer layer 4 is provided between the first electrode 7 and the photoelectric conversion film 3, and the charge accumulation electrode 1-1 is disposed away from the first electrode 7 and located in the insulation layer 10 in such a position as to face the photoelectric conversion film 3 (transfer layer 4) via the insulation layer 10 below the transfer layer 4.

The first electrode 7 of the second photoelectric conversion unit 900-2 and the charge accumulation unit 41 formed in the semiconductor substrate 30 are electrically connected to each other via a conductive portion (through electrode) 12-3 penetrating the first photoelectric conversion unit 900-1 and the semiconductor substrate 30. Specifically, the solid-state imaging device 900 has a connection hole 1214-9 penetrating the insulation layer 10, the first photoelectric conversion unit 900-1, and the semiconductor substrate 30, to electrically connect the first electrode 7 of the second photoelectric conversion unit 900-2 and the charge accumulation unit 41 formed in the semiconductor substrate 30. The conductive portion (through electrode) 12-3 is formed in the connection hole 1214-9. The first electrode 7 is connected to the charge accumulation unit 41 via the conductive portion (through electrode) 12-3. The photodiode (PD) 9 formed in the semiconductor substrate 30 is connected to the charge accumulation unit 42. Moreover, a connection hole 150-9 penetrating the insulation layer 11 and the semiconductor substrate 30 is formed to electrically connect the first electrode 8 of the first photoelectric conversion unit 900-1 and the charge accumulation unit 43 formed in the semiconductor substrate 30. Specifically, the first electrode 8 is connected to the charge accumulation unit 43 via the conductive portion (through electrode) 15 formed in the connection hole 150-9.

An insulation film 59 having fixed charge of a type identical to a type of charge accumulated in the charge accumulation unit 41 is formed in the connection hole 1214-9, between the conductive portion 12-3 (through electrode) and the insulation layer 10, the first photoelectric conversion unit 900-1, and the semiconductor substrate 30 such that the insulation film 59 covers an outer circumference of the conductive portion 12-3 (through electrode). Specifically, with respect to the connection hole 1214-9 in FIG. 9 as a center reference in the left-right direction in this figure, the insulation layer 10, the first photoelectric conversion unit 900-1, the semiconductor substrate 30, an insulation film 59-1 (59), and the conductive portion 12-3 are formed in this order on the left side, while the insulation layer 10, the insulation layer 10, the first photoelectric conversion unit 900-1, the semiconductor substrate 30, an insulation film 59-2 (59), and the conductive portion 12-3 are formed in this order on the right side. As viewed in the up-down direction in FIG. 9, the insulation film 59 extends from an insulation film 59-3 (59) that is formed in the insulation layer 10 and that has a solid shape (flat shape) to the charge accumulation unit 41 formed in the semiconductor substrate 30.

In the case of the solid-state imaging device 900, after formation up to Q9 in FIG. 9 is completed, i.e., after the semiconductor substrate 30, the first photoelectric conversion unit 900-1, and the insulation layer 10 are formed, the connection hole 1214-9 is so formed as to penetrate the inside of the solid-state imaging device 900 from the position of Q9 to the position of the charge accumulation unit 41 as a height level (up-down direction in FIG. 9). Thereafter, the insulation film 59 is embedded in the connection hole 1214-9 by the ALD method, for example, and the insulation film 59-3 (59) is formed in a solid shape (flat shape) on the insulation layer 10. Note that the insulation film 59-3 (59) may be removed by etching or other methods after being formed.

In a case where the signal charge to be read is an electron, the insulation film 59 is an insulation film having negative fixed charge. In a case where the signal charge to be read is a hole, the insulation film 59 is an insulation film having positive fixed charge. In the presence of the insulation film 59 in the solid-state imaging device 900, signal charge photoelectrically converted by the photoelectric conversion film 5 is not captured by the conductive portion 12-3 (through electrode), but is accumulated in the transfer layer 6 above the accumulation electrode 1-2.

In a case where the insulation film 59 is an insulation film having negative fixed charge, the insulation film 59 may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 59 may contain an insulation material such as a silicon oxide film in addition to the above material, or may additionally include an insulation material such as a silicon oxide film as a film (layer) other than the film (layer) including any of the above material.

In a case where the insulation film 59 is an insulation film having positive fixed charge, the insulation film 59 may contain at least one type of material selected from a group including silicon oxynitride and silicon nitride (SiN), for example. Moreover, the insulation film 59 may contain an insulation material such as a silicon oxide film in addition to the above material, or may additionally include an insulation material such as a silicon oxide film as a film (layer) other than the film (layer) including any of the above material.

Figure 10:
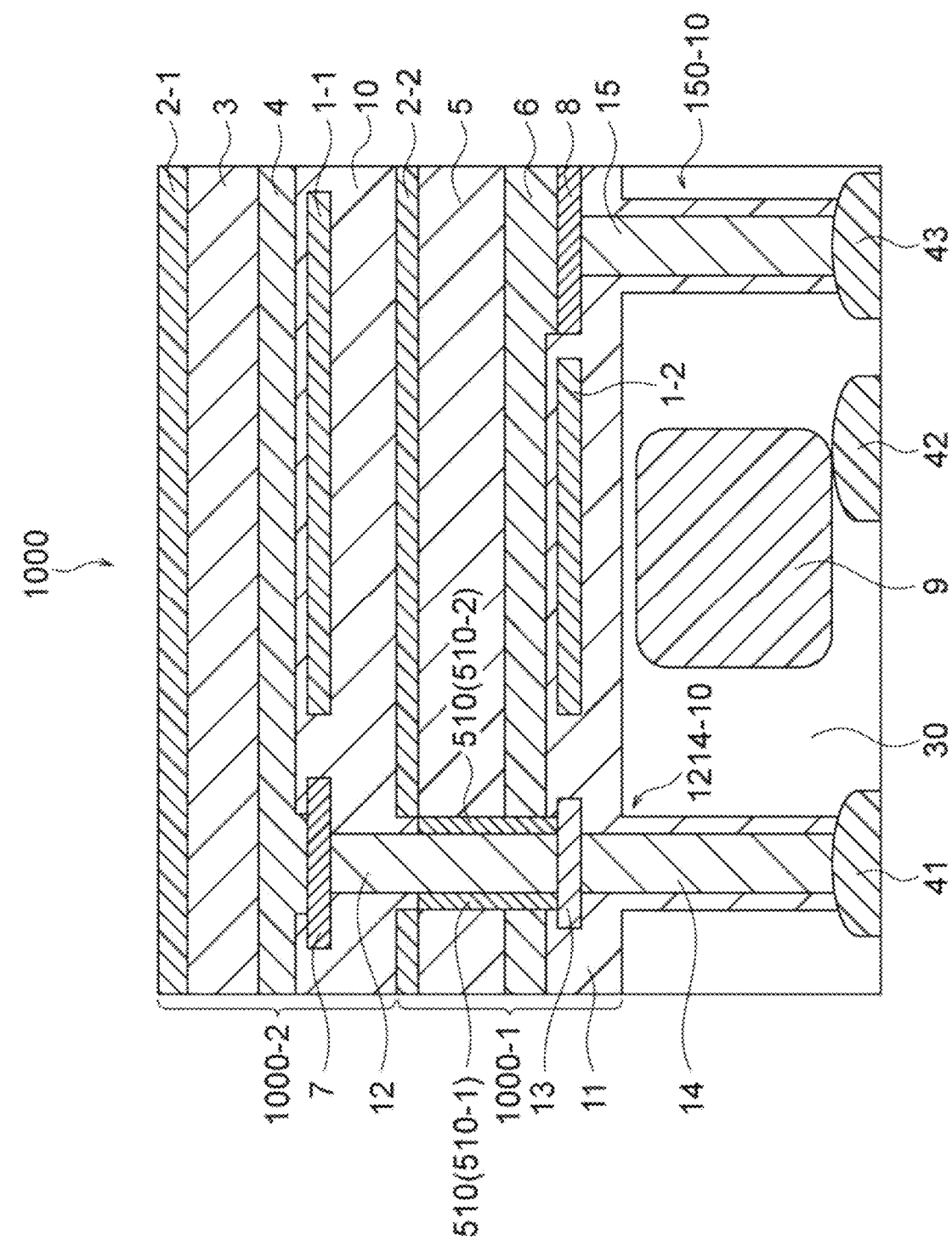
FIG. 10 is a diagram depicting a configuration example of a solid-state imaging device according to the second embodiment to which the present technology is applied.

Description with reference to FIG. 10 will finally be presented. FIG. 10 is a cross-sectional diagram depicting a configuration example of a solid-state imaging device (solid-state imaging device 1000) according to the second embodiment of the present technology.

The solid-state imaging device 1000 includes the semiconductor substrate 30, a first photoelectric conversion unit 1000-1 that is provided above the semiconductor substrate 30 (on the light entrance side and the upper side in FIG. 10) and that converts light into charge, and a second photoelectric conversion unit 1000-2 that is provided above the first photoelectric conversion unit 1000-1 (on the light entrance side and the upper side in FIG. 10) and that converts light into charge.

The first photoelectric conversion unit 1000-1 includes the first electrode 8 (corresponding to a reading electrode, and a lower electrode in FIG. 10), the second electrode 2-2 (corresponding to an upper electrode in FIG. 10), and the photoelectric conversion film 5 provided between the first electrode (reading electrode) 8 and the second electrode 2-2.

The second photoelectric conversion unit 1000-2 includes the first electrode 7 (corresponding to a reading electrode, and a lower electrode in FIG. 10), the second electrode 2-1 (corresponding to an upper electrode in FIG. 10), and the photoelectric conversion film 3 provided between the first electrode (reading electrode) 7 and the second electrode 2-1.

In the first photoelectric conversion unit 1000-1, the transfer layer 6 is provided between the first electrode 8 and the photoelectric conversion film 5, and the charge accumulation electrode 1-2 is disposed away from the first electrode 8 and located in the insulation layer 11 in such a position as to face the photoelectric conversion film 5 (transfer layer 6) via the insulation layer 11 below the transfer layer 6. Meanwhile, in the second photoelectric conversion unit 1000-2, the transfer layer 4 is provided between the first electrode 7 and the photoelectric conversion film 3, and the charge accumulation electrode 1-1 is disposed away from the first electrode 7 and located in the insulation layer 10 in such a position as to face the photoelectric conversion film 3 (transfer layer 4) via the insulation layer 10 below the transfer layer 4.

The first electrode 7 of the second photoelectric conversion unit 1000-2 and the charge accumulation unit 41 formed in the semiconductor substrate 30 are electrically connected to each other via the conductive portion (through electrode) 12 penetrating the first photoelectric conversion unit 1000-1. Specifically, the solid-state imaging device 1000 has a connection hole 1214-10 penetrating the insulation layer 10, the first photoelectric conversion unit 1000-1, and the semiconductor substrate 30 to electrically connect the first electrode 7 of the second photoelectric conversion unit 1000-2 and the charge accumulation unit 41 formed in the semiconductor substrate 30. The conductive portion (through electrode) 12 and the conductive portion (through electrode) 14 are formed in the connection hole 1214-10. The conductive portion (through electrode) 12 connected to the first electrode 7 and the conductive portion (through electrode) 14 connected to the charge accumulation unit 41 are connected to each other via the via 13. The photodiode (PD) 9 formed in the semiconductor substrate 30 is connected to the charge accumulation unit 42. Moreover, a connection hole 150-10 penetrating the insulation layer 11 and the semiconductor substrate 30 is formed to electrically connect the first electrode 8 of the first photoelectric conversion unit 1000-1 and the charge accumulation unit 43 formed in the semiconductor substrate 30. Specifically, the first electrode 8 is connected to the charge accumulation unit 43 via the conductive portion (through electrode) 15 formed in the connection hole 150-10.

An insulation film 510 having fixed charge of a type identical to a type of charge accumulated in the charge accumulation unit 41 is formed in the connection hole 1214-10, between the conductive portion 12 (through electrode) and the photoelectric conversion film 5, the transfer layer 6 below the photoelectric conversion film 5 (lower side in FIG. 10), and the insulation layer 11 below the transfer layer 6 such that the insulation film 510 covers the outer circumference of the conductive portion 12 (through electrode). Specifically, with respect to the connection hole 1214-10 in FIG. 10 as a center reference in the left-right direction in this figure, the photoelectric conversion film 5, the transfer layer 6, the insulation layer 11, an insulation film 510-1 (510), and the conductive portion 12 are formed in this order on the left side, while the photoelectric conversion film 5, the transfer layer 6, the insulation layer 11, an insulation film 510-2 (510), and the conductive portion 12 are formed in this order on the right side. As viewed in the up-down direction in FIG. 10, the insulation film 510 extends from an upper portion of the photoelectric conversion film 5 (upper side in FIG. 10) to the via 13 formed in the insulation layer 11.

In a case where the signal charge to be read is an electron, the insulation film 510 is an insulation film having negative fixed charge. In a case where the signal charge to be read is a hole, the insulation film 510 is an insulation film having positive fixed charge. In the presence of the insulation film 510 in the solid-state imaging device 1000, signal charge photoelectrically converted by the photoelectric conversion film 5 is not captured by the conductive portion 12 (through electrode), but is accumulated in the transfer layer 6 above the accumulation electrode 1-2.

In a case where the insulation film 510 is an insulation film having negative fixed charge, the insulation film 510 may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 510 may contain an insulation material such as a silicon oxide film in addition to the above material, or may additionally include an insulation material such as a silicon oxide film as a film (layer) other than the film (layer) including any of the above material.

In a case where the insulation film 510 is an insulation film having positive fixed charge, the insulation film 510 may contain at least one type of material selected from a group including silicon oxynitride and silicon nitride (SiN), for example. Moreover, the insulation film 510 may contain an insulation material such as a silicon oxide film in addition to the above material, or may additionally include an insulation material such as a silicon oxide film as a film (layer) other than the film (layer) including any of the above material.

The above-described details associated with the solid-state imaging device of the second embodiment according to the present technology (example 2 of the solid-state imaging device) are applicable to the solid-state imaging device of the first embodiment according to the present technology described above and to the third to sixth embodiments according to the present technology described below as long as no technical inconsistency is produced.

4. Third Embodiment (Example 3 of Solid-State Imaging Device)

A solid-state imaging device according to the third embodiment of the present technology (example 3 of the solid-state imaging device) will be described with reference to FIGS. 11, 12A, and 12B.

Figure 11:
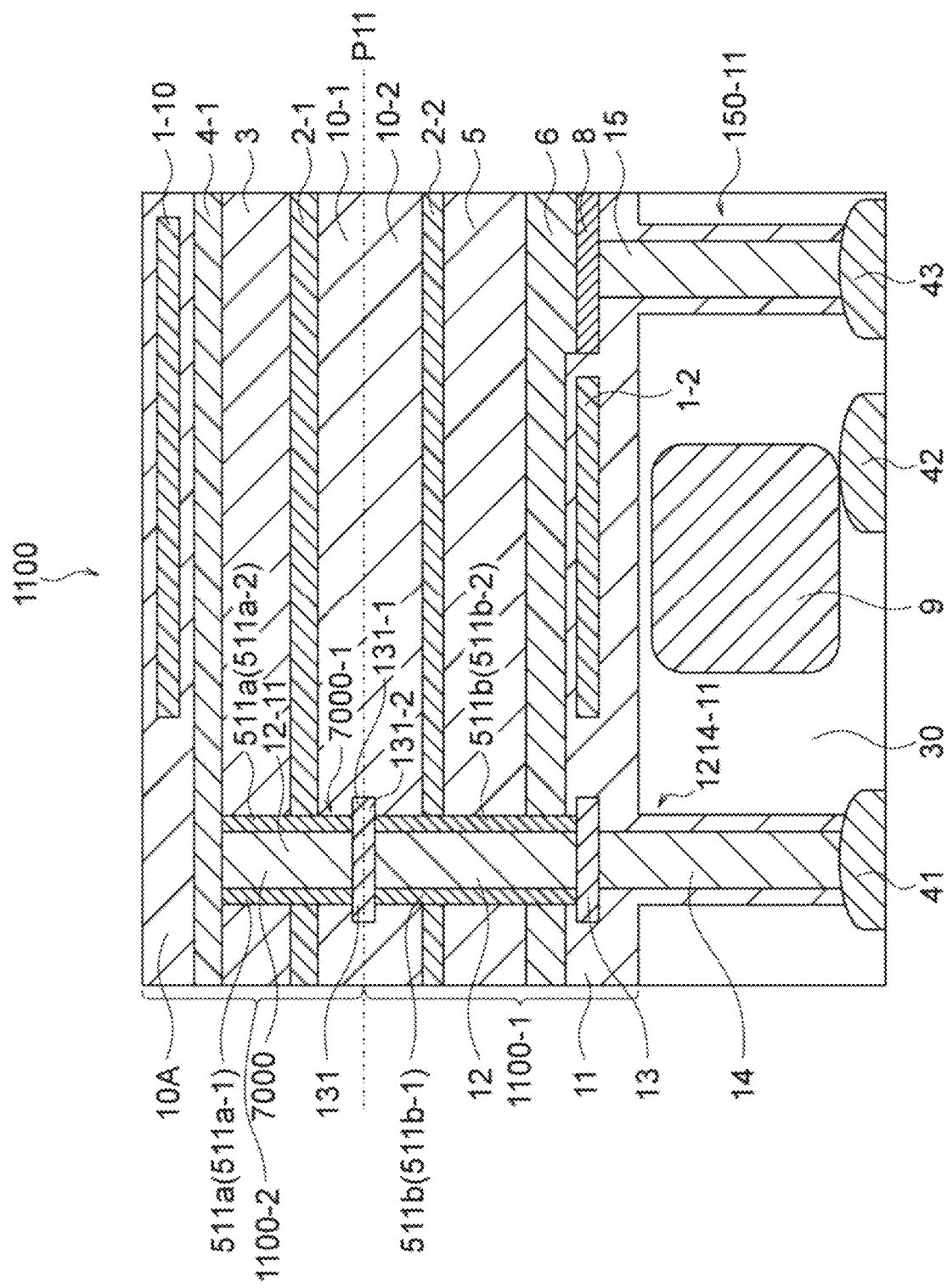
FIG. 11 is a diagram depicting a configuration example of a solid-state imaging device according to a third embodiment to which the present technology is applied.

Description with reference to FIG. 11 will first be presented. FIG. 11 is a cross-sectional diagram depicting a configuration example of a solid-state imaging device (solid-state imaging device 1100) according to the third embodiment of the present technology.

The solid-state imaging device 1100 includes the semiconductor substrate 30, a first photoelectric conversion unit 1100-1 that is provided above the semiconductor substrate 30 (on the light entrance side and the upper side in FIG. 11) and that converts light into charge, and a second photoelectric conversion unit 1100-2 that is provided above the first photoelectric conversion unit 1100-1 (on the light entrance side and the upper side in FIG. 11) and that converts light into charge.

The first photoelectric conversion unit 1100-1 includes the first electrode 8 (corresponding to a reading electrode, and a lower electrode in FIG. 11), the second electrode 2-2 (corresponding to an upper electrode in FIG. 11), and the photoelectric conversion film 5 provided between the first electrode (reading electrode) 8 and the second electrode 2-2. In addition, in the first photoelectric conversion unit 1100-1, the transfer layer 6 is provided between the first electrode 8 and the photoelectric conversion film 5, and the charge accumulation electrode 1-2 is disposed away from the first electrode 8 and located in the insulation layer 11 in such a position as to face the photoelectric conversion film 5 (transfer layer 6) via the insulation layer 11 below the transfer layer 6.

The second photoelectric conversion unit 1100-2 includes a first electrode 7000, the second electrode 2-1, a transfer layer 4-1, and the photoelectric conversion film 3 disposed between the second electrode 2-1 and the transfer layer 4-1, and further includes a charge accumulation electrode 1-10 disposed away from the first electrode 7000 and located in an insulation layer 10A in such a position as to face the transfer layer 4-1 via the insulation layer 10A above the transfer layer 4-1.

The first electrode 7000 penetrates the photoelectric conversion film 3 and the second electrode 2-1. The first electrode 7000 is electrically connected to the charge accumulation unit 41 formed in the semiconductor substrate 30. Specifically, the solid-state imaging device 1100 has a connection hole 7000-1 penetrating the photoelectric conversion film 3, the second electrode 2-1, and the insulation layer 10-1 included in the second photoelectric conversion unit 1100-2, and a connection hole 1214-11 penetrating the first photoelectric conversion unit 1100-1 (note that the first photoelectric conversion unit 1100-1 includes an insulation layer 10-2) and the semiconductor substrate 30, to electrically connect the first electrode 7000 of the second photoelectric conversion unit 1100-2 and the charge accumulation unit 41 formed in the semiconductor substrate 30. A conductive portion (through electrode) 12-11 constituting the first electrode 7000 is formed in the connection hole 7000-1. The conductive portion (through electrode) 12 and the conductive portion (through electrode) 14 are formed in the connection hole 1214-11. Moreover, the first electrode 7000 (conductive portion 12-11) and the conductive portion (through electrode) 12 are connected to each other via a via 14 located at a boundary portion (P11) between the insulation layer 10-1 and the insulation layer 10-2. The conductive portion (through electrode) 12 and the conductive portion (through electrode) 14 connected to the charge accumulation unit 41 are connected to each other via the via 13 formed in the insulation layer 11. The photodiode (PD) 9 formed in the semiconductor substrate 30 is connected to the charge accumulation unit 42. Moreover, a connection hole 150-11 penetrating the insulation layer 11 and the semiconductor substrate 30 is formed to electrically connect the first electrode 8 of the first photoelectric conversion unit 1000-1 and the charge accumulation unit 43 formed in the semiconductor substrate 30. Specifically, the first electrode 8 is connected to the charge accumulation unit 43 via the conductive portion (through electrode) 15 formed in the connection hole 150-11.

An insulation film 511*a* having fixed charge of a type identical to a type of charge accumulated in the charge accumulation unit 41 is formed in the connection hole 7000-1, between the conductive portion 12-11 (through electrode) and the photoelectric conversion film 3, the second electrode 2-1 below the photoelectric conversion film 3 (lower side in FIG. 11), and the insulation layer 10-1 below the second electrode 2-1 such that the insulation film 511*a* covers an outer circumference of the conductive portion 12-11 (through electrode) constituting the first electrode 7000. Specifically, with respect to the connection hole 7000-1 in FIG. 11 as a center reference in the left-right direction in this figure, the photoelectric conversion film 3, the second electrode 2-1, the insulation layer 10-1, an insulation film 511*a*-1 (511*a*), and the conductive portion 12-11 are formed in this order on the left side, while the photoelectric conversion film 3, the second electrode 2-1, the insulation layer 10-1, an insulation film 511*a*-2 (511*a*), and the conductive portion 12-11 are formed in this order on the right side. As viewed in the up-down direction in FIG. 11, the insulation film 511*a* extends from an upper portion of the photoelectric conversion film 3 (upper side in FIG. 11) to the via 14 formed in the insulation layer 10-1.

An insulation film 511*b* having fixed charge of a type identical to a type of charge accumulated in the charge accumulation unit 41 is formed in the connection hole 1214-11, between the conductive portion 12 (through electrode) and the first photoelectric conversion unit 1100-1 such that the insulation film 511*b* covers the outer circumference of the conductive portion 12 (through electrode). Specifically, with respect to the connection hole 1214-11 in FIG. 11 as a center reference in the left-right direction in this figure, the first photoelectric conversion unit 1100-1, an insulation film 511*b*-1 (511*b*), and the conductive portion 12 are formed in this order on the left side, while the first photoelectric conversion unit 1100-1, an insulation film 511*b*-2 (511), and the conductive portion 12 are formed in this order on the right side. As viewed in the up-down direction in FIG. 11, the insulation film 511*b* extends from the via 14 formed in the insulation layer 10-2 to the via 13 formed in the insulation layer 11.

In a case where the signal charge to be read is an electron, the insulation film 511*a* is an insulation film having negative fixed charge. In a case where the signal charge to be read is a hole, the insulation film 511*a* is an insulation film having positive fixed charge. In the presence of the insulation film 511*a* in the solid-state imaging device 1100, signal charge photoelectrically converted by the photoelectric conversion film 3 is not captured by the conductive portion 12-11 (through electrode), but is accumulated in the transfer layer 4-1 below the accumulation electrode 1-10.

In a case where the insulation film 511*a* is an insulation film having negative fixed charge, the insulation film 511*a* may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 511*a* may contain an insulation material such as a silicon oxide film in addition to the above material, or may additionally include an insulation material such as a silicon oxide film as a film (layer) other than the film (layer) including any of the above material.

In a case where the insulation film 511*a* is an insulation film having positive fixed charge, the insulation film 511*a* may contain at least one type of material selected from a group including silicon oxynitride and silicon nitride (SiN), for example. Moreover, the insulation film 511*a* may contain an insulation material such as a silicon oxide film in addition to the above material, or may additionally include an insulation material such as a silicon oxide film as a film (layer) other than the film (layer) including any of the above material.

In a case where the signal charge to be read is an electron, the insulation film 511*b* is an insulation film having negative fixed charge. In a case where the signal charge to be read is a hole, the insulation film 511*b* is an insulation film having positive fixed charge. In the presence of the insulation film 511*b* in the solid-state imaging device 1100, signal charge photoelectrically converted by the photoelectric conversion film 5 is not captured by the conductive portion 12 (through electrode), but is accumulated on the transfer layer 6 above the accumulation electrode 1-2.

In a case where the insulation film 511*b* is an insulation film having negative fixed charge, the insulation film 511*b* may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 511b may contain an insulation material such as a silicon oxide film in addition to the above material, or may additionally include an insulation material such as a silicon oxide film as a film (layer) other than the film (layer) including any of the above material.

In a case where the insulation film 511b is an insulation film having positive fixed charge, the insulation film 511b may contain at least one type of material selected from a group including silicon oxynitride and silicon nitride (SiN), for example. Moreover, the insulation film 511b may contain an insulation material such as a silicon oxide film in addition to the above material, or may additionally include an insulation material such as a silicon oxide film as a film (layer) other than the film (layer) including any of the above material.

Figure 12:
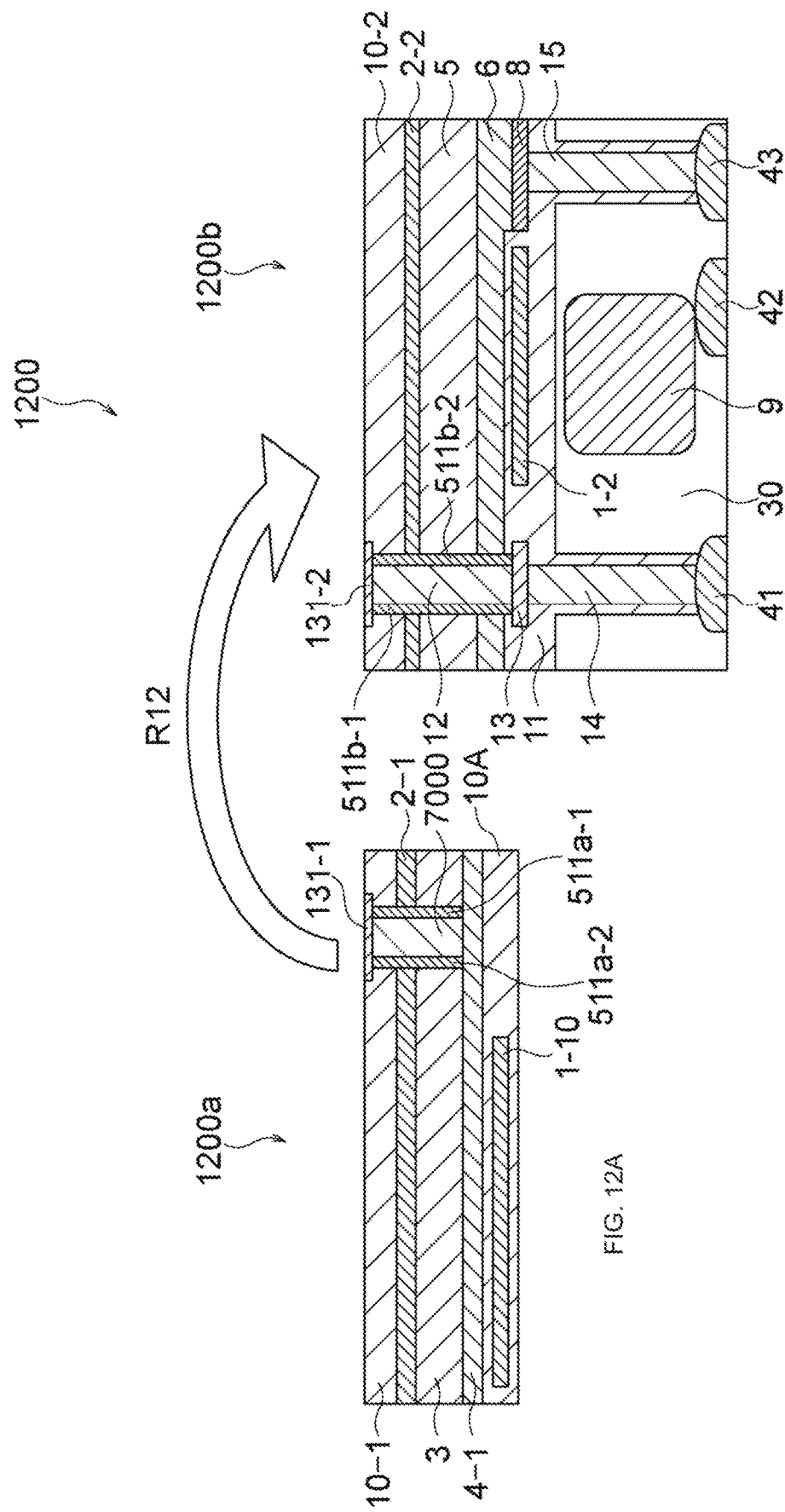
FIGS. 12A and 12B depict diagrams for explaining a manufacturing method of a solid-state imaging device according to the third embodiment to which the present technology is applied.

FIGS. 12A and 12B depict diagrams for explaining a manufacturing method of a solid-state imaging device 1200 of the third embodiment according to the present technology.

A device 1200a depicted in FIG. 12A above a line P11 depicted in FIG. 11), and constitutes a semifinished product of the solid-state imaging device 1200 in a wafer state, for example.

A device 1200b depicted in FIG. 12B includes the first photoelectric conversion unit 1100-1 and the semiconductor substrate 30 (a part below the line P11 depicted in FIG. 11), and constitutes a semifinished product of the solid-state imaging device 1200 in a wafer state, for example.

As indicated by an arrow R12 in FIGS. 12A and 12B, the solid-state imaging device 1200 is manufactured by inverting the device 1200a, and then affixing the device 1200a to the device 1200b. This process has such an advantage that a high-temperature heating process is applicable during formation of a transfer layer. In general, a photoelectric conversion film is more easily affected by heat than a transfer layer. If the photoelectric conversion film and the transfer layer are sequentially formed from the lower side, it is difficult to apply high-temperature heat to the transfer layer 4 of the second photoelectric conversion unit (upper layer). When this situation is caused, characteristics may deteriorate. For avoiding such a problem, the photoelectric conversion film and the transfer layer are separately laminated, and then affixed to each other. In this case, the first electrode 7000 penetrates the photoelectric conversion film 3 of the second photoelectric conversion unit (upper layer) as well. Accordingly, the insulation film 511a having fixed charge is provided.

The above-described details associated with the solid-state imaging device of the third embodiment according to the present technology (example 3 of the solid-state imaging device) are applicable to the solid-state imaging devices of the first and second embodiments according to the present technology described above and to the solid-state imaging devices of the fourth to sixth embodiments according to the present technology described below as long as no technical inconsistency is produced.

5. Fourth Embodiment (Example 4 of Solid-State Imaging Device)

A solid-state imaging device according to the fourth embodiment of the present technology (example 4 of the solid-state imaging device) will be described with reference to FIGS. 13 and 14.

Figure 13:
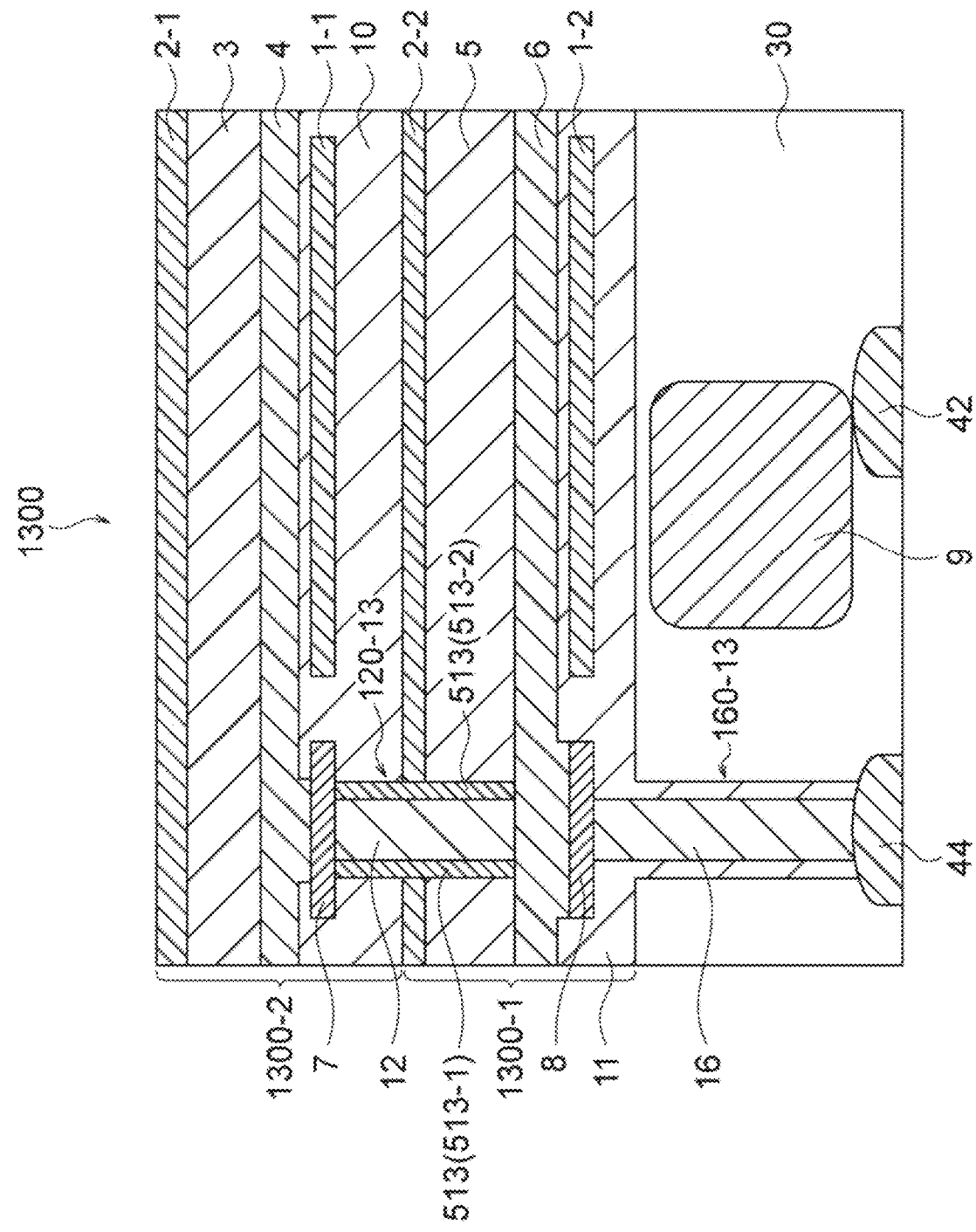
FIG. 13 is a diagram depicting a configuration example of a solid-state imaging device according to a fourth embodiment to which the present technology is applied.

Description with reference to FIG. 13 will first be presented. FIG. 13 is a cross-sectional diagram depicting a configuration example of a solid-state imaging device (solid-state imaging device 1300) according to the fourth embodiment of the present technology.

The solid-state imaging device 1300 includes the semiconductor substrate 30, a first photoelectric conversion unit 1300-1 that is provided above the semiconductor substrate 30 (on the light entrance side and the upper side in FIG. 13) and that converts light into charge, and a second photoelectric conversion unit 1300-2 that is provided above the first photoelectric conversion unit 1300-1 (on the light entrance side and the upper side in FIG. 13) and that converts light into charge.

The first photoelectric conversion unit 1300-1 includes the first electrode 8 (corresponding to a reading electrode, and a lower electrode in FIG. 13), the second electrode 2-2 (corresponding to an upper electrode in FIG. 13), and the photoelectric conversion film 5 provided between the first electrode (reading electrode) 8 and the second electrode 2-2.

The second photoelectric conversion unit 1300-2 includes the first electrode 7 (corresponding to a reading electrode, and a lower electrode in FIG. 13), the second electrode 2-1 (corresponding to an upper electrode in FIG. 13), and the photoelectric conversion film 3 provided between the first electrode (reading electrode) 7 and the second electrode 2-1.

In the first photoelectric conversion unit 1300-1, the transfer layer 6 is provided between the first electrode 8 and the photoelectric conversion film 5, and the charge accumulation electrode 1-2 is disposed away from the first electrode 8 and located in the insulation layer 11 in such a position as to face the photoelectric conversion film 5 (transfer layer 6) via the insulation layer 11 below the transfer layer 6. Meanwhile, in the second photoelectric conversion unit 1300-2, the transfer layer 4 is provided between the first electrode 7 and the photoelectric conversion film 3, and the charge accumulation electrode 1-1 is disposed away from the first electrode 7 and located in the insulation layer 10 in such a position as to face the photoelectric conversion film 3 (transfer layer 4) via the insulation layer 10 below the transfer layer 4.

The first electrode 8 of the first photoelectric conversion unit 1300-1 and the first electrode 7 of the second photoelectric conversion unit 1300-2 are electrically connected to the charge accumulation unit 44 formed in the semiconductor substrate 30, via the conductive portion 12 penetrating the second electrode 2-2, the photoelectric conversion film 5, and the insulation layer 11 of the first photoelectric conversion unit 1300-1. Specifically, the solid-state imaging device 1300 has a connection hole 120-13 penetrating the insulation layer 10 included in the second photoelectric conversion unit 1300-2 and the second electrode 2-2 and the photoelectric conversion film 5 included in the first photoelectric conversion unit 1300-1, and a connection hole 160-13 penetrating the insulation layer 11 included in the first photoelectric conversion unit 1300-1 and the semiconductor substrate 30, to electrically connect the first electrode 7 of the second photoelectric conversion unit 1300-2 and the first electrode 8 of the first photoelectric conversion unit 1300-1 with the charge accumulation unit 44 formed in the semiconductor substrate 30. The conductive portion (through electrode) 12 is formed in the connection hole 120-13. A conductive portion (through electrode) 16 is formed in the connection hole 160-13. In addition, the first electrode 7 is connected to the charge accumulation unit 44 via the conductive portion (through electrode) 12 and the conductive portion (through electrode) 16, and further through the transfer layer 6 included in the second photoelectric conversion unit 1300-1 and the first electrode 8 connected to the transfer layer 6. By providing the charge accumulation unit 44 shared by the first electrode 7 and the first electrode 8, the size of the charge accumulation electrode 1-2 can be enlarged, for example. As a result, sensitivity and a saturated charge amount can improve.

The second electrode 8 is connected to the charge accumulation unit 44 via the conductive portion (through electrode) 16. The photodiode (PD) 9 formed in the semiconductor substrate 30 is connected to the charge accumulation unit 42.

An insulation film 513 having fixed charge of a type identical to a type of charge accumulated in the charge accumulation unit 44 is formed in the connection hole 120-13, between the conductive portion 12 (through electrode) and the insulation layer 10, the second electrode 2-2 below the insulation layer 10, and the photoelectric conversion film 5 below the second electrode 2-2 such that the insulation film 513 covers the outer circumference of the conductive portion 12 (through electrode). Specifically, with respect to the connection hole 120-13 in FIG. 13 as a center reference in the left-right direction in this figure, the insulation layer 10, the second electrode 2-2 below the insulation layer 10, the photoelectric conversion film 5 below the second electrode 2-2, an insulation film 513-1 (513), and the conductive portion 12 are formed in this order on the left side, while the insulation layer 10, the second electrode 2-2 below the insulation layer 10, the photoelectric conversion film 5 below the second electrode 2-2, an insulation film 513-2 (513), and the conductive portion 12 are formed in this order on the right side. As viewed in the up-down direction in FIG. 13, the insulation film 513 extends from the first electrode 7 formed in the insulation layer 10 to an upper part of the transfer layer 6 (corresponding to the upper side in FIG. 13, and a boundary portion between the transfer layer 6 and the photoelectric conversion film 5).

In a case where the signal charge to be read is an electron, the insulation film 513 is an insulation film having negative fixed charge. In a case where the signal charge to be read is a hole, the insulation film 513 is an insulation film having positive fixed charge. In the presence of the insulation film 513 in the solid-state imaging device 1300, signal charge photoelectrically converted by the photoelectric conversion film 5 is not captured by the conductive portion 12 (through electrode), but is accumulated in the transfer layer 6 above the accumulation electrode 1-2.

In a case where the insulation film 513 is an insulation film having negative fixed charge, the insulation film 513 may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 513 may contain an insulation material such as a silicon oxide film in addition to the above material, or may additionally include an insulation material such as a silicon oxide film as a film (layer) other than the film (layer) including any of the above material.

In a case where the insulation film 513 is an insulation film having positive fixed charge, the insulation film 513 may contain at least one type of material selected from a group including silicon oxynitride and silicon nitride (SiN), for example. Moreover, the insulation film 513 may contain an insulation material such as a silicon oxide film in addition to the above material, or may additionally include an insulation material such as a silicon oxide film as a film (layer) other than the film (layer) including any of the above material.

Figure 14:
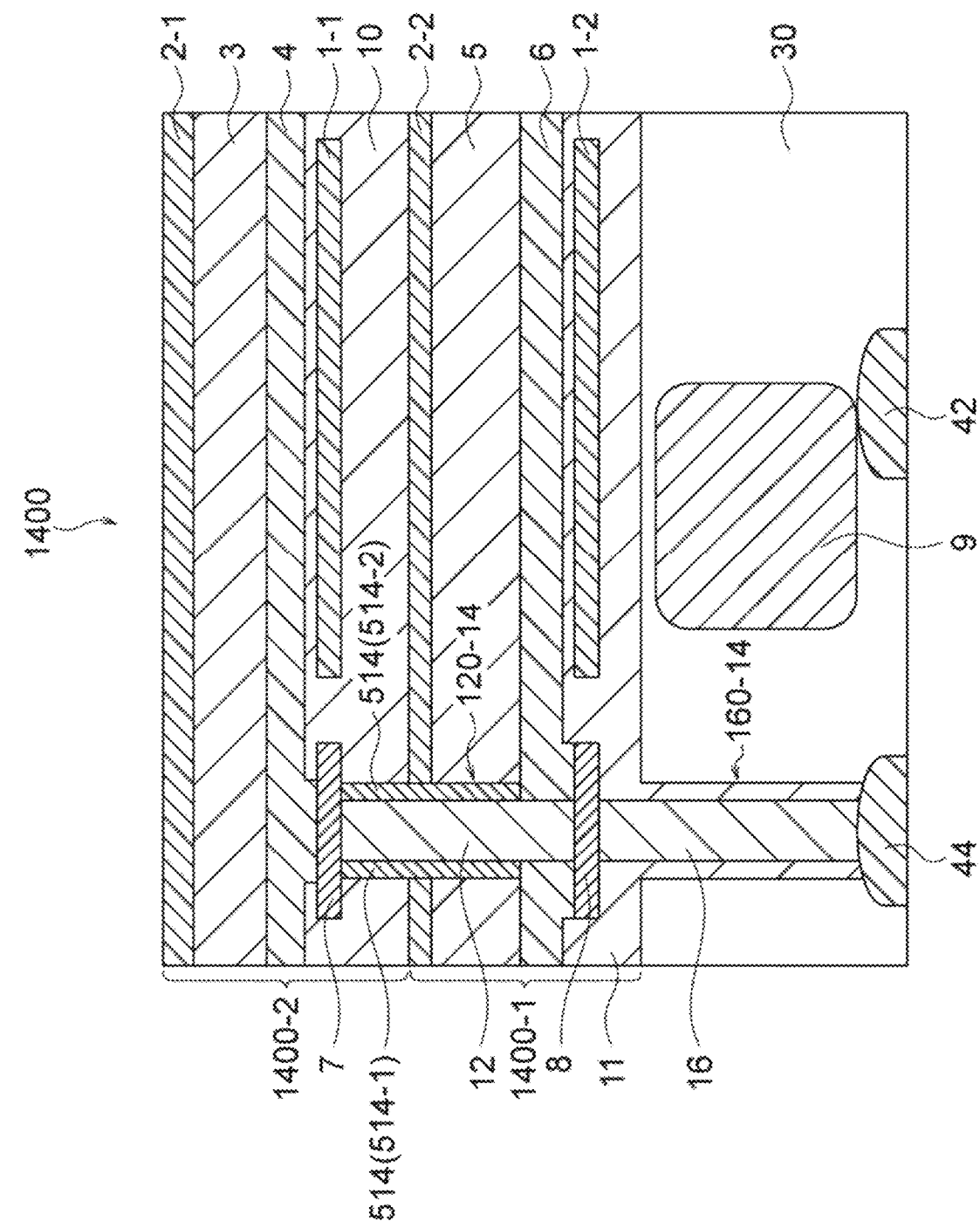
FIG. 14 is a diagram depicting a configuration example of a solid-state imaging device according to the fourth embodiment to which the present technology is applied.

Description with reference to FIG. 14 will now be presented. FIG. 14 is a cross-sectional diagram depicting a configuration example of a solid-state imaging device (solid-state imaging device 1400) according to the fourth embodiment of the present technology.

The solid-state imaging device 1400 includes the semiconductor substrate 30, a first photoelectric conversion unit 1400-1 that is provided above the semiconductor substrate 30 (on the light entrance side and the upper side in FIG. 14) and that converts light into charge, and a second photoelectric conversion unit 1400-2 that is provided above the first photoelectric conversion unit 1400-1 (on the light entrance side and the upper side in FIG. 14) and that converts light into charge.

The first photoelectric conversion unit 1400-1 includes the first electrode 8 (corresponding to a reading electrode, and a lower electrode in FIG. 14), the second electrode 2-2 (corresponding to an upper electrode in FIG. 14), and the photoelectric conversion film 5 provided between the first electrode (reading electrode) 8 and the second electrode 2-2.

The second photoelectric conversion unit 1400-2 includes the first electrode 7 (corresponding to a reading electrode, and a lower electrode in FIG. 14), the second electrode 2-1 (corresponding to an upper electrode in FIG. 14), and the photoelectric conversion film 3 provided between the first electrode (reading electrode) 7 and the second electrode 2-1.

In the first photoelectric conversion unit 1400-1, the transfer layer 6 is provided between the first electrode 8 and the photoelectric conversion film 5, and the charge accumulation electrode 1-2 is disposed away from the first electrode 8 and located in the insulation layer 11 in such a position as to face the photoelectric conversion film 5 (transfer layer 6) via the insulation layer 11 below the transfer layer 6. Meanwhile, in the second photoelectric conversion unit 1400-2, the transfer layer 4 is provided between the first electrode 7 and the photoelectric conversion film 3, and the charge accumulation electrode 1-1 is disposed away from the first electrode 7 and located in the insulation layer 10 in such a position as to face the photoelectric conversion film 3 (transfer layer 4) via the insulation layer 10 below the transfer layer 4.

The first electrode 8 of the first photoelectric conversion unit 1400-1 and the first electrode 7 of the second photoelectric conversion unit 1400-2 are electrically connected to the charge accumulation unit 44 formed in the semiconductor substrate 30, via the conductive portion 12 penetrating the first photoelectric conversion unit 1400-1. Specifically, the solid-state imaging device 1400 has a connection hole 120-14 penetrating the insulation layer 10 included in the second photoelectric conversion unit 1400-2 and the second electrode 2-2, the photoelectric conversion film 5, and the transfer layer 6 included in the first photoelectric conversion unit 1400-1, and a connection hole 160-14 penetrating the insulation layer 11 included in the first photoelectric conversion unit 1400-1 and the semiconductor substrate 30, to electrically connect the first electrode 7 of the second photoelectric conversion unit 1400-2 and the first electrode 8 of the first photoelectric conversion unit 1400-1 with the charge accumulation unit 44 formed in the semiconductor substrate 30. The conductive portion (through electrode) 12 is formed in the connection hole 120-14. The conductive portion (through electrode) 16 is formed in the connection hole 160-14. In addition, the first electrode 7 is connected to the charge accumulation unit 44 via the conductive portion (through electrode) 12 and the conductive portion (through electrode) 16, and further through the first electrode 8 connected to the transfer layer 6 included in the second photoelectric conversion unit 1300-1. By providing the charge accumulation unit 44 shared by the first electrode 7 and the first electrode 8, the size of the charge accumulation electrode 1-2 can be enlarged, for example. As a result, sensitivity and a saturated charge amount can improve. The conductive portion 12 (through electrode) is in contact with the transfer layer 6 in FIG. 13. However, it is more preferable that the conductive portion 12 (through electrode) penetrate the transfer layer 6 and come into contact with the first electrode 8 (signal reading electrode) as depicted in FIG. 14.

The second electrode 8 is connected to the charge accumulation unit 44 via the conductive portion (through electrode) 16. The photodiode (PD) 9 formed in the semiconductor substrate 30 is connected to the charge accumulation unit 42.

An insulation film 514 having fixed charge of a type identical to a type of charge accumulated in the charge accumulation unit 44 is formed in the connection hole 120-14, between the conductive portion 12 (through electrode) and the insulation layer 10, the second electrode 2-2 below the insulation layer 10, and the photoelectric conversion film 5 below the second electrode 2-2 such that the insulation film 514 covers the outer circumference of the conductive portion 12 (through electrode). Specifically, with respect to the connection hole 120-14 in FIG. 14 as a center reference in the left-right direction in this figure, the insulation layer 10, the second electrode 2-2 below the insulation layer 10, the photoelectric conversion film 5 below the second electrode 2-2, an insulation film 514-1 (514), and the conductive portion 12 are formed in this order on the left side, while the insulation layer 10, the second electrode 2-2 below the insulation layer 10, the photoelectric conversion film 5 below the second electrode 2-2, an insulation film 514-2 (514), and the conductive portion 12 are formed in this order on the right side. As viewed in the up-down direction in FIG. 14, the insulation film 514 extends from the first electrode 7 formed in the insulation layer 10 to an upper part of the transfer layer 6 (corresponding to the upper side in FIG. 14, and a boundary portion between the transfer layer 6 and the photoelectric conversion film 5).

In a case where the signal charge to be read is an electron, the insulation film 514 is an insulation film having negative fixed charge. In a case where the signal charge to be read is a hole, the insulation film 514 is an insulation film having positive fixed charge. In the presence of the insulation film 514 in the solid-state imaging device 1400, signal charge photoelectrically converted by the photoelectric conversion film 5 is not captured by the conductive portion 12 (through electrode), but is accumulated in the transfer layer 6 above the accumulation electrode 1-2.

In a case where the insulation film 514 is an insulation film having negative fixed charge, the insulation film 514 may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 514 may contain an insulation material such as a silicon oxide film in addition to the above material, or may additionally include an insulation material such as a silicon oxide film as a film (layer) other than the film (layer) including any of the above material.

In a case where the insulation film 514 is an insulation film having positive fixed charge, the insulation film 514 may contain at least one type of material selected from a group including silicon oxynitride and silicon nitride (SiN), for example. Moreover, the insulation film 514 may contain an insulation material such as a silicon oxide film in addition to the above material, or may additionally include an insulation material such as a silicon oxide film as a film (layer) other than the film (layer) including any of the above material.

The above-described details associated with the solid-state imaging device of the fourth embodiment according to the present technology (example 4 of the solid-state imaging device) are applicable to the solid-state imaging devices of the first to third embodiments according to the present technology described above and to the solid-state imaging devices of the fifth and sixth embodiments according to the present technology described below as long as no technical inconsistency is produced.

6. Fifth Embodiment (Example 5 of Solid-State Imaging Device)

A solid-state imaging device according to the fifth embodiment of the present technology (example 5 of the solid-state imaging device) will be described with reference to FIG. 15.

Figure 15:
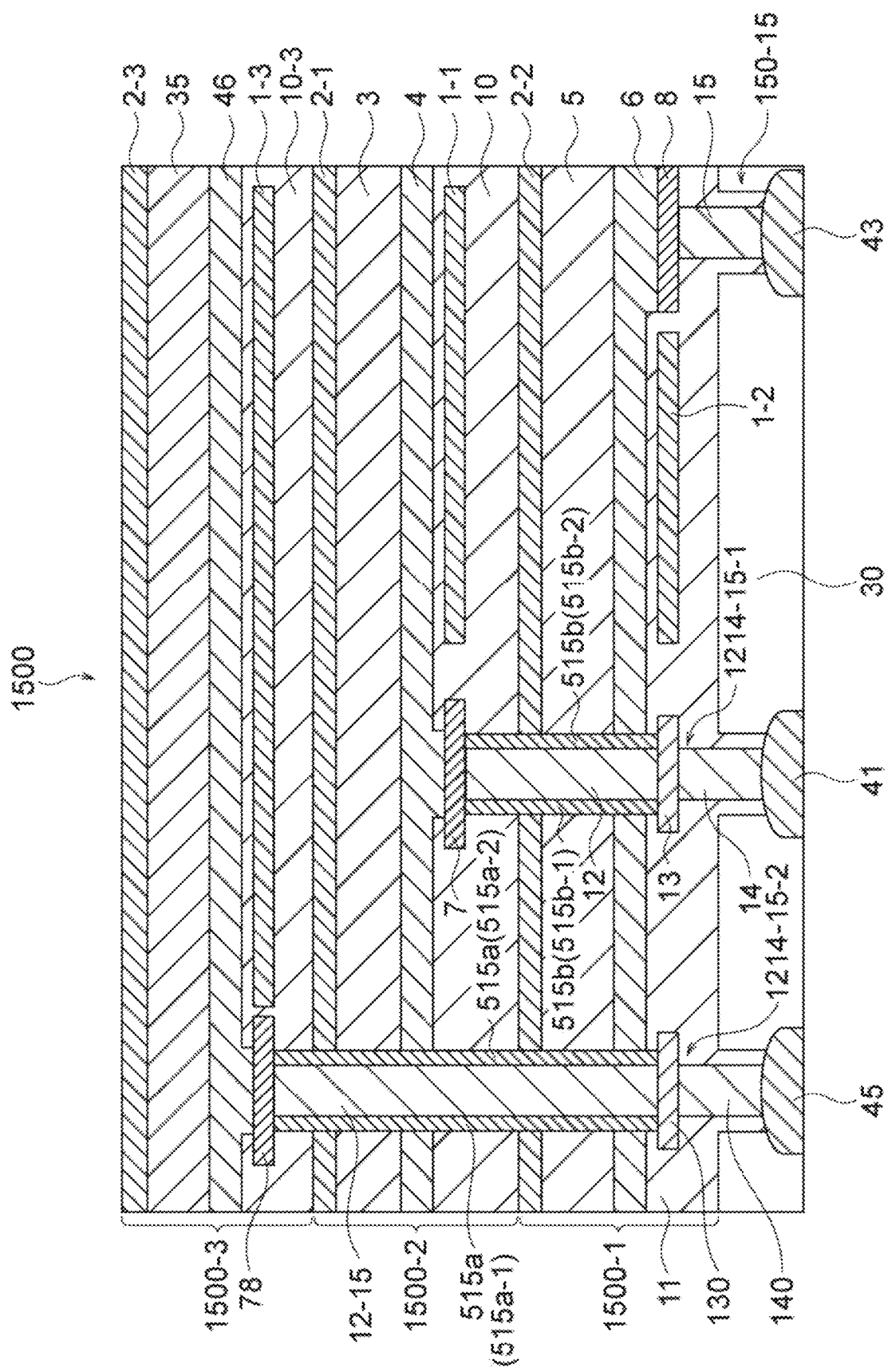
FIG. 15 is a diagram depicting a configuration example of a solid-state imaging device according to a fifth embodiment to which the present technology is applied.

Description with reference to FIG. 15 will now be presented. FIG. 15 is a cross-sectional diagram depicting a configuration example of a solid-state imaging device (solid-state imaging device 1500) according to the fifth embodiment of the present technology.

The solid-state imaging device 1500 includes the semiconductor substrate 30, a first photoelectric conversion unit 1500-1 that is provided above the semiconductor substrate 30 (on the light entrance side and the upper side in FIG. 15) and that converts light into charge, a second photoelectric conversion unit 1500-2 that is provided above the first photoelectric conversion unit 1500-1 (on the light entrance side and the upper side in FIG. 15) and that converts light into charge, and a third photoelectric conversion unit 1500-3 that is provided above the second photoelectric conversion unit 1500-2 (on the light entrance side and the upper side in FIG. 15) and that converts light into charge.

The first photoelectric conversion unit 1500-1 includes the first electrode 8 (corresponding to a reading electrode, and a lower electrode in FIG. 15), the second electrode 2-2 (corresponding to an upper electrode in FIG. 15), and the photoelectric conversion film 5 provided between the first electrode (reading electrode) 8 and the second electrode 2-2. As described above, the photoelectric conversion film 5 is a photoelectric conversion film which absorbs red light (e.g., light having a wavelength ranging from 620 to 750 nm), for example.

The second photoelectric conversion unit 1500-2 includes the first electrode 7 (corresponding to a reading electrode, and a lower electrode in FIG. 15), the second electrode 2-1 (corresponding to an upper electrode in FIG. 15), and the photoelectric conversion film 3 provided between the first electrode (reading electrode) 7 and the second electrode 2-1. As described above, the photoelectric conversion film 3 is a photoelectric conversion film which absorbs green light (e.g., light having a wavelength ranging from 495 to 570 nm), for example.

The third photoelectric conversion unit 1500-3 includes a first electrode 78 (corresponding to a reading electrode, and a lower electrode in FIG. 15), a second electrode 2-3 (corresponding to an upper electrode in FIG. 15), and a photoelectric conversion film 35 provided between the first electrode (reading electrode) 7 and the second electrode 2-3. The photoelectric conversion film 35 is a photoelectric conversion film which absorbs blue light (e.g., light having a wavelength ranging from 425 to 495 nm), for example.

In the first photoelectric conversion unit 1500-1, the transfer layer 6 is provided between the first electrode 8 and the photoelectric conversion film 5, and the charge accumulation electrode 1-2 is disposed away from the first electrode 8 and located in the insulation layer 11 in such a position as to face the photoelectric conversion film 5 (transfer layer 6) via the insulation layer 11 below the transfer layer 6. Moreover, in the second photoelectric conversion unit 1500-2, the transfer layer 4 is provided between the first electrode 7 and the photoelectric conversion film 3, and the charge accumulation electrode 1-1 is disposed away from the first electrode 7 and located in the insulation layer 10 in such a position as to face the photoelectric conversion film 3 (transfer layer 4) via the insulation layer 10 below the transfer layer 4. Further, in the second photoelectric conversion unit 1500-3, a transfer layer 46 is provided between the first electrode 78 and the photoelectric conversion film 35, and a charge accumulation electrode 1-3 is disposed away from the first electrode 78 and located in an insulation layer 10-3 in such a position as to face the photoelectric conversion film 35 (transfer layer 46) via the insulation layer 10-3 below the transfer layer 46.

The first electrode 78 of the third photoelectric conversion unit 1500-3 and a charge accumulation unit 45 formed in the semiconductor substrate 30 are electrically connected to each other via a conductive portion 12-15 penetrating the second photoelectric conversion unit 1500-2 and the first photoelectric conversion unit 1500-1. Specifically, the solid-state imaging device 1500 has a connection hole 1214-15-2 penetrating the insulation layer 10-3, the second photoelectric conversion unit 1500-2, the first photoelectric conversion unit 1500-1, and the semiconductor substrate 30, to electrically connect the first electrode 78 of the third photoelectric conversion unit 1500-3 and the charge accumulation unit 45 formed in the semiconductor substrate 30. The conductive portion (through electrode) 12-15 and a conductive portion (through electrode) 140 are formed in the connection hole 1214-15-2. The conductive portion (through electrode) 12-15 connected to the first electrode 7 and the conductive portion (through electrode) 140 connected to the charge accumulation unit 45 are connected to each other via a via 130 formed in the insulation layer 11.

The first electrode 7 of the second photoelectric conversion unit 1500-2 and the charge accumulation unit 41 formed in the semiconductor substrate 30 are electrically connected to each other via the conductive portion 12 penetrating the first photoelectric conversion unit 1500-1. Specifically, the solid-state imaging device 1500 has a connection hole 1214-15-1 penetrating the insulation layer 10, the first photoelectric conversion unit 1500-1, and the semiconductor substrate 30, to electrically connect the first electrode 7 of the second photoelectric conversion unit 1500-2 and the charge accumulation unit 41 formed in the semiconductor substrate 30. A conductive portion (through electrode) 12 and a conductive portion (through electrode) 14 are formed in the connection hole 1214-15-1. The conductive portion (through electrode) 12 connected to the first electrode 7 and the conductive portion (through electrode) 14 connected to the charge accumulation unit 41 are connected to each other via the via 13 formed in the insulation layer 11. Moreover, the solid-state imaging device 1500 has a connection hole 150-15 penetrating the insulation layer 11 and the semiconductor substrate 30, to electrically connect the first electrode 8 of the first photoelectric conversion unit 1500-1 and the charge accumulation unit 43 formed in the semiconductor substrate 30. Specifically, the first electrode 8 is connected to the charge accumulation unit 43 via the conductive portion (through electrode) 15 formed in the connection hole 150-10.

An insulation film 515*a* having fixed charge of a type identical to a type of charge accumulated in the charge accumulation unit 45 is formed in the connection hole 1214-15-2, between the conductive portion 12-15 (through electrode) and the insulation layer 10-3, the second photoelectric conversion unit 1500-2 below the insulation layer 10-3, the second electrode 2-2 below the second photoelectric conversion unit 1500-2, the photoelectric conversion film 5 below the second electrode 2-2, the transfer layer 6 below the photoelectric conversion film 5, and the insulation layer 11 below the transfer layer 6 such that the insulation film 515*a* covers an outer circumference of the conductive portion 12-15 (through electrode). Specifically, with respect to the connection hole 1214-15-2 in FIG. 15 as a center reference in the left-right direction in this figure, the insulation layer 10-3, the second photoelectric conversion unit 1500-2 below the insulation layer 10-3, the second electrode 2-2 below the second photoelectric conversion unit 1500-2, the photoelectric conversion film 5 below the second electrode 2-2, the transfer layer 6 below the photoelectric conversion film 5, the insulation layer 11 below the transfer layer 6, an insulation film 515*a*-1 (515*a*), and the conductive portion 12-15 are formed in this order on the left side, while the insulation layer 10-3, the second photoelectric conversion unit 1500-2 below the insulation layer 10-3, the second electrode 2-2 below the second photoelectric conversion unit 1500-2, the photoelectric conversion film 5 below the second electrode 2-2, the transfer layer 6 below the photoelectric conversion film 5, the insulation layer 11 below the transfer layer 6, an insulation film 515*a*-2 (515*a*), and the conductive portion 12-15 are formed in this order on the right side. As viewed in the up-down direction in FIG. 15, the insulation film 515*a* extends from the first electrode 78 formed in the insulation layer 10-3 included in the third photoelectric conversion unit 1500-3 to the via 13 formed in the insulation layer 11 included in the first photoelectric conversion unit 1500-1.

An insulation film 515*b* having fixed charge of a type identical to a type of charge accumulated in the charge accumulation unit 41 is formed in the connection hole 1214-15-1, between the conductive portion 12 (through electrode) and the insulation layer 10, the second electrode 2-2 below the insulation layer 10, the photoelectric conversion film 5 below the second electrode 2-2, the transfer layer 6 below the photoelectric conversion film 5, and the insulation layer 11 below the transfer layer 6 such that the insulation film 515*b* covers the outer circumference of the conductive portion 12 (through electrode). Specifically, with respect to the connection hole 1214-15-1 in FIG. 15 as a center reference in the left-right direction in this figure, the insulation layer 10, the second electrode 2-2 below the insulation layer 10, the photoelectric conversion film 5 below the second electrode 2-2, the transfer layer 6 below the photoelectric conversion film 5, the insulation layer 11 below the transfer layer 6, an insulation film 515*b*-1 (515*b*), and the conductive portion 12 are formed in this order on the left side, while the insulation layer 10, the second electrode 2-2 below the insulation layer 10, the photoelectric conversion film 5 below the second electrode 2-2, the transfer layer 6 below the photoelectric conversion film 5, the insulation layer 11 below the transfer layer 6, an insulation film 515*b*-2 (515*b*), and the conductive portion 12 are formed in this order on the right side. As viewed in the up-down direction in FIG. 15, the insulation film 515*b* extends from the first electrode 7 formed in the insulation layer 10 included in the second photoelectric conversion unit 1500-2 to the via 13 formed in the insulation layer 11 included in the first photoelectric conversion unit 1500-1.

In a case where the signal charge to be read is an electron, the insulation film 515*a* is an insulation film having negative fixed charge. In a case where the signal charge to be read is a hole, the insulation film 515*a* is an insulation film having positive fixed charge. In the presence of the insulation film 515*a* in the solid-state imaging device 1500, signal charge photoelectrically converted by the photoelectric conversion film 3 is not captured by the conductive portion 12-15 (through electrode), but is accumulated in the transfer layer 4 above the accumulation electrode 1-1. In addition, signal charge photoelectrically converted by the photoelectric conversion film 5 is not captured by the conductive portion 12-15 (through electrode), but is accumulated in the transfer layer 6 above the accumulation electrode 1-2.

In a case where the insulation film 515*a* is an insulation film having negative fixed charge, the insulation film 515*a* may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 515*a* may contain an insulation material such as a silicon oxide film in addition to the above material, or may additionally include an insulation material such as a silicon oxide film as a film (layer) other than the film (layer) including any of the above material.

In a case where the insulation film 515*a* is an insulation film having positive fixed charge, the insulation film 515*a* may contain at least one type of material selected from a group including silicon oxynitride and silicon nitride (SiN), for example. Moreover, the insulation film 515*a* may contain an insulation material such as a silicon oxide film in addition to the above material, or may additionally include an insulation material such as a silicon oxide film as a film (layer) other than the film (layer) including any of the above material.

In a case where the signal charge to be read is an electron, the insulation film 515*b* is an insulation film having negative fixe charge. In a case where the signal charge to be read is a hole, the insulation film 515*b* is an insulation film having positive fixed charge. In the presence of the insulation film 515*b* in the solid-state imaging device 1500, signal charge photoelectrically converted by the photoelectric conversion film 5 is not captured by the conductive portion 12 (through electrode), but is accumulated in the transfer layer 6 above the accumulation electrode 1-2.

In a case where the insulation film 515*b* is an insulation film having negative fixed charge, the insulation film 515*b* may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 515*b* may contain an insulation material such as a silicon oxide film in addition to the above material, or may additionally include an insulation material such as a silicon oxide film as a film (layer) other than the film (layer) including any of the above material.

In a case where the insulation film 515*b* is an insulation film having positive fixed charge, the insulation film 515*b* may contain at least one type of material selected from a group including silicon oxynitride and silicon nitride (SiN), for example. Moreover, the insulation film 515*b* may contain an insulation material such as a silicon oxide film in addition to the above material, or may additionally include an insulation material such as a silicon oxide film as a film (layer) other than the film (layer) including any of the above material.

The above-described details associated with the solid-state imaging device of the fifth embodiment according to the present technology (example 5 of the solid-state imaging device) are applicable to the solid-state imaging devices of the first to fourth embodiments according to the present technology described above and the solid-state imaging device of the sixth embodiment according to the present technology described below as long as no technical inconsistency is produced.

7. Sixth Embodiment (Example 6 of Solid-State Imaging Device)

A solid-state imaging device according to the sixth embodiment of the present technology (example 6 of the solid-state imaging device) will be described with reference to FIGS. 16, 17, 19A, and 19B.

Figure 16:
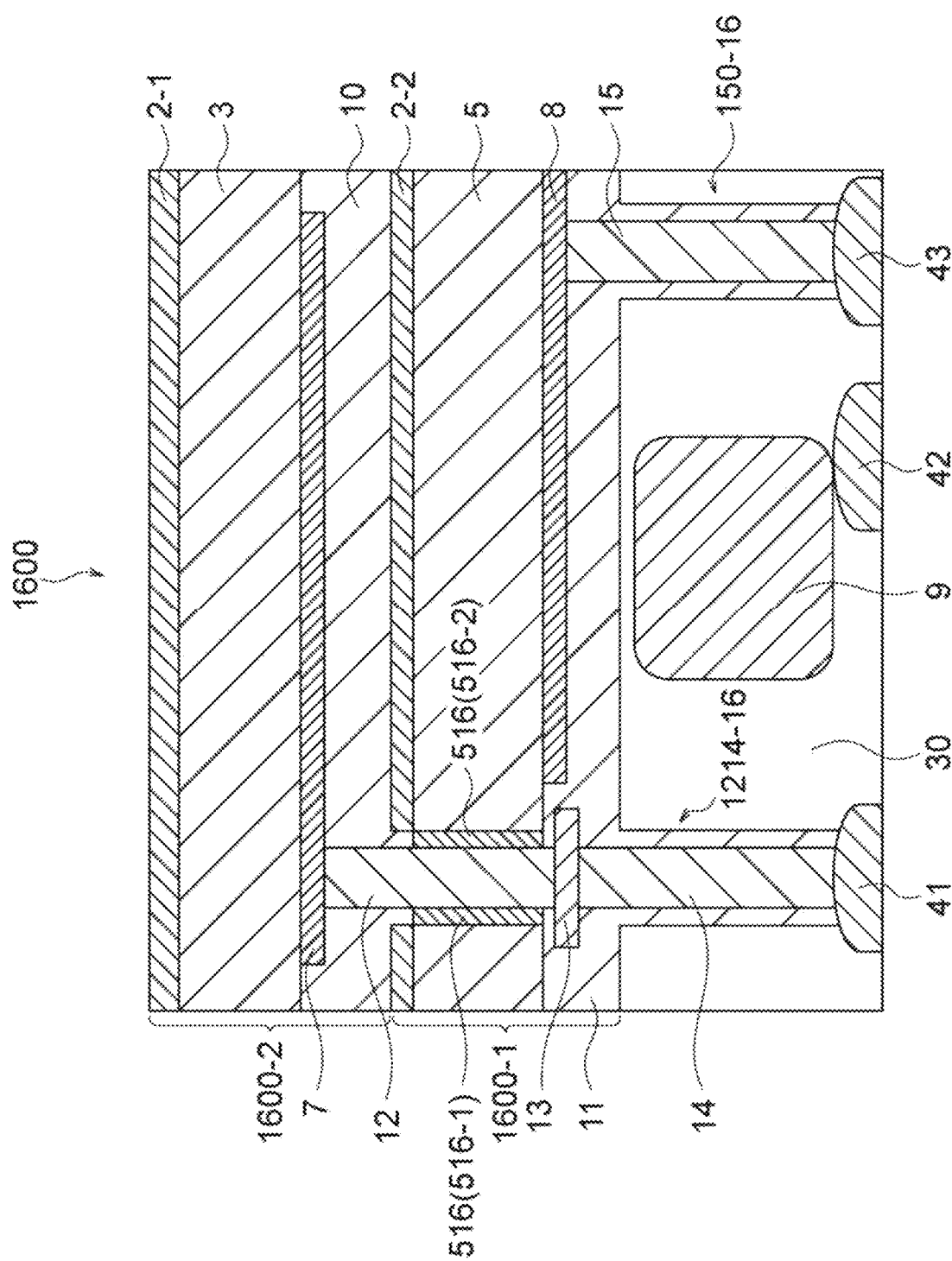
FIG. 16 is a diagram depicting a configuration example of a solid-state imaging device according to a sixth embodiment to which the present technology is applied.

Description with reference to FIG. 16 will first be presented. FIG. 16 is a cross-sectional diagram depicting a configuration example of a solid-state imaging device (solid-state imaging device 1600) according to the sixth embodiment of the present technology.

The solid-state imaging device 1600 includes the semiconductor substrate 30, a first photoelectric conversion unit 1600-1 that is provided above the semiconductor substrate 30 (on the light entrance side and the upper side in FIG. 16) and that converts light into charge, and a second photoelectric conversion unit 1600-2 that is provided above the first photoelectric conversion unit 1600-1 (on the light entrance side and the upper side in FIG. 16) and that converts light into charge.

The first photoelectric conversion unit 1600-1 includes the first electrode 8 (corresponding to a reading electrode, and a lower electrode in FIG. 16), the second electrode 2-2 (corresponding to an upper electrode in FIG. 16), and the photoelectric conversion film 5 provided between the first electrode (reading electrode) 8 and the second electrode 2-2.

The second photoelectric conversion unit 1600-2 includes the first electrode 7 (corresponding to a reading electrode, and a lower electrode in FIG. 16), the second electrode 2-1 (corresponding to an upper electrode in FIG. 16), and the photoelectric conversion film 3 provided between the first electrode (reading electrode) 7 and the second electrode 2-1.

The first electrode 7 of the second photoelectric conversion unit 1600-2 and the charge accumulation unit 41 formed in the semiconductor substrate 30 are electrically connected to each other via the conductive portion 12 penetrating the first photoelectric conversion unit 1600-1. Specifically, the solid-state imaging device 1600 has a connection hole 1214-16 penetrating the insulation layer 10, the first photoelectric conversion unit 1600-1, and the semiconductor substrate 30, to electrically connect the first electrode 7 of the second photoelectric conversion unit 1600-2 and the charge accumulation unit 41 formed in the semiconductor substrate 30. The conductive portion (through electrode) 12 and the conductive portion (through electrode) 14 are formed in the connection hole 1214-16. The conductive portion (through electrode) 12 connected to the first electrode 7 and the conductive portion (through electrode) 14 connected to the charge accumulation unit 41 are connected to each other via the via 13 formed in the insulation layer 11. The photodiode (PD) 9 formed in the semiconductor substrate 30 is connected to the charge accumulation unit 42. Moreover, a connection hole 150-16 penetrating the insulation layer 11 and the semiconductor substrate 30 is formed to electrically connect the first electrode 8 of the first photoelectric conversion unit 1600-1 and the charge accumulation unit 43 formed in the semiconductor substrate 30. Specifically, the first electrode 8 is connected to the charge accumulation unit 43 via the conductive portion (through electrode) 15 formed in the connection hole 150-16.

An insulation film 516 having fixed charge of a type identical to a type of charge accumulated in the charge accumulation unit 41 is formed in the connection hole 1214-16, between the conductive portion 12 (through electrode) and the photoelectric conversion film 5 such that the insulation film 516 covers the outer circumference of the conductive portion 12 (through electrode). Specifically, with respect to the connection hole 1214-16 in FIG. 16 as a center reference in the left-right direction in this figure, the photoelectric conversion film 5, an insulation film 516-1 (516), and the conductive portion 12 are formed in this order on the left side, while the photoelectric conversion film 5, an insulation film 516-2 (516), and the conductive portion 12 are formed in this order on the right side. As viewed in the up-down direction in FIG. 16, the insulation film 516 extends from an upper portion of the photoelectric conversion film 5 (upper side in FIG. 16) to a lower portion of the photoelectric conversion film 5 (lower side in FIG. 16), i.e., extends throughout the side surface of the photoelectric conversion unit 5.

The solid-state imaging device 1600 in FIG. 16 accumulates charge not in the first electrode (signal reading electrode) and the photoelectric conversion film, but in a charge accumulation unit (FD) formed in the semiconductor substrate 30. The conductive portion (through electrode) that is included in the solid-state imaging device 1600 and is necessary for reading signals from the second photoelectric conversion unit (upper layer) also prevents modulation of the potential of the photoelectric conversion film of the first photoelectric conversion unit (lower layer) and characteristic deterioration thus caused. Accordingly, introduction of fixed charge into the insulation film covering the through electrode is effective. Note that pixel sharing is often difficult in the configuration where signal charge is accumulated in the charge accumulation unit (FD).

In a case where the signal charge to be read is an electron, the insulation film 516 is an insulation film having negative fixed charge. In a case where the signal charge to be read is a hole, the insulation film 516 is an insulation film having positive fixed charge. In the presence of the insulation film 516 in the solid-state imaging device 1600, signal charge photoelectrically converted by the photoelectric conversion film 5 is not captured by the conductive portion 12 (through electrode).

In a case where the insulation film 516 is an insulation film having negative fixed charge, the insulation film 516 may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 516 may contain an insulation material such as a silicon oxide film in addition to the above material, or may additionally include an insulation material such as a silicon oxide film as a film (layer) other than the film (layer) including any of the above material.

In a case where the insulation film 516 is an insulation film having positive fixed charge, the insulation film 516 may contain at least one type of material selected from a group including silicon oxynitride and silicon nitride (SiN), for example. Moreover, the insulation film 516 may contain an insulation material such as a silicon oxide film in addition to the above material, or may additionally include an insulation material such as a silicon oxide film as a film (layer) other than the film (layer) including any of the above material.

Figure 17:
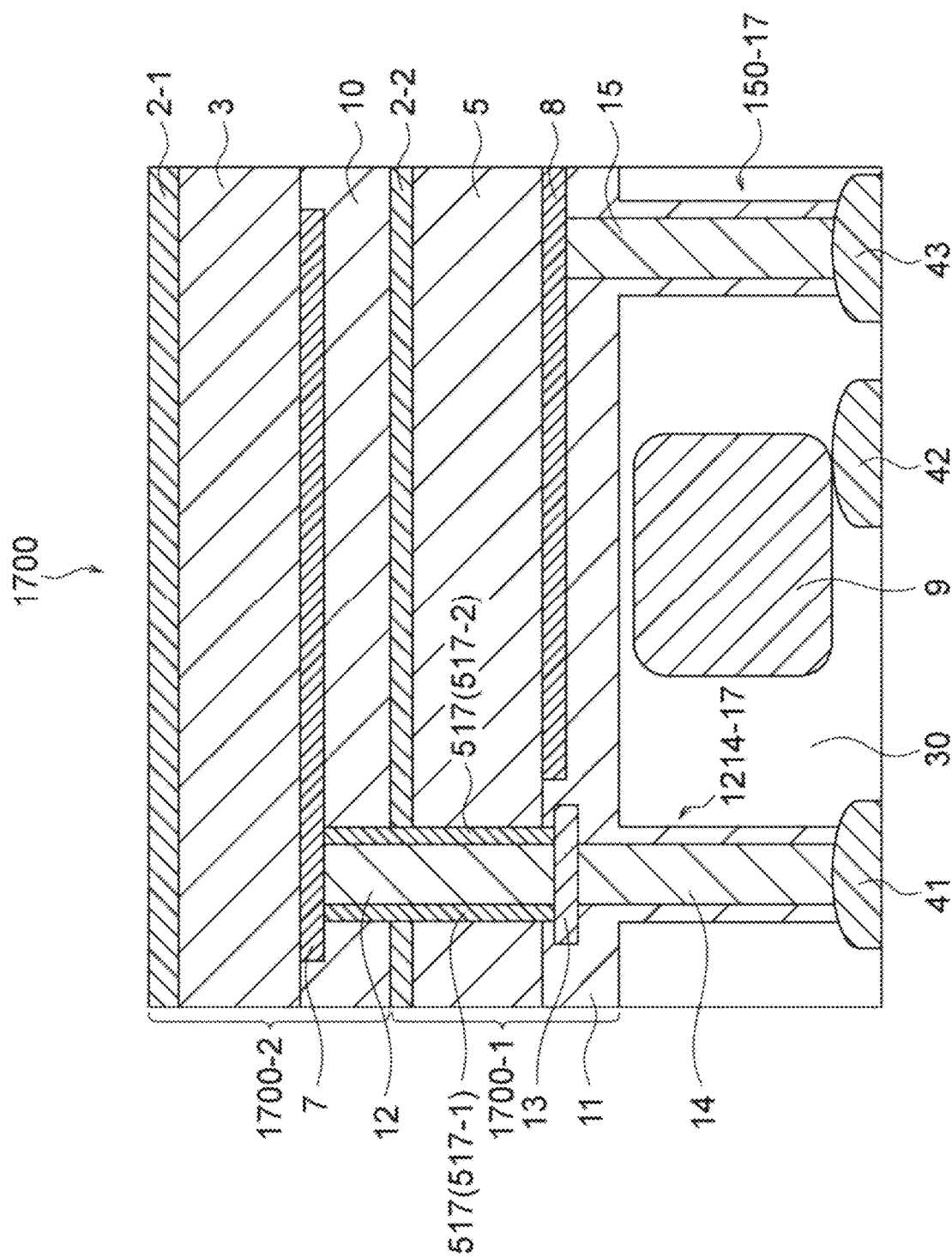
FIG. 17 is a diagram depicting a configuration example of a solid-state imaging device according to the sixth embodiment to which the present technology is applied.

Description with reference to FIG. 17 will next be presented. FIG. 17 is a cross-sectional diagram depicting a configuration example of a solid-state imaging device (solid-state imaging device 1700) according to the sixth embodiment of the present technology.

The solid-state imaging device 1700 includes the semiconductor substrate 30, a first photoelectric conversion unit 1700-1 that is provided above the semiconductor substrate 30 (on the light entrance side and the upper side in FIG. 17) and that converts light into charge, and a second photoelectric conversion unit 1700-2 that is provided above the first photoelectric conversion unit 1700-1 (on the light entrance side and the upper side in FIG. 17) and that converts light into charge.

The first photoelectric conversion unit 1700-1 includes the first electrode 8 (corresponding to a reading electrode, and a lower electrode in FIG. 17), the second electrode 2-2 (corresponding to an upper electrode in FIG. 17), and the photoelectric conversion film 5 provided between the first electrode (reading electrode) 8 and the second electrode 2-2.

The second photoelectric conversion unit 1700-2 includes the first electrode 7 (corresponding to a reading electrode, and a lower electrode in FIG. 17), the second electrode 2-1 (corresponding to an upper electrode in FIG. 17), and the photoelectric conversion film 3 provided between the first electrode (reading electrode) 7 and the second electrode 2-1.

The first electrode 7 of the second photoelectric conversion unit 1700-2 and the charge accumulation unit 41 formed in the semiconductor substrate 30 are electrically connected to each other via the conductive portion 12 penetrating the first photoelectric conversion unit 1700-1. Specifically, the solid-state imaging device 1700 has a connection hole 1214-17 penetrating the insulation layer 10, the first photoelectric conversion unit 1700-1, and the semiconductor substrate 30, to electrically connect the first electrode 7 of the second photoelectric conversion unit 1700-2 and the charge accumulation unit 41 formed in the semiconductor substrate 30. The conductive portion (through electrode) 12 and the conductive portion (through electrode) 14 are formed in the connection hole 1214-17. The conductive portion (through electrode) 12 connected to the first electrode 7 and the conductive portion (through electrode) 14 connected to the charge accumulation unit 41 are connected to each other via the via 13 formed in the insulation layer 11. The photodiode (PD) 9 formed in the semiconductor substrate 30 is connected to the charge accumulation unit 42. Moreover, a connection hole 150-17 penetrating the insulation layer 11 and the semiconductor substrate 30 is formed to electrically connect the first electrode 8 of the first photoelectric conversion unit 1700-1 and the charge accumulation unit 43 formed in the semiconductor substrate 30. Specifically, the first electrode 8 is connected to the charge accumulation unit 43 via the conductive portion (through electrode) 15 formed in the connection hole 150-17.

An insulation film 517 having fixed charge of a type identical to a type of charge accumulated in the charge accumulation unit 41 is formed in the connection hole 1214-17, between the conductive portion 12 (through electrode) and the insulation layer 10, the second electrode 2-2 below the insulation layer 10, the photoelectric conversion film 5 below the second electrode 2-2, and the insulation layer 11 below the photoelectric conversion film 5 such that the insulation film 517 covers the outer circumference of the conductive portion 12 (through electrode). Specifically, with respect to the connection hole 1214-17 in FIG. 17 as a center reference in the left-right direction in this figure, the insulation layer 10, the second electrode 2-2 below the insulation layer 10, the photoelectric conversion film 5 below the second electrode 2-2, the insulation layer 11 below the photoelectric conversion film 5, an insulation film 517-1 (517), and the conductive portion 12 are formed in this order on the left side, while the insulation layer 10, the second electrode 2-2 below the insulation layer 10, the photoelectric conversion film 5 below the second electrode 2-2, the insulation layer 11 below the photoelectric conversion film 5, an insulation film 517-2 (517), and the conductive portion 12 are formed in this order on the right side. As viewed in the up-down direction in FIG. 17, the insulation film 517 extends from the first electrode 7 formed in the insulation layer 10 to the via 13 formed in the insulation layer 11.

In a case where the signal charge to be read is an electron, the insulation film 517 is an insulation film having negative fixed charge. In a case where the signal charge to be read is a hole, the insulation film 517 is an insulation film having positive fixed charge. In the presence of the insulation film 517 in the solid-state imaging device 200, signal charge photoelectrically converted by the photoelectric conversion film 5 is not captured by the conductive portion 12 (through electrode).

In a case where the insulation film 517 is an insulation film having negative fixed charge, the insulation film 517 may contain at least one type of material selected from a group including hafnium oxide, aluminum oxide, zirconium oxide, tantalum oxide, titanium oxide, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, aluminum nitride film, hafnium oxynitride film, and aluminum oxynitride film. Moreover, the insulation film 517 may contain an insulation material such as a silicon oxide film in addition to the above material, or may additionally include an insulation material such as a silicon oxide film as a film (layer) other than the film (layer) including any of the above material.

In a case where the insulation film 517 is an insulation film having positive fixed charge, the insulation film 517 may contain at least one type of material selected from a group including silicon oxynitride and silicon nitride (SiN), for example. Moreover, the insulation film 517 may contain an insulation material such as a silicon oxide film in addition to the above material, or may additionally include an insulation material such as a silicon oxide film as a film (layer) other than the film (layer) including any of the above material.

Figure 19A:
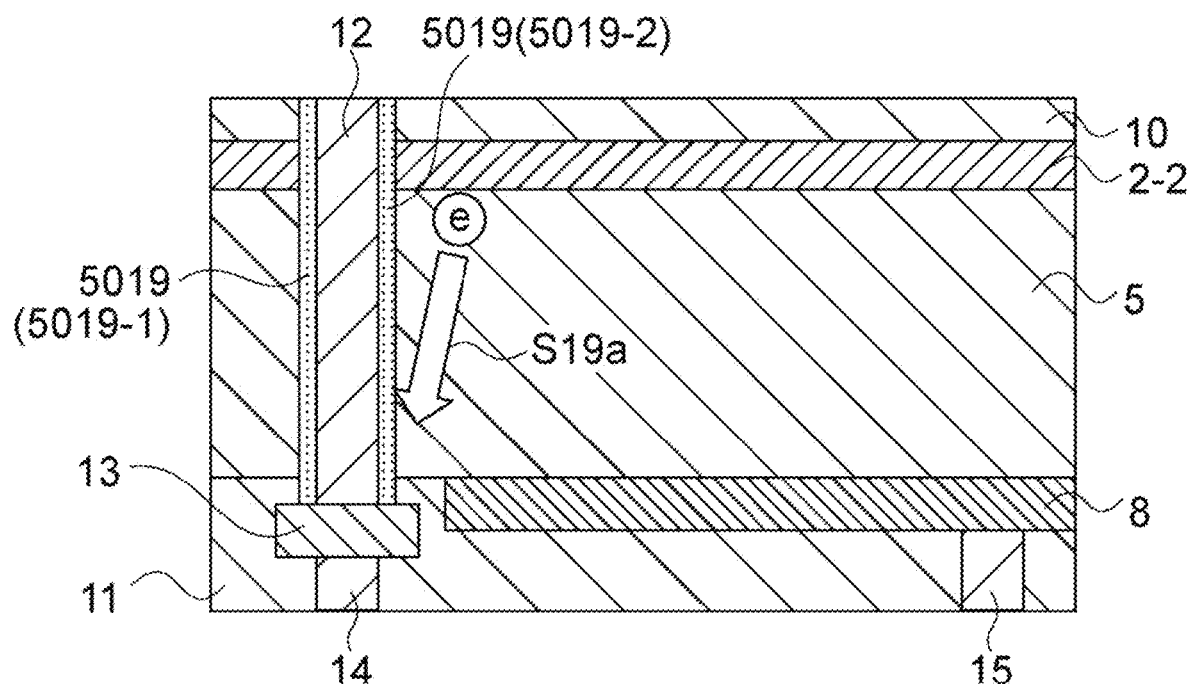
FIGS. 19A and 19B depict diagrams illustrating one example of a result of comparison between an insulation film having fixed charge and an insulation film not having fixed charge.
Figure 19B:
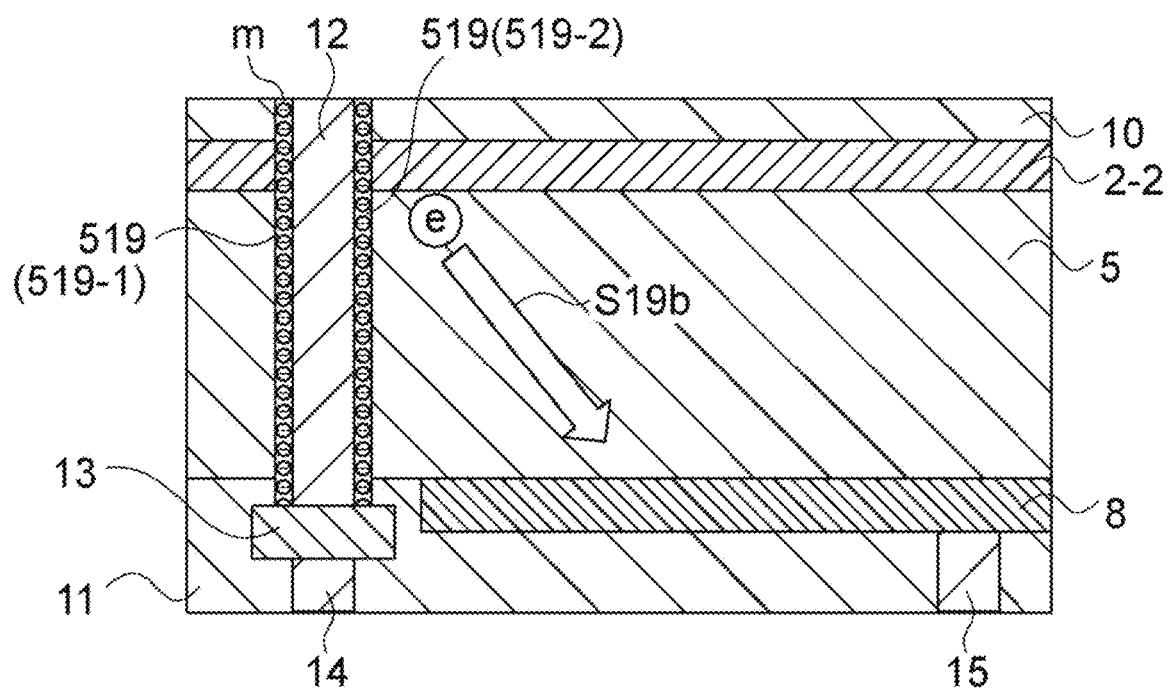

Description with reference to FIGS. 19A and 19B will finally be presented. FIGS. 19A and 19B depict diagrams illustrating one example of a result of comparison between an insulation film having fixed charge and an insulation film not having fixed charge. More specifically, FIG. 19A depicts an insulation film 5019 that does not have fixed charge and that is so formed as to cover the outer circumference of the conductive portion 12 (a left part of FIG. 19A depicts an insulation film 5019-1, while a right part of FIG. 18B depicts an insulation film 5019-2). FIG. 19B depicts an insulation film 519 that is so formed as to cover the outer circumference of the conductive portion 12 and that has fixed charge (negative fixed charge m in FIG. 19B) (a left part of FIG. 19B depicts an insulation film 519-1, while a right part of FIG. 19B depicts an insulation film 519-2).

As depicted in FIG. 19A, signal charge (electron in the case of FIG. 19A) generated by photoelectric conversion using the photoelectric conversion film 5 is captured by the conductive portion 12 (through electrode) as indicated by an arrow S19a. In this case, an opening rate of the photoelectric conversion film 5 decreases, and afterimages and random noise become worse.

As depicted in FIG. 19B, signal charge (electron in the case of FIG. 19B) generated by photoelectric conversion using the photoelectric conversion film 5 is not captured by the conductive portion 12 (through electrode) as indicated by an arrow S19b. In this case, the opening rate of the photoelectric conversion film 5 does not decrease, and afterimages and random noise do not become worse. Accordingly, dark current improves. Moreover, the shielding electrode described with reference to FIGS. 5A and 5B are not needed. Accordingly, for example, the quantity of electrons of the photodiode (PD) is allowed to increase in association with elimination of the necessity of the shielding electrode.

The above-described details associated with the solid-state imaging device of the sixth embodiment according to the present technology (example 6 of the solid-state imaging device) are applicable to the solid-state imaging devices of the first to fifth embodiments according to the present technology described above as long as no technical inconsistency is produced.

8. Seventh Embodiment (Example of Electronic Apparatus)

An electronic apparatus according to a seventh embodiment of the present technology is an electronic apparatus on which the solid-state imaging device of any one of the first to sixth embodiments of the present technology is mounted.

Figure 21:
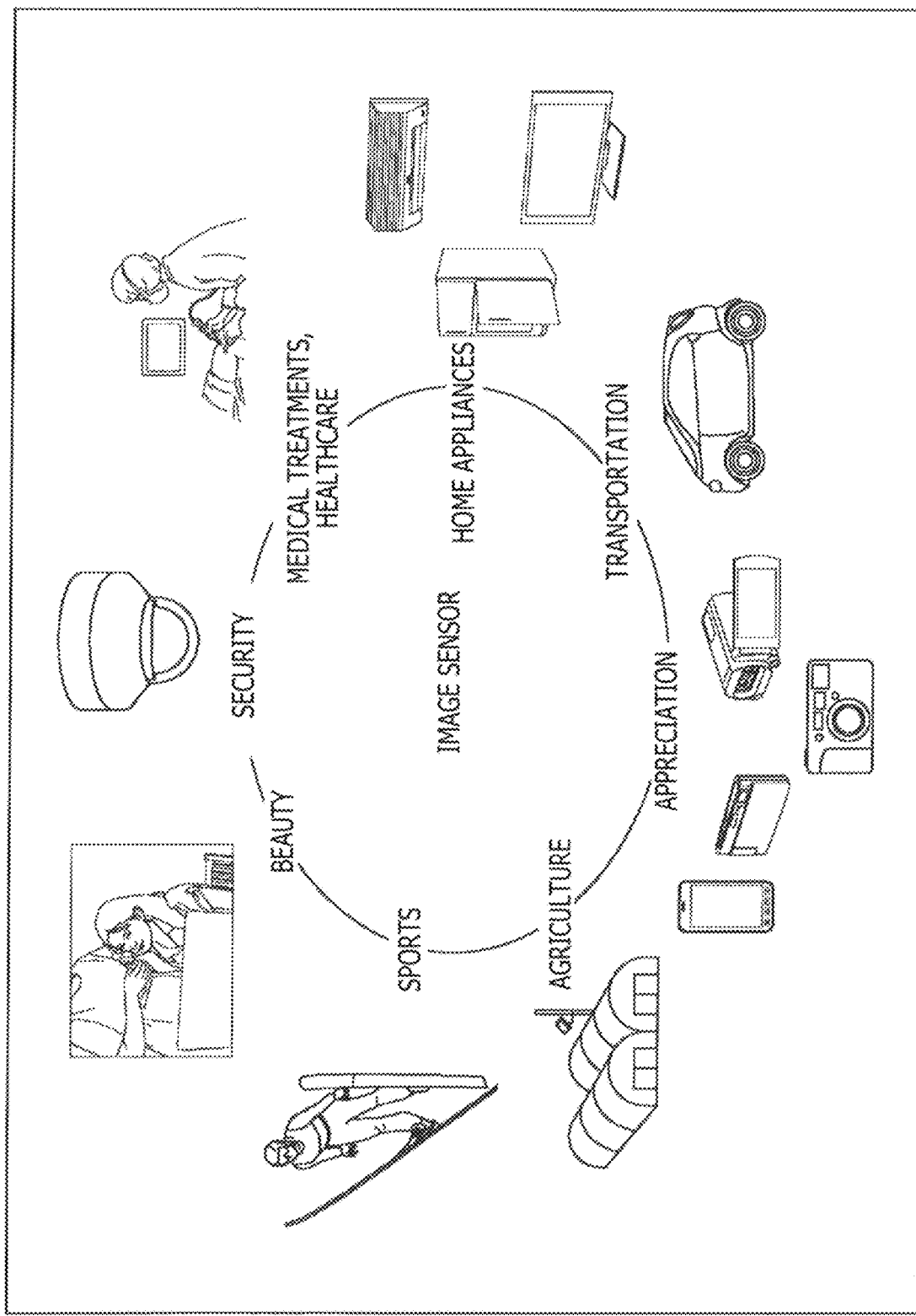
FIG. 21 is a diagram depicting a use example of the solid-state imaging devices according to the first to sixth embodiments to which the present technology is applied.

9. Use Example of Solid-State Imaging Device to which Present Technology is Applied FIG. 21 is a diagram depicting use examples of the solid-state imaging devices according to the first to sixth embodiments of the present technology in a form of an image sensor (solid-state imaging device).

For example, the solid-state imaging devices of the first to sixth embodiments described above are available for various cases, such as a case for sensing visible light, infrared light, ultraviolet light, X-rays, or other light as described below. Specifically, as depicted in FIG. 21, for example, the solid-state imaging device according to any one of the first to sixth embodiments is available as a device used in an appreciation field where images supplied for appreciation are captured, a field of transportation, a field of home appliances, a field of medical treatments and healthcare, a field of security, a field of beauty, a field of sports, a field of agriculture, or other fields (e.g., the electronic apparatus of the seventh embodiment described above).

Specifically, in the field of appreciation, the solid-state imaging device of any one of the first to sixth embodiments may be applied to a device for capturing images supplied for appreciation, such as a digital camera, a smartphone, and a cellular phone having a camera function, for example.

In the field of transportation, the solid-state imaging device of any one of the first to sixth embodiments may be applied to a device provided for transportation, such as an in-vehicle sensor which images a front, a rear, surroundings, a vehicle interior, or the like of a car, a monitoring camera which monitors traveling vehicles and roads, and a distance measuring sensor which measures a distance between vehicles, for achieving safe driving such as an automatic stop, recognition of a state of a driver, or other purposes, for example.

In the field of home appliances, the solid-state imaging device of any one of the first to sixth embodiments may be applied to a device provided for home appliances, such as a television receiver, a refrigerator, and an air conditioner, for imaging a gesture of a user and achieving an apparatus operation according to the gesture, for example.

In the field of medical treatments and healthcare, the solid-state imaging device of any one of the first to sixth embodiments may be applied to a device provided for medical treatments and healthcare, such as an endoscope, and a device for performing angiogram using received infrared light, for example.

In the field of security, the solid-state imaging device of any one of the first to sixth embodiments may be applied to a device provided for security, such as a monitoring camera for crime prevention and a camera for person recognition, for example.

In the field of beauty, the solid-state imaging device of any one of the first to sixth embodiments may be applied to a device provided for beauty, such as a skin measuring device for imaging skin and a microscope for imaging scalp, for example.

In the field of sports, the solid-state imaging device of any one of the first to sixth embodiments may be applied to a device provided for sports, such as an action camera and a wearable camera for sports or the like, for example.

In the field of agriculture, the solid-state imaging device of any one of the first to sixth embodiments may be applied to a device provided for agriculture, such as a camera for monitoring a state of a field or crops, for example.

Figure 22:
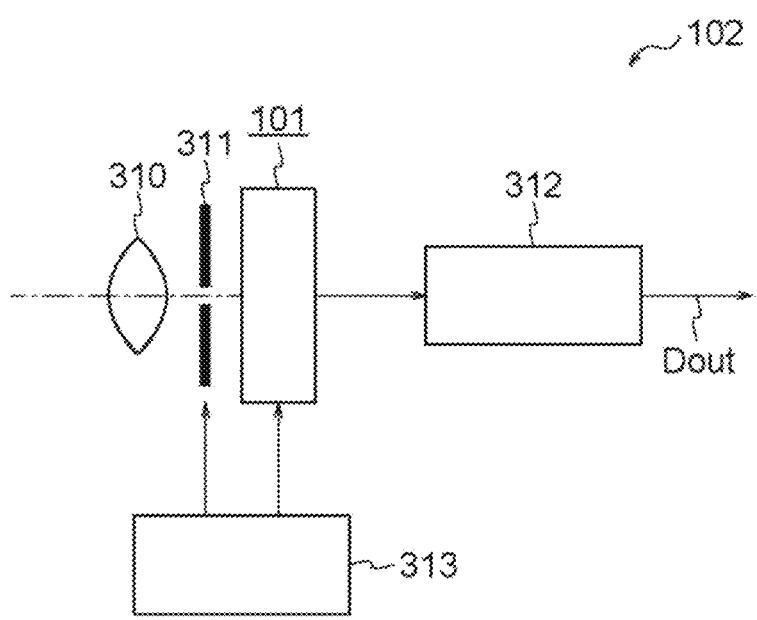
FIG. 22 is a functional block diagram depicting one example of an electronic apparatus according to a seventh embodiment to which the present technology is applied.

A use example of the solid-state imaging devices according to the first to sixth embodiments of the present technology will next be described specifically. For example, the solid-state imaging device according to any one of the first to sixth embodiments described above is used. Specifically, for example, a solid-state imaging device 101 including the solid-state imaging device is applicable to a camera system such as a digital still camera and a video camera, a cellular phone having an imaging function, or other various types of electronic apparatuses having an imaging function. FIG. 22 depicts a schematic configuration of an electronic apparatus 102 (camera) presented as an example of the electronic apparatus to which the solid-state imaging device 101 is applied. For example, the electronic apparatus 102 is a video camera capable of capturing a still image or a moving image, and includes the solid-state imaging device 101, an optical system (optical lens) 310, a shutter device 311, a drive unit 313 for driving the solid-state imaging device 101 and the shutter device 311, and a signal processing unit 312.

The optical system 310 guides image light (incident light) from an object toward a pixel unit 101a of the solid-state imaging device 101. The optical system 310 may include a plurality of optical lenses. The shutter device 311 controls a period of light irradiation and a period of light shielding to and from the solid-state imaging device 101. The drive unit 313 controls a transfer operation of the solid-state imaging device 101 and a shutter operation of the shutter device 311. The signal processing unit 312 performs various types of signal processing for a signal output from the solid-state imaging device 101. A picture signal Dout obtained by signal processing is stored in a storage medium such as a memory, or output to a monitor or the like.

10. Example of Application to Endoscopic Surgery System

The present technology is applicable to various types of products. For example, the technology according to the present disclosure (present technology) may be applied to an endoscopic surgery system.

Figure 23:
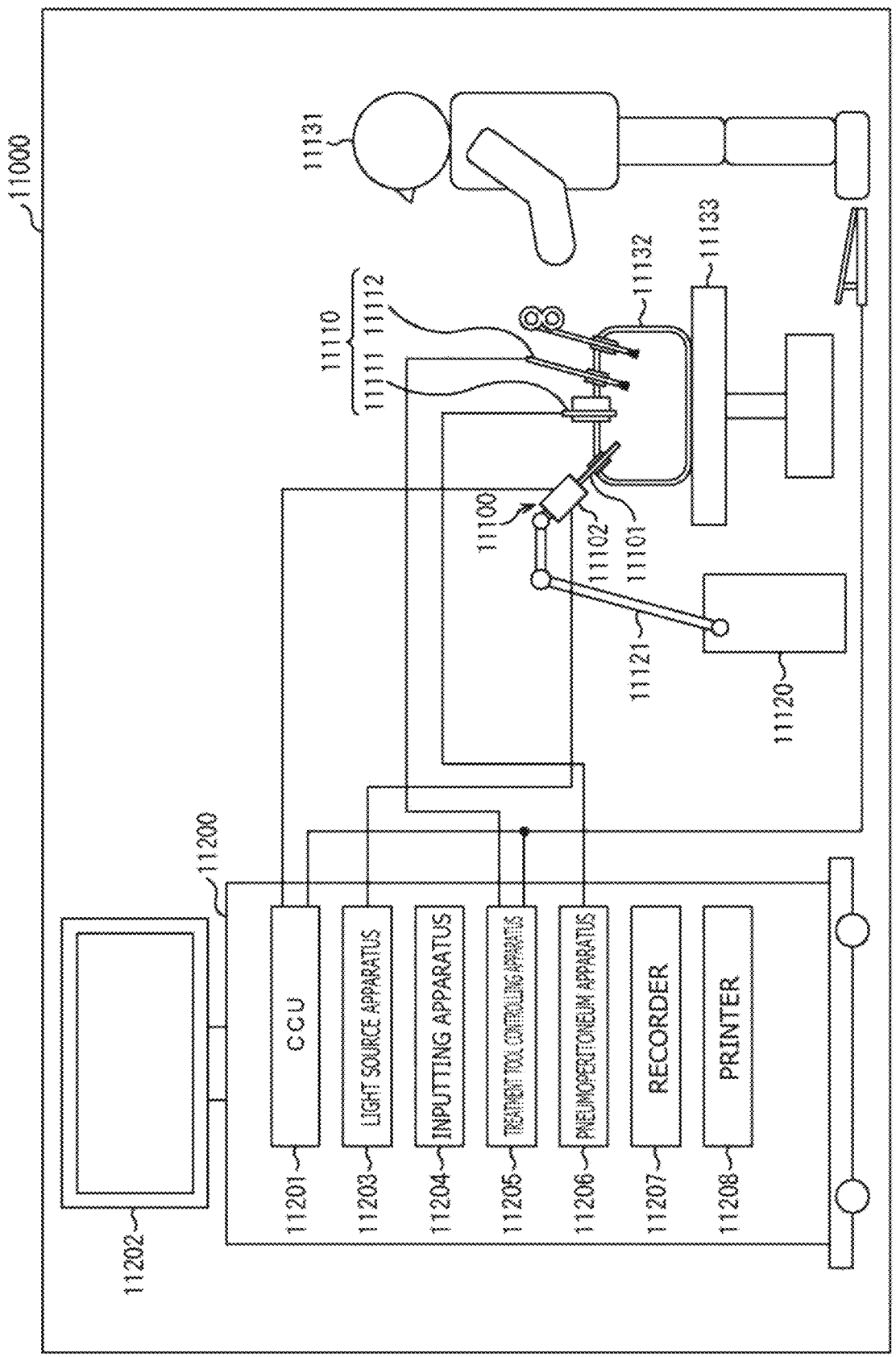
FIG. 23 is a view depicting an example of a schematic configuration of an endoscopic surgery system.

FIG. 23 is a view depicting an example of a schematic configuration of an endoscopic surgery system to which the technology according to an embodiment of the present disclosure (present technology) can be applied.

In FIG. 23, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 24:
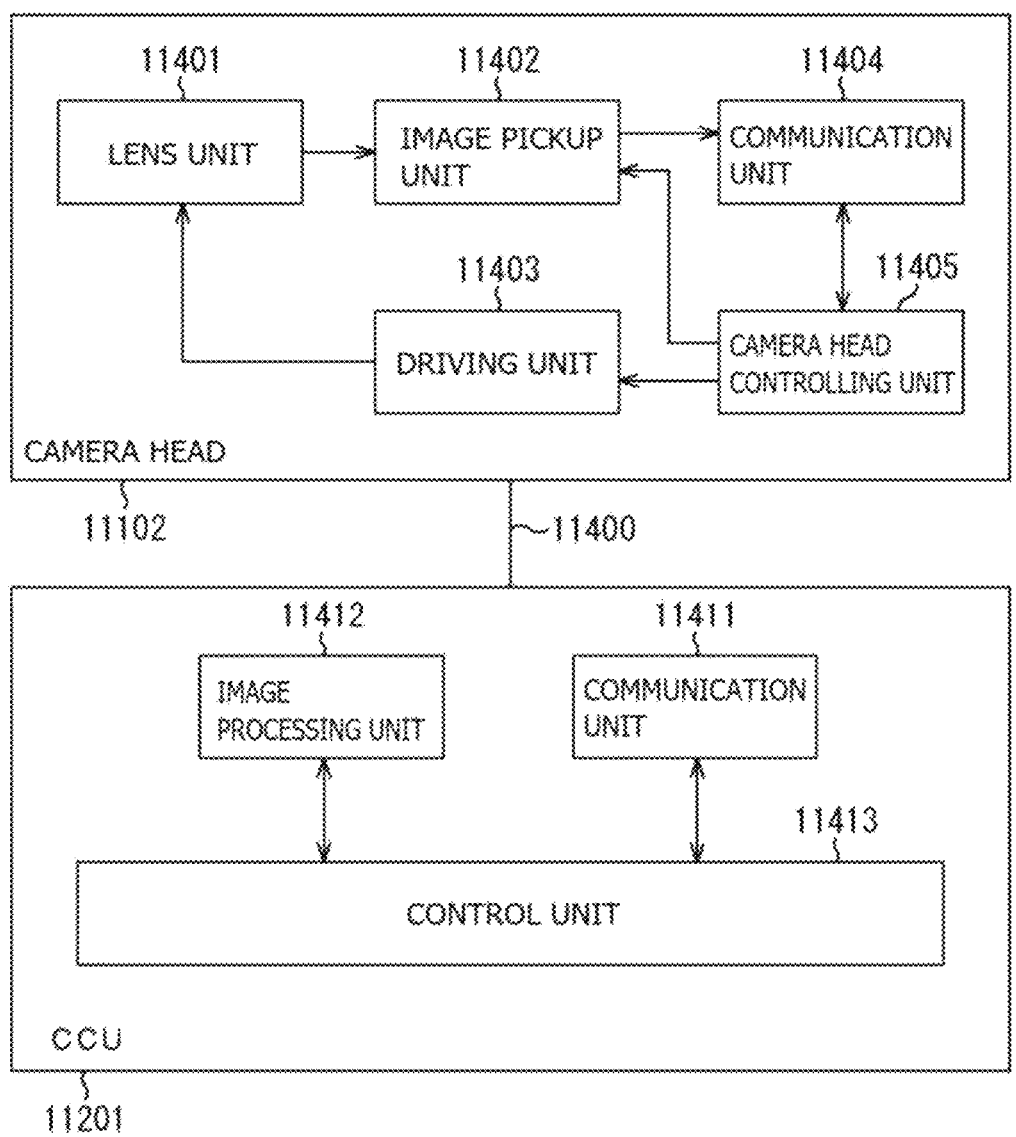
FIG. 24 is a block diagram depicting an example of a functional configuration of a camera head and a camera control unit (CCU).

FIG. 24 is a block diagram depicting an example of a functional configuration of the camera head 11102 and the CCU 11201 depicted in FIG. 23.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The example of the endoscopic surgery system to which the technology according to the present disclosure is applicable has been described above. The technology according to the present disclosure is applicable to the endoscope 11100, (the image pickup unit 11402 of) the camera head 11102, or the like included in the configuration described above. Specifically, the solid-state imaging device according to the present technology is applicable to the image pickup unit 10402. The technology according to the present disclosure applied to the endoscope 11100, (the image pickup unit 11402 of) the camera head 11102, or the like can improve performance of the endoscope 11100, (the image pickup unit 11402 of) the camera head 11102, or the like.

While the endoscopic surgery system has been described by way of example here, the technology according to the present disclosure may be applied to others, such as a microscopic surgery system, for example.

11. Example of Application to Mobile Body

The technology according to the present disclosure (present technology) is applicable to various types of products. For example, the technology according to the present disclosure may be implemented as a device mounted on a mobile body of any one of such types as a car, an electric car, a hybrid electric car, a motorcycle, a bicycle, a personal mobility, an airplane, a drone, a vessel, and a robot.

Figure 25:
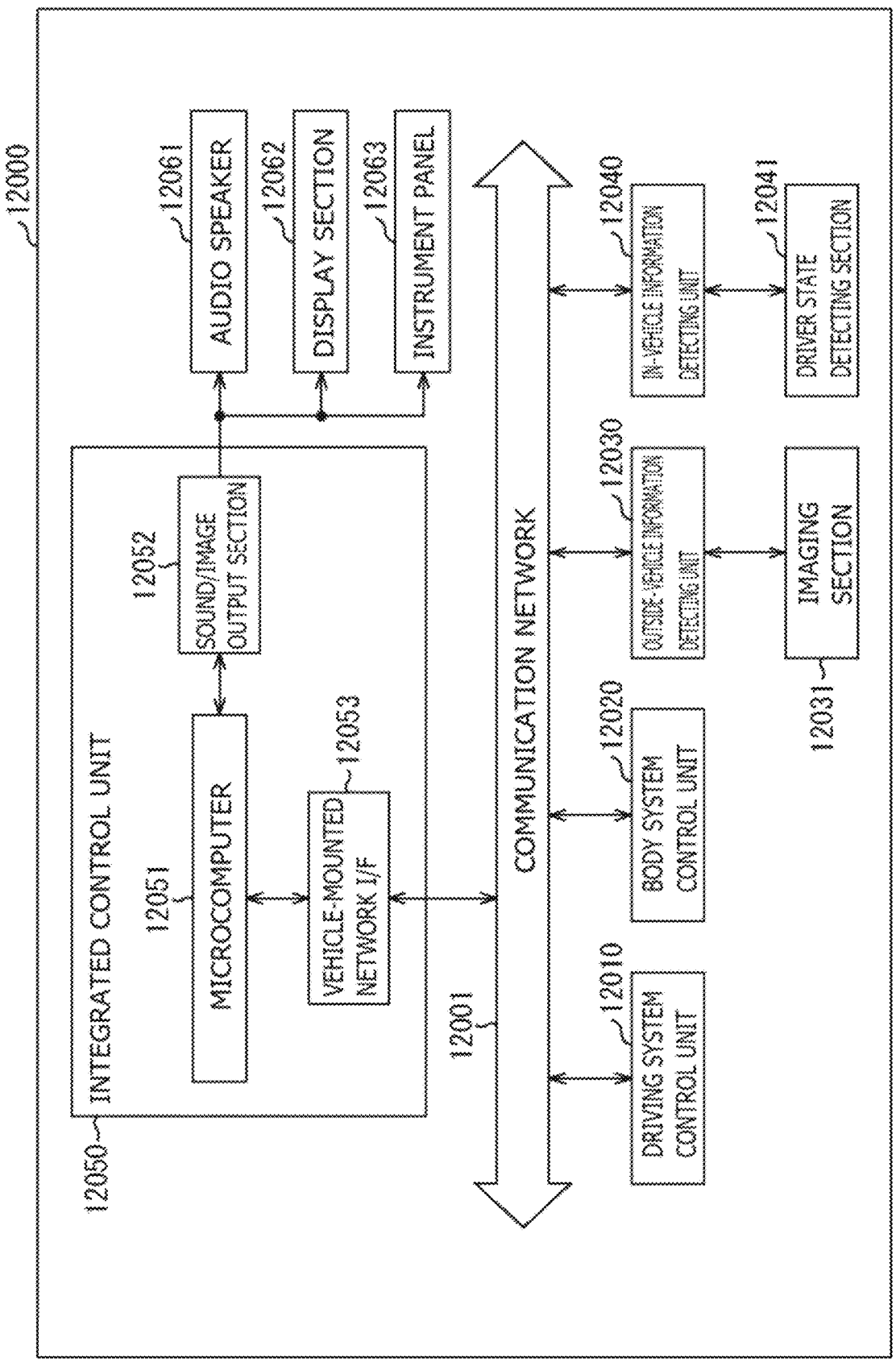
FIG. 25 is a block diagram depicting an example of schematic configuration of a vehicle control system.

FIG. 25 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 25, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 25, an audio speaker 12061, a display section 12062, and an instrument panel 12063 are illustrated as the output device. The display section 12062 may, for example, include at least one of an on-board display and a head-up display.

Figure 26:
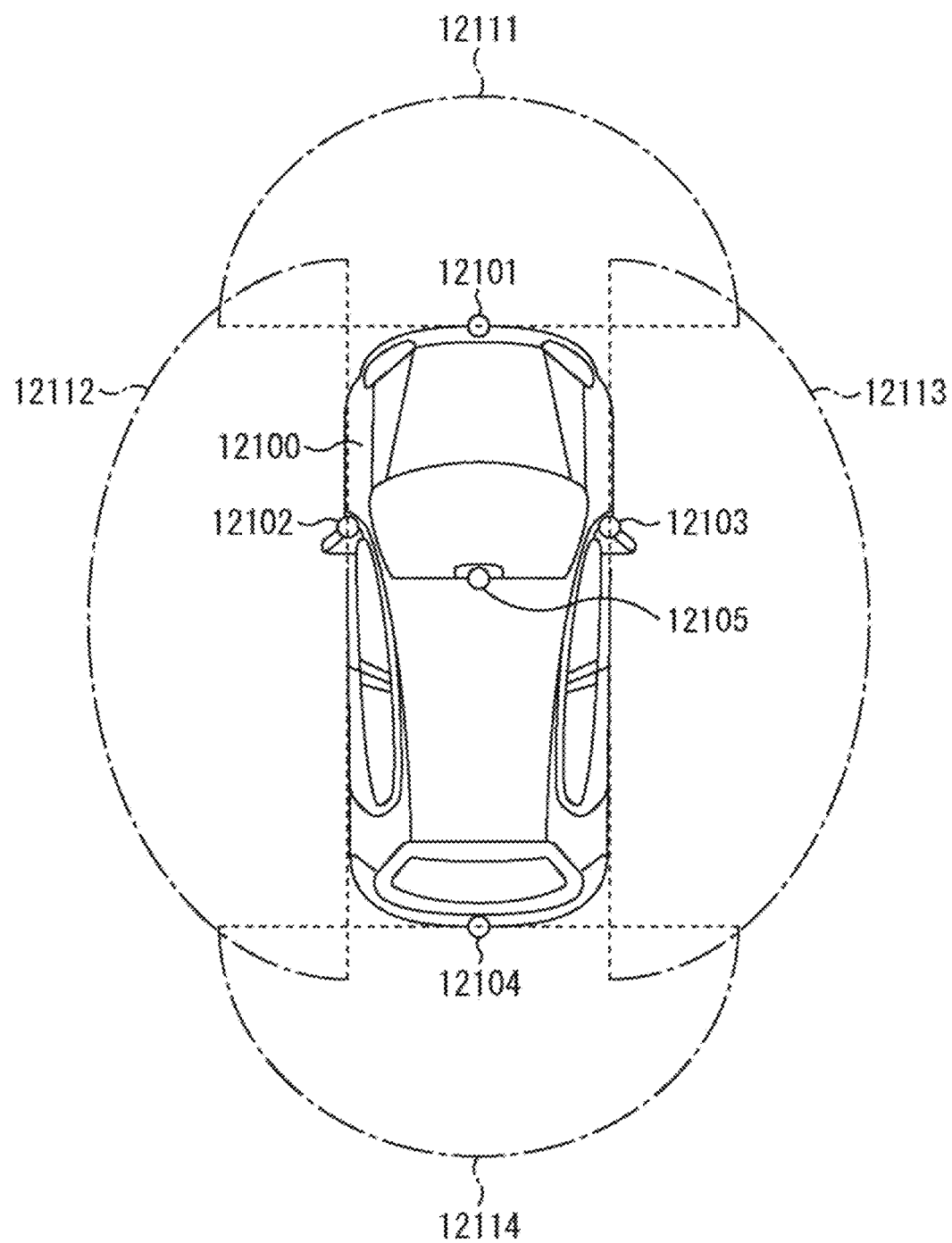
FIG. 26 is a diagram of assistance in explaining an example of installation positions of an outside-vehicle information detecting section and an imaging section.

FIG. 26 is a diagram depicting an example of the installation position of the imaging section 12031.

In FIG. 26, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 26 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure (present technology) is applicable has been described above. For example, the technology according to the present disclosure is applicable to the imaging section 12031 or the like included in the configuration described above. Specifically, the solid-state imaging device according to the present technology is applicable to the imaging section 12031. The technology according to the present disclosure applied to the imaging section 12031 can improve performance of the imaging section 12031.

Note that the present technology is not limited to the embodiments, the use examples, and the application examples described above, and may be modified in various manners without departing from the subject matters of the present technology.

Moreover, the advantageous effects described in the present description are presented only by way of example. Advantageous effects to be produced are not limited to these advantageous effects, and may include other advantageous effects.

In addition, the present technology may also have the following configurations.

[1]

A solid-state imaging device including:

a semiconductor substrate;

a first photoelectric conversion unit that is provided above the semiconductor substrate and that converts light into charge; and a second photoelectric conversion unit that is provided above the first photoelectric conversion unit and that converts light into charge, in which each of the first photoelectric conversion unit and the second photoelectric conversion unit includes at least a first electrode, a second electrode, and a photoelectric conversion film disposed between the first electrode and the second electrode, the first electrode of the second photoelectric conversion unit and a charge accumulation unit formed in the semiconductor substrate are electrically connected to each other via a conductive portion penetrating at least the first photoelectric conversion unit, an insulation film portion is disposed at least on a part of an outer circumference of the conductive portion, the insulation film portion includes at least one layer of an insulation film, and the at least one layer of the insulation film has fixed charge of a type identical to a type of charge accumulated in the charge accumulation unit.

[2]

The solid-state imaging device according to [1], in which the at least one layer of the insulation film is disposed between the conductive portion and the first photoelectric conversion unit such that the at least one layer of the insulation film covers the outer circumference of the conductive portion.

[3]

The solid-state imaging device according to [1], in which the conductive portion penetrates the first photoelectric conversion unit and reaches an inside of the semiconductor substrate, and the at least one layer of the insulation film is disposed between the conductive portion and the first photoelectric conversion unit and the semiconductor substrate such that the at least one layer of the insulation film covers the outer circumference of the conductive portion.

[4]
The solid-state imaging device according to any one of [1] to [3], in which each of the first photoelectric conversion unit and the second photoelectric conversion unit is disposed away from the first electrode, and includes a charge accumulation electrode so disposed as to face the photoelectric conversion film via an insulation layer.

[5]
The solid-state imaging device according to [4], in which
the second photoelectric conversion unit has a plurality of pixels,
each of the pixels has the one charge accumulation electrode, and
the charge accumulation unit is shared by the plurality of pixels.

[6]
The solid-state imaging device according to [4] or [5], in which
the first electrode of the first photoelectric conversion unit and the first electrode of the second photoelectric conversion unit are electrically connected to the charge accumulation unit formed in the semiconductor substrate, via the conductive portion that penetrates at least the first photoelectric conversion unit,
the insulation film portion is disposed at least on a part of the outer circumference of the conductive portion,
the insulation film portion includes the at least one layer of the insulation film,
the at least one layer of the insulation film has fixed charge of a type identical to the type of charge accumulated in the charge accumulation unit,
the first photoelectric conversion unit has a plurality of first pixels,
the second photoelectric conversion unit has a plurality of second pixels,
each of the first pixels has the one charge accumulation electrode,
each of the second pixels has the one charge accumulation electrode, and
the charge accumulation unit is shared by at least one of the first pixels and at least one of the second pixels.

[7]
The solid-state imaging device according to any one of [1] to [6], in which the insulation film portion includes an insulation film that has fixed charge of a type identical to the type of charge accumulated in the charge accumulation unit and an insulation film that has a high dielectric constant material.

[8]
The solid-state imaging device according to [7], in which
the insulation film that has the high dielectric constant material is so disposed as to cover the outer circumference of the conductive portion,
the insulation film that has the fixed charge is so disposed as to cover an outer circumference of the insulation film that has the high dielectric constant material,
the insulation film that has the high dielectric constant material is disposed between the conductive portion and the insulation film that has the fixed charge, and
the insulation film that has the fixed charge is disposed between the insulation film that has the high dielectric constant material and the first photoelectric conversion unit.

[9]
The solid-state imaging device according to [7], in which
the insulation film that has the fixed charge is so disposed as to cover the outer circumference of the conductive portion,
the insulation film that has the high dielectric constant is so disposed as to cover the outer circumference of the insulation film that has the fixed charge,
the insulation film that has the fixed charge is disposed between the conductive portion and the insulation film that has the high dielectric constant, and
the insulation film that has the high dielectric constant is disposed between the insulation film that has the fixed charge and the first photoelectric conversion unit.

[10]
The solid-state imaging device according to any one of [1] to [9], in which each of the first photoelectric conversion unit and the second photoelectric conversion unit further includes a transfer layer disposed between the first electrode and the photoelectric conversion film.

[11]
The solid-state imaging device according to [10], in which the at least one layer of the insulation film is disposed between the conductive portion and the first photoelectric conversion unit and the transfer layer included in the first photoelectric conversion unit, such that the at least one layer of the insulation film covers the outer circumference of the conductive portion.

[12]
The solid-state imaging device according to [10], in which
the conductive portion penetrates the first photoelectric conversion unit and reaches an inside of the semiconductor substrate, and
the at least one layer of the insulation film is disposed between the conductive portion and the first photoelectric conversion unit, the transfer layer included in the first photoelectric conversion unit, and the semiconductor substrate such that the at least one layer of the insulation film covers the outer circumference of the conductive portion.

[13]
A solid-state imaging device including:
a semiconductor substrate;
a first photoelectric conversion unit that is provided above the semiconductor substrate and that converts light into charge;
a second photoelectric conversion unit that is provided above the first photoelectric conversion unit and that converts light into charge; and
a third photoelectric conversion unit that is provided above the second photoelectric conversion unit and that converts light into charge, in which
each of the first photoelectric conversion unit, the second photoelectric conversion unit, and the third photoelectric conversion unit includes at least a first electrode, a second electrode, and a photoelectric conversion film disposed between the first electrode and the second electrode,
the first electrode of the second photoelectric conversion unit and a first charge accumulation unit formed in the semiconductor substrate are electrically connected to each other via a first conductive portion penetrating at least the first photoelectric conversion unit,
a first insulation film portion is disposed at least on a part of an outer circumference of the first conductive portion, the first insulation film portion includes at least one layer of a first insulation film, the at least one layer of the first insulation film has fixed charge of a type identical to a type of charge accumulated in the first charge accumulation unit, the first electrode of the third photoelectric conversion unit and a second charge accumulation unit formed in the semiconductor substrate are electrically connected to each other via a second conductive portion penetrating at least the second photoelectric conversion unit and the first photoelectric conversion unit, a second insulation film portion is disposed at least on a part of an outer circumference of the second conductive portion, the second insulation film portion includes at least one layer of a second insulation film, and the at least one layer of the second insulation film has fixed charge of a type identical to a type of charge accumulated in the second charge accumulation unit.

[14]

The solid-state imaging device according to [13], in which the at least one layer of the first insulation film is disposed between the first conductive portion and the first photoelectric conversion unit such that the at least one layer of the first insulation film covers the outer circumference of the first conductive portion, and the at least one layer of the second insulation film is disposed between the second conductive portion and the second photoelectric conversion unit and between the second conductive portion and the first photoelectric conversion unit such that the at least one layer of the second insulation film covers the outer circumference of the second conductive portion.

[15]

The solid-state imaging device according to [13] or [14], in which each of the first photoelectric conversion unit, the second photoelectric conversion unit, and the third photoelectric conversion unit is disposed away from the first electrode, and includes a charge accumulation electrode so disposed as to face the photoelectric conversion film via an insulation layer.

[16]

The solid-state imaging device according to any one of [13] to [15], in which each of the first photoelectric conversion unit, the second photoelectric conversion unit, and the third photoelectric conversion unit further includes a transfer layer disposed between the first electrode and the photoelectric conversion film.

[17]

The solid-state imaging device according to [16], in which the at least one layer of the first insulation film is disposed between the first conductive portion and the first photoelectric conversion unit and the transfer layer included in the first photoelectric conversion unit, such that the at least one layer of the first insulation film covers the outer circumference of the first conductive portion, and the at least one layer of the second insulation film is disposed between the second conductive portion and the second photoelectric conversion unit, the transfer layer included in the second photoelectric conversion unit, the first photoelectric conversion unit, and the transfer layer included in the first photoelectric conversion unit, such that the at least one layer of the second insulation film covers the outer circumference of the second conductive portion.

[18]

A solid-state imaging device including:

a semiconductor substrate; and a photoelectric conversion unit that is provided above the semiconductor substrate and that converts light into charge, in which the photoelectric conversion unit includes at least a first electrode, a second electrode, a transfer layer, a photoelectric conversion film disposed between the second electrode and the transfer layer, and a charge accumulation electrode disposed away from the first electrode and so disposed as to face the transfer layer via an insulation layer, the first electrode penetrates at least the photoelectric conversion film and the second electrode, the first electrode is electrically connected to a charge accumulation unit formed in the semiconductor substrate, an insulation film portion is disposed at least on a part of an outer circumference of the first electrode, the insulation film portion includes at least one layer of an insulation film, and the at least one layer of the insulation film has fixed charge of a type identical to a type of charge accumulated in the charge accumulation unit.

[19]

The solid-state imaging device according to [18], in which the at least one layer of the insulation film is disposed between the first electrode, and the photoelectric conversion film and the second electrode such that the at least one layer of the insulation film covers the outer circumference of the first electrode.

[20]

A solid-state imaging device including:

a semiconductor substrate; and

N (N: two or larger integer) photoelectric conversion units that are provided above the semiconductor substrate and that convert light into charge, in which the N photoelectric conversion units have a laminated structure, each of the N photoelectric conversion units includes at least a first electrode, a second electrode, and a photoelectric conversion unit disposed between the first electrode and the second electrode, the first electrode of an nth (n: two or larger but N or smaller) photoelectric conversion unit counted from the semiconductor substrate side is electrically connected to an (n−1)th charge accumulation unit formed in the semiconductor substrate, via an (n−1)th conductive portion that penetrates at least first to (n−1)th photoelectric conversion units counted from the semiconductor substrate (n: two or larger but N or smaller; a first photoelectric conversion unit counted from the semiconductor substrate when n=2), an (n−1)th insulation film portion is disposed at least on a part of an outer circumference of the (n−1)th conductive portion, the (n−1)th insulation film portion includes at least one layer of an (n−1)th insulation film, and the at least one layer of the (n−1)th insulation film has fixed charge of a type identical to a type of charge accumulated on the (n−1)th charge accumulation unit.

[21]

The solid-state imaging device according to [20], in which the at least one layer of the (n−1)th insulation film is disposed between the (n−1)th conductive portion and the first to (n−1)th photoelectric conversion units counted from the semiconductor substrate (the first photoelectric conversion unit counted from the semiconductor substrate when n=2) such that the at least one layer of the (n−1)th insulation film covers the outer circumference of the (n−1)th conductive portion.

[22]

The solid-state imaging device according to [20], in which the (n−1)th conductive portion penetrates the first to (n−1)th photoelectric conversion units counted from the semiconductor substrate (the first photoelectric conversion unit counted from the semiconductor substrate when n=2) and the semiconductor substrate, and the at least one layer of the (n−1)th insulation film is disposed between the (n−1)th conductive portion and the first to (n−1)th photoelectric conversion units counted from the semiconductor substrate (the first photoelectric conversion unit counted from the semiconductor substrate when n=2) and the semiconductor substrate such that the at least one layer of the (n−1)th insulation film covers the outer circumference of the (n−1)th conductive portion.

[23]

The solid-state imaging device according to any one of [20] to [22], in which each of the N photoelectric conversion units is disposed away from the first electrode included in the corresponding one of the N photoelectric conversion units, and includes corresponding one of N charge accumulation electrodes so disposed as to face the photoelectric conversion film included in the corresponding one of the N photoelectric conversion units, via an insulation layer.

[24]

The solid-state imaging device according to [23], in which the nth photoelectric conversion unit has a plurality of nth pixels, each of the nth pixels has the one nth charge accumulation electrode, and the nth charge accumulation unit is shared by the plurality of nth pixels.

[25]

The solid-state imaging device according to [24], in which the first electrode of each of nth photoelectric conversion unit and the first to (n−1)th photoelectric conversion units counted from the semiconductor substrate (the first photoelectric conversion unit counted from the semiconductor substrate when n=2) is electrically connected to the (n−1)th charge accumulation unit formed in the semiconductor substrate, via the (n−1)th conductive portion that penetrates at least the first to (n−1)th photoelectric conversion units counted from the semiconductor substrate (the first photoelectric conversion unit counted from the semiconductor substrate when n=2), the (n−1)th insulation film portion is disposed at least on a part of the outer circumference of the (n−1)th conductive portion, the (n−1)th insulation film portion includes the at least one layer of the (n−1)th insulation film, the at least one layer of the (n−1)th insulation film has fixed charge of a type identical to a type of charge accumulated in the (n−1)th charge accumulation unit, the nth photoelectric conversion unit has a plurality of nth pixels, the first to (n−1)th photoelectric conversion units counted from the semiconductor substrate (the first photoelectric conversion unit counted from the semiconductor substrate when n=2) have a plurality of first to (n−1)th pixels, respectively, each of the nth pixels has the one nth charge accumulation electrode, each of the first to (n−1)th pixels (the first pixel when n=2) has the one first to (n−1)th charge accumulation electrodes, respectively, and the (n−1)th charge accumulation unit is shared by at least one of the nth pixels and at least each one of the first to (n−1)th pixels.

[26]

The solid-state imaging device according to any one of [20] to [25], in which the (n−1)th insulation film portion includes an (n−1)th insulation film that has fixed charge of a type identical to a type of charge accumulated in the (n−1)th charge accumulation unit and an (n−1)th insulation film that has a high dielectric constant material.

[27]

The solid-state imaging device according to [26], in which the (n−1)th insulation film that has the high dielectric constant material is so disposed as to cover the outer circumference of the (n−1)th conductive portion, the (n−1)th insulation film that has the fixed charge is so disposed as to cover an outer circumference of the (n−1)th insulation film that has the high dielectric constant material, the (n−1)th insulation film that has the high dielectric constant material is disposed between the (n−1)th conductive portion and the (n−1)th insulation film that has the fixed charge, and the (n−1)th insulation film that has the fixed charge is disposed between the (n−1)th insulation film that has the high dielectric constant material and the (n−1)th photoelectric conversion unit.

[28]

The solid-state imaging device according to [26], in which the (n−1)th insulation film that has the fixed charge is so disposed as to cover the outer circumference of the (n−1)th conductive portion, the (n−1)th insulation film that has the high dielectric constant is so disposed as to cover the outer circumference of the (n−1)th insulation film that has the fixed charge, the (n−1)th insulation film that has the fixed charge is disposed between the (n−1)th conductive portion and the (n−1)th insulation film that has the high dielectric constant, and the (n−1)th insulation film that has the high dielectric constant is disposed between the (n−1)th insulation film that has the fixed charge and the photoelectric conversion unit.

[29]

The solid-state imaging device according to any one of [20] to [28], in which each of the N photoelectric conversion units further includes corresponding one of N transfer layers disposed between the first electrode and the photoelectric conversion film.

[30]

The solid-state imaging device according to [29], in which the at least one layer of the (n−1)th insulation film is disposed between the (n−1)th conductive portion and the first to (n−1)th photoelectric conversion units counted from the semiconductor substrate (the first photoelectric conversion unit counted from the semiconductor substrate when n=2) and the transfer layers included in the first to (n−1)th photoelectric conversion units counted from the semiconductor substrate (the first photoelectric conversion unit counted from the semiconductor substrate when n=2) such that the at least one layer of the (n−1)th insulation film covers the outer circumference of the (n−1)th conductive portion.

[31]

The solid-state imaging device according to [29], in which the nth conductive portion penetrates the first to (n−1)th photoelectric conversion units counted from the semiconductor substrate (the first photoelectric conversion unit counted from the semiconductor substrate when n=2) and the semiconductor substrate, and the at least one layer of the (n−1)th insulation film is disposed between the (n−1)th conductive portion and the first to (n−1)th photoelectric conversion units counted from the semiconductor substrate (the first photoelectric conversion unit counted from the semiconductor substrate when n=2), the transfer layers included in the first to (n−1)th photoelectric conversion units counted from the semiconductor substrate (the first photoelectric conversion unit counted from the semiconductor substrate when n=2), and the semiconductor substrate such that the at least one layer of the (n−1)th insulation film covers the outer circumference of the (n−1)th conductive portion.

[32]

A solid-state imaging device including:

a semiconductor substrate;

a first photoelectric conversion unit that is provided above the semiconductor substrate and that converts light into charge; and a second photoelectric conversion unit that is provided above the first photoelectric conversion unit and that converts light into charge, in which each of the first photoelectric conversion unit and the second photoelectric conversion unit includes at least a first electrode, a second electrode, and a photoelectric conversion film disposed between the first electrode and the second electrode, a connection hole penetrating the first photoelectric conversion unit and the semiconductor substrate is formed to electrically connect the first electrode of the second photoelectric conversion unit and a charge accumulation unit formed in the semiconductor substrate, a conductive portion and an insulation film portion are formed in the connection hole, the insulation film portion includes at least one layer of an insulation film, and the at least one layer of the insulation film has fixed charge of a type identical to a type of charge accumulated in the charge accumulation unit.

[33]

The solid-state imaging device according to [32], in which the at least one layer of the insulation film is disposed between the conductive portion and the first photoelectric conversion unit such that the at least one layer of the insulation film covers the outer circumference of the conductive portion.

[34]

The solid-state imaging device according to [32], in which the at least one layer of the insulation film is disposed between the conductive portion and the first photoelectric conversion unit and the semiconductor substrate such that the at least one layer of the insulation film covers the outer circumference of the conductive portion.

[35]

The solid-state imaging device according to any one of [32] to [34], in which each of the first photoelectric conversion unit and the second photoelectric conversion unit is disposed away from the first electrode, and includes a charge accumulation electrode so disposed as to face the photoelectric conversion film via an insulation layer.

[36]

The solid-state imaging device according to any one of [32] to [35], in which the second photoelectric conversion unit has a plurality of pixels, each of the pixels has the one charge accumulation electrode, and the charge accumulation unit is shared by the plurality of pixels.

[37]

The solid-state imaging device according to any one of [32] to [36], in which a connection hole penetrating the first photoelectric conversion unit and the semiconductor substrate is formed to electrically connect the first electrode of the first photoelectric conversion unit and the first electrode of the second photoelectric conversion unit with a charge accumulation unit formed in the semiconductor substrate, a conductive portion and an insulation film portion are formed in the connection hole, the insulation film portion includes the at least one layer of an insulation film, the at least one layer of the insulation film has fixed charge of a type identical to a type of charge accumulated in the charge accumulation unit, the first photoelectric conversion unit has a plurality of first pixels, the second photoelectric conversion unit has a plurality of second pixels, each of the first pixels has the one charge accumulation electrode, each of the second pixels has the one charge accumulation electrode, and the charge accumulation unit is shared by at least one of the first pixels and at least one of the second pixels.

[38]

The solid-state imaging device according to any one of [32] to [37], in which the insulation film portion includes an insulation film that has fixed charge of a type identical to a type of charge accumulated in the charge accumulation unit and an insulation film that has a high dielectric constant material.

[39]

The solid-state imaging device according to [38], in which the insulation film that has the high dielectric constant material is so disposed as to cover the outer circumference of the conductive portion, the insulation film that has the fixed charge is so disposed as to cover an outer circumference of the insulation film that has the high dielectric constant material, the insulation film that has the high dielectric constant material is disposed between the conductive portion and the insulation film that has the fixed charge, and the insulation film that has the fixed charge is disposed between the insulation film that has the high dielectric constant material and the first photoelectric conversion unit.

[40]

The solid-state imaging device according to [38], in which
the insulation film that has the fixed charge is so disposed as to cover the outer circumference of the conductive portion,
the insulation film that has the high dielectric constant is so disposed as to cover the outer circumference of the insulation film that has the fixed charge,
the insulation film that has the fixed charge is disposed between the conductive portion and the insulation film that has the high dielectric constant, and
the insulation film that has the high dielectric constant is disposed between the insulation film that has the fixed charge and the first photoelectric conversion unit.

[41]

The solid-state imaging device according to any one of [32] to [40], in which each of the first photoelectric conversion unit and the second photoelectric conversion unit further includes a transfer layer disposed between the first electrode and the photoelectric conversion film.

[42]

The solid-state imaging device according to [41], in which the at least one layer of the insulation film is disposed between the conductive portion and the first photoelectric conversion unit and the transfer layer included in the first photoelectric conversion unit, such that the at least one layer of the insulation film covers the outer circumference of the conductive portion.

[43]

The solid-state imaging device according to [41], in which the at least one layer of the insulation film is disposed between the conductive portion and the first photoelectric conversion unit, the transfer layer included in the first photoelectric conversion unit, and the semiconductor substrate such that the at least one layer of the insulation film covers the outer circumference of the conductive portion.

[44]

A solid-state imaging device including:
a semiconductor substrate;
a first photoelectric conversion unit that is provided above the semiconductor substrate and that converts light into charge; and
a second photoelectric conversion unit that is provided above the first photoelectric conversion unit and that converts light into charge, in which
each of the first photoelectric conversion unit and the second photoelectric conversion unit includes at least a first electrode, a second electrode, and a photoelectric conversion film disposed between the first electrode and the second electrode,
the first electrode of the second photoelectric conversion unit and a charge accumulation unit formed in the semiconductor substrate are electrically connected via a conductive portion penetrating at least the photoelectric conversion film of the first photoelectric conversion unit,
an insulation film portion is disposed at least on a part of an outer circumference of the conductive portion,
the insulation film portion includes at least one layer of an insulation film, and the at least one layer of the insulation film has fixed charge of a type identical to a type of charge accumulated in the charge accumulation unit.

[45]

An electronic apparatus on which the solid-state imaging device according to any one of [1] to [44] is mounted.

REFERENCE SIGNS LIST 1 (1-1, 1-2, 1-10): Charge accumulation electrode
2 (2-1, 2-2): Second electrode
3, 5, 35: Photoelectric conversion film
4, 4-1, 6, 46: Transfer layer
7, 8, 7000: First electrode (reading electrode)
9: Photodiode (PD)
10, 10-3, 11: Insulation layer
12, 14, 15: Conductive portion (through electrode)
13, 130, 131 (131-1, 131-2): Via
30: Semiconductor substrate
41, 42, 43, 44, 45: Charge accumulation unit (floating diffusion (FD))
51 (51-1, 51-2), 52 (52-1, 52-2), 53 (53-c, 53-d, 53-e, 53-f), 54 (54-c, 54-d, 54-e, 54-f), 55 (55-a, 55-b), 56 (56-1, 56-2), 57 (57-1, 57-2), 58 (58-1, 58-2), 59 (59-1, 59-2), 510 (510-1, 510-2), 511a (511a-1, 511a-2), 511b (511b-1, 511b-2), 513 (513-1, 513-2), 514 (514-1, 514-2), 515a (515a-1, 515a-2), 515b (515b-1, 515b-2), 516 (516-1, 516-2), 517 (517-1, 517-2), 518 (518-1, 518-2), 519 (519-1, 519-2): Insulation film having fixed charge
150 (150-1, 150-2, 150-6, 150-7, 150-8, 150-9, 150-10, 150-11, 150-15, 150-16, 150-17), 160 (160-13, 160-14), 1214 (1214-1, 1214-2, 1214-6, 1214-7, 1214-8, 1214-9, 1214-10, 1214-11, 1214-15-1, 1214-15-2, 1214-16, 1214-17: Connection hole
100, 200, 300, 4000, 500 (500a, 500b), 600, 700, 800, 900, 1000, 1100, 1200 (1200a, 1200b), 1300, 1400, 1500, 1600, 1700: Solid-state imaging device

The invention claimed is:

1. A solid-state imaging device, comprising:
a semiconductor substrate including a charge accumulation unit;
a first photoelectric conversion unit, on the semiconductor substrate, configured to convert first light into a first charge;
a second photoelectric conversion unit, on the first photoelectric conversion unit, configured to convert second light into a second charge, wherein
each of the first photoelectric conversion unit and the second photoelectric conversion unit includes at least:
a first electrode,
a second electrode, and
a photoelectric conversion film between the first electrode and the second electrode;
a conductive portion configured to penetrate the first photoelectric conversion unit, wherein
the first electrode of the second photoelectric conversion unit and the charge accumulation unit in the semiconductor substrate are electrically connected to each other via the conductive portion; and
an insulation film portion at least on a part of an outer circumference of the conductive portion, wherein
the insulation film portion is configured to cover the outer circumference of the conductive portion,
the insulation film portion includes a first insulation film, the first insulation film has fixed charge of a type identical to a type of charge accumulated in the charge accumulation unit, the first insulation film is between the conductive portion and the first photoelectric conversion unit, and the first insulation film is in direct contact with the first photoelectric conversion unit.

2. The solid-state imaging device according to claim 1, wherein the conductive portion is further configured to penetrate an inside of the semiconductor substrate, and the first insulation film is between the conductive portion and the semiconductor substrate.

3. The solid-state imaging device according to claim 1, wherein each of the first photoelectric conversion unit and the second photoelectric conversion unit is away from the first electrode, and each of the first photoelectric conversion unit and the second photoelectric conversion unit includes a charge accumulation electrode which is configured to face the photoelectric conversion film via an insulation layer.

4. The solid-state imaging device according to claim 3, wherein the second photoelectric conversion unit includes a plurality of pixels, each pixel of the plurality of pixels includes the charge accumulation electrode, and the charge accumulation unit is shared by the plurality of pixels.

5. The solid-state imaging device according to claim 3, wherein the first electrode of the first photoelectric conversion unit and the first electrode of the second photoelectric conversion unit are electrically connected to the charge accumulation unit, via the conductive portion, the first photoelectric conversion unit includes a plurality of first pixels, the second photoelectric conversion unit includes a plurality of second pixels, each first pixel of the plurality of first pixels includes the charge accumulation electrode, each second pixel of the plurality of second pixels the charge accumulation electrode, and the charge accumulation unit is shared by at least one first pixel of the plurality of first pixels and at least one second pixel of the plurality of second pixels.

6. The solid-state imaging device according to claim 1, wherein the insulation film portion includes:

the first insulation film that has the fixed charge of the type identical to the type of charge accumulated in the charge accumulation unit, and a second insulation film that has a high dielectric constant material.

7. The solid-state imaging device according to claim 6, wherein the second insulation film is configured to cover the outer circumference of the conductive portion, the first insulation film is configured to cover an outer circumference of the second insulation film, the second insulation film is between the conductive portion and the first insulation film, and the first insulation film is between the second insulation film and the first photoelectric conversion unit.

8. The solid-state imaging device according to claim 1, wherein each of the first photoelectric conversion unit and the second photoelectric conversion unit further includes a transfer layer which is between the first electrode and the photoelectric conversion film.

9. The solid-state imaging device according to claim 8, wherein the first insulation film is between the conductive portion and the transfer layer included in the first photoelectric conversion unit, such that the first insulation film covers the outer circumference of the conductive portion.

10. The solid-state imaging device according to claim 8, wherein the conductive portion is configured to penetrate an inside of the semiconductor substrate, and the first insulation film is between the conductive portion the transfer layer included in the first photoelectric conversion unit, such that the first insulation film covers the outer circumference of the conductive portion.

11. An electronic apparatus that includes the solid-state imaging device according to claim 1.

12. A solid-state imaging device, comprising:

a semiconductor substrate including a first charge accumulation unit and a second charge accumulation unit;

a first photoelectric conversion unit, on the semiconductor substrate, configured to convert first light into a first charge;

a second photoelectric conversion unit, on the first photoelectric conversion unit, configured to convert second light into a second charge;

a third photoelectric conversion unit that, on the second photoelectric conversion unit, configured to convert third light into a third charge, wherein each of the first photoelectric conversion unit, the second photoelectric conversion unit, and the third photoelectric conversion unit includes at least:
a first electrode,
a second electrode, and
a photoelectric conversion film disposed between the first electrode and the second electrode;

a first conductive portion configured to penetrate the first photoelectric conversion unit, a second conductive portion configured to penetrate the second photoelectric conversion unit and the first photoelectric conversion unit, wherein the first electrode of the second photoelectric conversion unit and the first charge accumulation unit in the semiconductor substrate are electrically connected to each other via the first conductive portion;

a first insulation film portion is at least on a part of an outer circumference of the first conductive portion, wherein the first insulation film portion is configured to cover the outer circumference of the first conductive portion, the first insulation film portion includes a first insulation film, the first insulation film has fixed charge of a type identical to a type of charge accumulated in the first charge accumulation unit, the first insulation film is between the first conductive portion and the first photoelectric conversion unit, the first insulation film is in direct contact with the first photoelectric conversion unit, and the first electrode of the third photoelectric conversion unit and the second charge accumulation unit in the semiconductor substrate are electrically connected to each other via the second conductive portion; and a second insulation film portion at least on a part of an outer circumference of the second conductive portion, wherein
the second insulation film portion includes at least one layer of a second insulation film, and
the second insulation film has fixed charge of a type identical to a type of charge accumulated in the second charge accumulation unit.

13. The solid-state imaging device according to claim 12, wherein
the second insulation film is between the second conductive portion and the second photoelectric conversion unit, and between the second conductive portion and the first photoelectric conversion unit, and
the second insulation film is configured to cover the outer circumference of the second conductive portion.

14. The solid-state imaging device according to claim 12, wherein
each of the first photoelectric conversion unit, the second photoelectric conversion unit, and the third photoelectric conversion unit is away from the first electrode, and
each of the first photoelectric conversion unit, the second photoelectric conversion unit, and the third photoelectric conversion unit includes a charge accumulation electrode which faces the photoelectric conversion film via an insulation layer.

15. The solid-state imaging device according to claim 12, wherein each of the first photoelectric conversion unit, the second photoelectric conversion unit, and the third photoelectric conversion unit further includes a transfer layer between the first electrode and the photoelectric conversion film.

16. The solid-state imaging device according to claim 15, wherein
the first insulation film is between the first conductive portion and the transfer layer included in the first photoelectric conversion unit, and
the second insulation film is between the second conductive portion and the transfer layer included in the second photoelectric conversion unit, and
the second insulation film is configured to cover the outer circumference of the second conductive portion.

17. A solid-state imaging device, comprising:
a semiconductor substrate including a charge accumulation unit;
a photoelectric conversion unit, on the semiconductor substrate, configured to convert light into charge, wherein
the photoelectric conversion unit includes at least:
a first electrode,
a second electrode,
a transfer layer,
a photoelectric conversion film between the second electrode and the transfer layer, and
a charge accumulation electrode away from the first electrode and is configured to face the transfer layer via an insulation layer, wherein
the first electrode is configured to penetrate at least the photoelectric conversion film and the second electrode, and
the first electrode is electrically connected to the charge accumulation unit in the semiconductor substrate; and
an insulation film portion is at least on a part of an outer circumference of the first electrode, wherein
the insulation film portion includes an insulation film, and
the insulation film has fixed charge of a type identical to a type of charge accumulated in the charge accumulation unit.

18. The solid-state imaging device according to claim 17, wherein the insulation film is between the first electrode and the second electrode such that the insulation film covers the outer circumference of the first electrode.

19. A solid-state imaging device, comprising:
a semiconductor substrate;
N photoelectric conversion units, on the semiconductor substrate, configured to convert light into charge, wherein
(N is two or larger integer),
the N photoelectric conversion units have a laminated structure, and
each of the N photoelectric conversion units includes at least:
a first electrode,
a second electrode, and
a photoelectric conversion unit between the first electrode and the second electrode;
an (n−1)th charge accumulation unit in the semiconductor substrate, wherein n is two or larger but N or smaller;
an (n−1)th conductive portion configured to penetrate at least first to (n−1)th photoelectric conversion units of the N photoelectric conversion units counted from the semiconductor substrate (n: two or larger but N or smaller; a first photoelectric conversion unit counted from the semiconductor substrate when n=2), wherein
the first electrode of an nth photoelectric conversion unit counted from the semiconductor substrate is electrically connected to the (n−1)th charge accumulation unit the semiconductor substrate, via the (n−1)th conductive portion; and
an (n−1)th insulation film portion at least on a part of an outer circumference of the (n−1)th conductive portion, wherein
the (n−1)th insulation film portion includes an (n−1)th insulation film,
the (n−1)th insulation film has fixed charge of a type identical to a type of charge accumulated in the (n−1)th charge accumulation unit,
the (n−1)th insulation film is between the (n−1)th conductive portion and the (n−1)th photoelectric conversion unit,
the (n−1)th insulation film is in direct contact with the (n−1)th photoelectric conversion unit, and
the (n−1)th insulation film is configured to cover the outer circumference of the (n−1)th conductive portion.

20. A solid-state imaging device, comprising:
a semiconductor substrate including a charge accumulation unit;
a first photoelectric conversion unit, on the semiconductor substrate, configured to convert first light into a first charge; and
a second photoelectric conversion unit, on the first photoelectric conversion unit, configured to convert second light into a second charge, wherein
each of the first photoelectric conversion unit and the second photoelectric conversion unit includes at least:
a first electrode,
a second electrode, and
a photoelectric conversion film between the first electrode and the second electrode, and a conductive portion configured to penetrate the first photoelectric conversion unit, wherein
each of the first photoelectric conversion unit and the second photoelectric conversion unit further includes a transfer layer,
the transfer layer is between the first electrode and the photoelectric conversion film,
the first electrode of the second photoelectric conversion unit and the charge accumulation unit in the semiconductor substrate are electrically connected to each other via the conductive portion; and
an insulation film portion is at least on a part of an outer circumference of the conductive portion, wherein
the insulation film portion includes an insulation film, and
the insulation film has fixed charge of a type which is identical to a type of charge accumulated in the charge accumulation unit.

* * * * *